United States Patent
Yang et al.

(10) Patent No.: US 12,504,684 B2
(45) Date of Patent: Dec. 23, 2025

(54) CORE-SHELL DYE, PHOTOSENSITIVE RESIN COMPOSITION INCLUDING THE SAME, AND COLOR FILTER

(71) Applicant: SAMSUNG SDI CO., LTD., Yongin-si (KR)

(72) Inventors: Yeji Yang, Suwon-si (KR); Sundae Kim, Suwon-si (KR); Euisoo Jeong, Suwon-si (KR); Ieju Kim, Suwon-si (KR); Baek Soung Park, Suwon-si (KR); Yeon Soo Lee, Suwon-si (KR); Young Lee, Suwon-si (KR); Myungho Cho, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 627 days.

(21) Appl. No.: 17/885,647

(22) Filed: Aug. 11, 2022

(65) Prior Publication Data

US 2023/0136349 A1    May 4, 2023

(30) Foreign Application Priority Data

Sep. 28, 2021   (KR) .................. 10-2021-0128113

(51) Int. Cl.
*G03F 7/00*    (2006.01)
*C09B 57/00*   (2006.01)
(Continued)

(52) U.S. Cl.
CPC .......... *G03F 7/0007* (2013.01); *C09B 57/007* (2013.01); *C09B 67/0013* (2013.01);
(Continued)

(58) Field of Classification Search
CPC .................. C09B 57/007; C07D 403/12
See application file for complete search history.

(56) References Cited

U.S. PATENT DOCUMENTS

| | | |
|---|---|---|
| 2012/0041165 A1 | 2/2012 | Greinert et al. |
| 2020/0142301 A1 | 5/2020 | Kwon et al. |

FOREIGN PATENT DOCUMENTS

| | | |
|---|---|---|
| CN | 107793327 A | 3/2018 |
| CN | 111880373 A | 11/2020 |

(Continued)

OTHER PUBLICATIONS

English translation of WO2018043829. (Year: 2018).*

(Continued)

*Primary Examiner* — Mark F. Huff
*Assistant Examiner* — Anna Malloy
(74) *Attorney, Agent, or Firm* — Lee IP Law, P.C.

(57) ABSTRACT

A core-shell dye, a photosensitive resin composition including the same, and a color filter manufactured using the photosensitive resin composition, the core-shell dye including a core represented by Chemical Formula 1; and a shell represented by Chemical Formula 2, the shell surrounding the core,

[Chemical Formula 1]

(Continued)

-continued

[Chemical Formula 2]

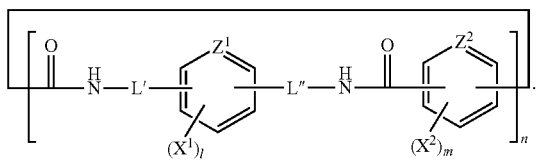

23 Claims, 1 Drawing Sheet

(51) Int. Cl.
 C09B 67/08 (2006.01)
 G02B 5/22 (2006.01)
 G03F 7/004 (2006.01)
 H10F 39/00 (2025.01)
(52) U.S. Cl.
 CPC ........... *G02B 5/223* (2013.01); *G03F 7/0045* (2013.01); *H10F 39/8053* (2025.01)

(56) References Cited

FOREIGN PATENT DOCUMENTS

| JP | 1990-276159 | A | 12/1991 |
| JP | 2009-015113 | A | 1/2009 |
| JP | 2017-110209 | A | 6/2017 |
| JP | 6226820 | B2 | 11/2017 |
| JP | 6281975 | B2 | 2/2018 |
| JP | 2018-172635 | A | 11/2018 |
| JP | 2019-099703 | A | 6/2019 |
| JP | 2020-076995 | A | 5/2020 |
| JP | 2020-200376 | A | 12/2020 |
| JP | 2022-056406 | A | 4/2022 |
| KR | 10-2014-0072682 | A | 6/2014 |
| KR | 10-1796796 | B1 | 11/2017 |
| KR | 10-2018-0024290 | A | 3/2018 |
| KR | 10-2019-0054408 | A | 5/2019 |
| KR | 10-2059022 | B1 | 12/2019 |
| KR | 10-2020-0052160 | A | 5/2020 |
| KR | 10-2020-0144379 | A | 12/2020 |
| TW | I652253 | B | 3/2019 |
| TW | 202018417 | A | 5/2020 |
| WO | WO-2016154782 | A1 * | 10/2016 ............ C07F 7/0854 |
| WO | WO-2018043829 | A1 * | 3/2018 ........... C07C 211/64 |

OTHER PUBLICATIONS

Taiwanese Office Action (including a search report) dated Oct. 18, 2023, of the corresponding Taiwanese Patent Application No. 111136802.
Liu et al., Eur. J. Org. Chem., pp. 4095-4102 (2018).
Chinese Office Action (including a search report) dated Sep. 12, 2023, of the corresponding Chinese Patent Application No. 202211191861.3.
Korean Notice of Allowance dated Aug. 11, 2025.

\* cited by examiner

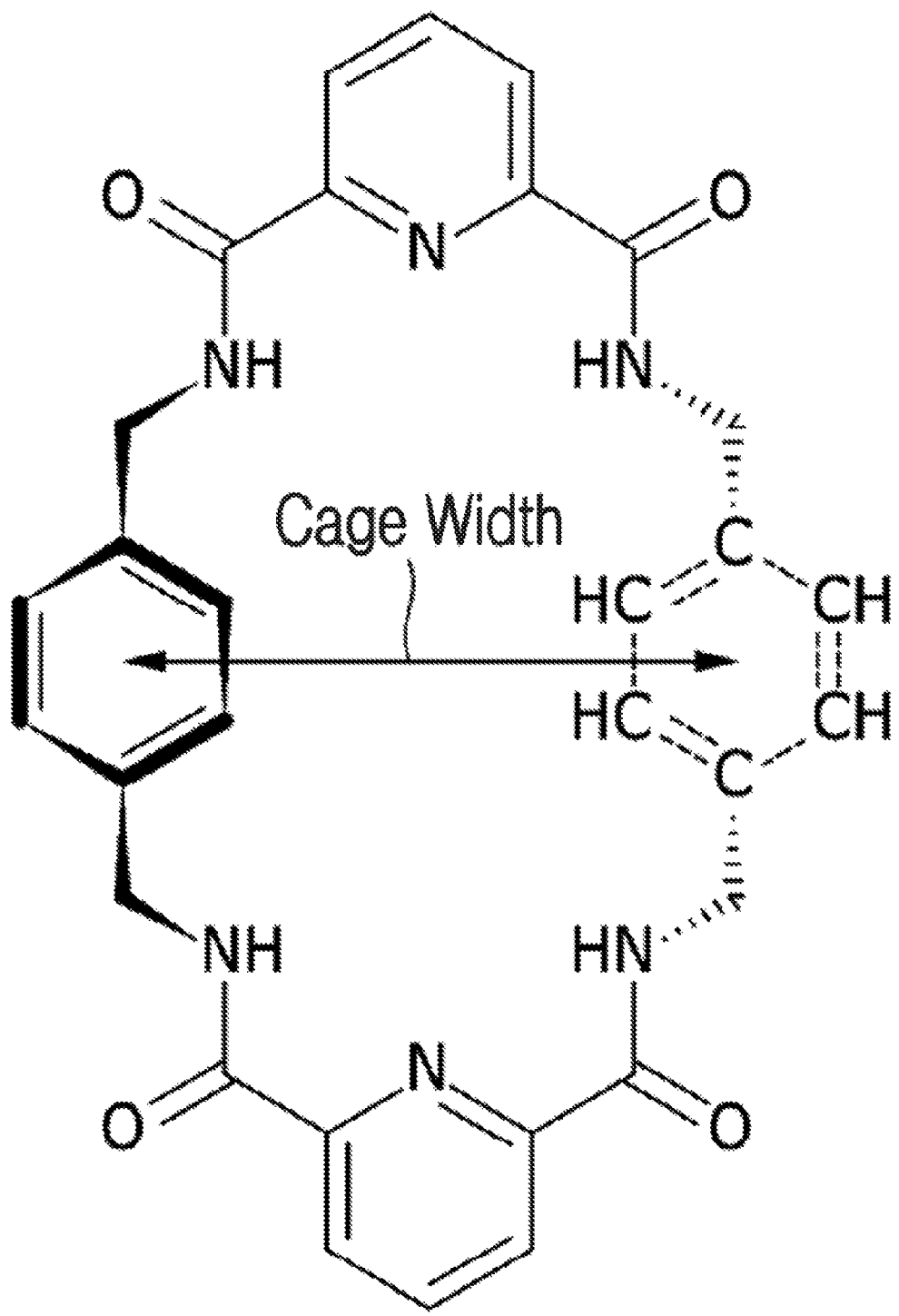

CORE-SHELL DYE, PHOTOSENSITIVE RESIN COMPOSITION INCLUDING THE SAME, AND COLOR FILTER

CROSS-REFERENCE TO RELATED APPLICATION

This application claims priority to and the benefit of Korean Patent Application No. 10-2021-0128113 filed in the Korean Intellectual Property Office on Sep. 28, 2021, the entire contents of which are incorporated herein by reference.

BACKGROUND

1. Field

Embodiments relate to a core-shell dye, a photosensitive resin composition including the same, and a color filter manufactured using the same.

2. Description of the Related Art

An image sensor is a semiconductor that converts photons into electrons and displays them on a display device or stores them in a storage device.

The image sensor may be classified into a charge coupled device (CCD) image sensor and a complementary metal-oxide semiconductor (CMOS) image sensor according to a manufacturing process and an application method.

The image sensor may include a color filter including filter segments of additive and mixed primary colors of red, green, and blue.

SUMMARY

The embodiments may be realized by providing a core-shell dye including a core represented by Chemical Formula 1; and a shell represented by Chemical Formula 2, the shell surrounding the core,

[Chemical Formula 1]

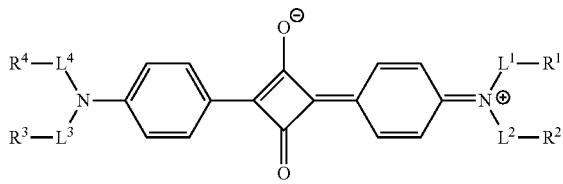

wherein in Chemical Formula 1, $L^1$ to $L^4$ are each independently a single bond, a substituted or unsubstituted C1 to C20 alkylene group, or a substituted or unsubstituted C6 to C30 arylene group; and $R^1$ to $R^4$ are each independently hydrogen, a substituted or unsubstituted C1 to C20 alkyl group, a substituted or unsubstituted C3 to C20 cycloalkyl group, or a substituted or unsubstituted C6 to C30 aryl group; provided that at least one of $R^1$ and $R^2$ includes a substituted or unsubstituted epoxy group at a terminal end and at least one of $R^3$ and $R^4$ includes a substituted or unsubstituted (meth)acrylate group at a terminal end;

[Chemical Formula 2]

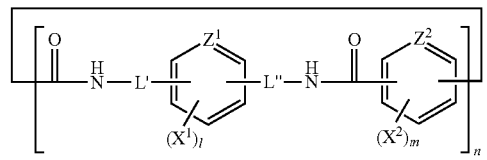

in Chemical Formula 2, L' and L" are each independently a single bond or a substituted or unsubstituted C1 to C10 alkylene group; $Z^1$ and $Z^2$ are each independently *—CR—* or a nitrogen atom, in which R is a hydrogen atom or a substituted or unsubstituted C1 to C10 alkyl group; $X^1$ and $X^2$ are each independently a halogen or a substituted or unsubstituted C1 to C20 alkyl group; l and m are each independently an integer of 0 to 4; and n is an integer of 2 or more and 10 or less.

The embodiments may be realized by providing a photosensitive resin composition including the core-shell dye according to an embodiment.

The embodiments may be realized by providing a photosensitive resin film manufactured using the photosensitive resin composition according to an embodiment.

The embodiments may be realized by providing a color filter comprising the photosensitive resin film according to an embodiment.

The embodiments may be realized by providing a CMOS image sensor comprising the color filter according to an embodiment.

BRIEF DESCRIPTION OF THE DRAWING

Features will be apparent to those of skill in the art by describing in detail exemplary embodiments with reference to the attached drawing in which:

The FIGURE is a view showing the cage width of the shell represented by Chemical Formula 2.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. As used herein, the term "or" is not an exclusive term, e.g., "A or B" would include A, B, or A and B.

As used herein, when specific definition is not otherwise provided, "substituted" refers to replacement of at least one hydrogen of a compound by a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, or a combination thereof.

As used herein, when specific definition is not otherwise provided, "heterocycloalkyl group", "heterocycloalkenyl group", "heterocycloalkynyl group," or "heterocycloalkylene group" refer to presence of at least one N, O, S, or P in a cyclic compound of cycloalkyl, cycloalkenyl, cycloalkynyl, or cycloalkylene.

As used herein, when specific definition is not otherwise provided, "(meth)acrylate" refers to both "acrylate" and "methacrylate".

As used herein, when specific definition is not otherwise provided, the term "combination" refers to mixing, bonding, or copolymerization.

In the chemical formula of the present specification, unless a specific definition is otherwise provided, hydrogen is boned at the position when a chemical bond is not drawn where supposed to be given.

As used herein, when specific definition is not otherwise provided, when a plurality of substituents having the same number exist, these substituents are the same or different. For example, when there are four "$X_1$"s in Chemical Formula 2 to be described later, all four "$X_1$"s may be the same as "F"; one "$X_1$" may be "F", two "$X_1$"s may be "Cl", and one "$X_1$" may be "Br".

In addition, as used herein, when specific definition is not otherwise provided, a dotted line " ¦ " or "*" means a portion linked to the same or different atoms or chemical formulas, e.g., a linking point.

(Core-Shell Dye)

A core-shell dye according to an embodiment may include or consist of, e.g., a core represented by Chemical Formula 1; and a shell represented by Chemical Formula 2 and surrounding the core.

[Chemical Formula 1]

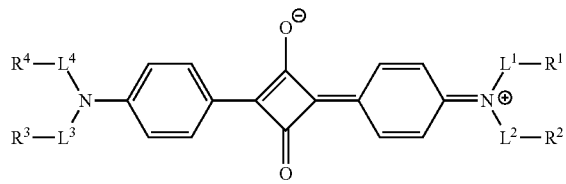

In Chemical Formula 1, $L^1$ to $L^4$ may each independently be or include, e.g., a single bond, a substituted or unsubstituted C1 to C20 alkylene group, or a substituted or unsubstituted C6 to C30 arylene group.

$R^1$ to $R^4$ may each independently be or include, e.g., hydrogen, a substituted or unsubstituted C1 to C20 alkyl group, a substituted or unsubstituted C3 to C20 cycloalkyl group, or a substituted or unsubstituted C6 to C30 aryl group.

In an implementation, at least one of $R^1$ and $R^2$ may include a substituted or unsubstituted epoxy group at a terminal end thereof. In an implementation, at least one of $R^3$ and $R^4$ includes a substituted or unsubstituted (meth)acrylate group at a terminal end thereof

[Chemical Formula 2]

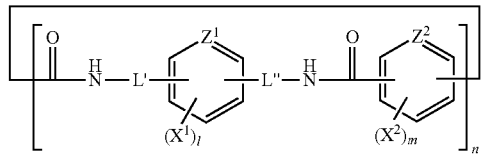

In Chemical Formula 2, L' and L" may each independently be or include, e.g., a single bond or a substituted or unsubstituted C1 to C10 alkylene group.

$Z^1$ and $Z^2$ may each independently be, e.g., *—CR—* or a nitrogen atom. R may be or may include, e.g., a hydrogen atom or a substituted or unsubstituted C1 to C10 alkyl group.

$X^1$ and $X^2$ may each independently be or include, e.g., a halogen or a substituted or unsubstituted C1 to C20 alkyl group.

l and m may each independently be, e.g., an integer of 0 to 4.

n may be, e.g., an integer of 2 or more and 10 or less.

The core represented by Chemical Formula 1 may be, e.g., a squarene dye or core including at least one epoxy group and at least one (meth)acrylate group. In an implementation, the shell represented by Chemical Formula 2 may be, e.g., a type of macrocyclic compound, and may form a coating layer while surrounding the core represented by Chemical Formula 1.

A color filter manufactured by the pigment dispersion method may have limitations in thinning and fine pattern formation as well as color mixing issues, and these may be due to the pigment particle size. The dye is advantageous over the pigment in that it does not form particles, but could be inferior to the pigment in chemical resistance, wavelength matching properties, patternability, or the like.

In this regard, an embodiment may provide a squarene dye including at least one epoxy group and at least one (meth)acrylate group. The epoxy group may help improve the chemical resistance of the squarene dye. In addition, the (meth)acrylate group may allow a maximum absorption peak of the squarene dye to appear at about 650 nm, and may help improve processability, e.g., patternability, when forming a fine pattern.

Accordingly, the dye of an embodiment may form a fine pattern, even if the amount applied to the resin composition is reduced, while exhibiting excellent properties such as chemical resistance, wavelength matching properties, and patternability.

In addition, the dye may be less durable than the pigment, which is one of the factors that adversely affect the formation of a fine pattern, e.g., the patternability after curing and heat processing of the resin composition.

In an implementation, the durability may be supplemented by protecting the reaction site of the squarene dye. In an implementation, the squarene dye may be used as a core, and a shell surrounding the core may be introduced. As will be described below, a halogen group may be introduced into the shell, and in this case, the maximum absorption peak of the core-shell dye may be shifted to a long wavelength region.

In an implementation, the core-shell dye including the core represented by Chemical Formula 1 and the shell represented by Chemical Formula 2 may have excellent properties such as chemical resistance, patternability, and durability, and may have excellent matching properties into a green wavelength band. In an implementation, a photosensitive resin composition including the core-shell dye may form a fine pattern, even if the dye content were to be reduced, and the deterioration of chemical resistance after curing and thermal processing may be suppressed, so that a green color filter for a CMOS image sensor may be economically provided.

Hereinafter, the core represented by Chemical Formula 1, the shell represented by Chemical Formula 2 and the core-shell dye including them are described.

In an implementation, the core represented by Chemical Formula 1, when an imaginary line connecting two oxygen atoms (O) is viewed as a central axis, may include one epoxy group at either terminal end of an axis perpendicular to the central axis and one (meth)acrylate group at the other terminal end. One terminal epoxy group included in the core may contribute to improving the chemical resistance of the core. In addition, one terminal (meth)acrylate group included in the core may contribute to improving green wavelength matching properties and patternability of the core.

In an implementation, at least one of $R^3$ and $R^4$ may include, e.g., a substituted or unsubstituted (meth)acrylate group at the terminal end. In an implementation, the hydrogen atom (H) positioned at the terminal end of at least one of $R^3$ and $R^4$ may be substituted or replaced with a substituted or unsubstituted (meth)acrylate group.

In an implementation, $R^3$ may be, e.g., a group represented by Chemical Formula 3.

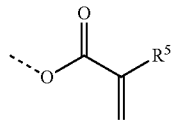

[Chemical Formula 3]

In Chemical Formula 3, $R^5$ may be, e.g., a hydrogen atom or a substituted or unsubstituted C1 to C10 alkyl group (e.g., an unsubstituted methyl group). According to $R^5$, the group represented by Chemical Formula 3 may be an acryl group or a methacryl group.

In an implementation, at least one of $R^1$ and $R^2$ may include, e.g., a substituted or unsubstituted epoxy group at the terminal end. In an implementation, the hydrogen atom (H) positioned at the terminal end of at least one of $R^1$ and $R^2$ may be substituted or replaced with a substituted or unsubstituted epoxy group.

In an implementation, $R^1$ may be, e.g., a group represented by Chemical Formula 4.

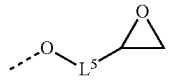

[Chemical Formula 4]

In Chemical Formula 4, $L^5$ may be, e.g., a single bond or a substituted or unsubstituted C1 to C10 alkylene group.

As the carbon number of $L^5$ increases, durability of the core may be enhanced. In an implementation, when heat or light is applied to the core, and $L^5$ is a single bond or includes only one carbon, an epoxy group adjacent thereto could be broken. In an implementation, when $L^5$ has about 2 to about 6 carbons, the epoxy group adjacent thereto may be protected.

A core in which $L^5$ includes about 7 or more carbons could have an excessively high molecular weight, and more of the dye may be needed in order to realize the same absorbance as a core in which $L^5$ has about 2 to about 6 carbons. In an implementation, the carbon number of $L^5$ may be about 6 or less, with a view toward processability.

In an implementation, any insufficiency in the durability of the core may be compensated by the shell. In an implementation, $L^5$ may be, e.g., a single bond or a substituted or unsubstituted C1 to C10 alkylene group.

A specific structure of the core represented by Chemical Formula 1 will be described as follows.

In an implementation, $L^1$ and $L^3$ may each independently be, e.g., a substituted or unsubstituted C6 to C30 arylene group.

In an implementation, when $R^1$ is a substituent represented by Chemical Formula 4, and $R^3$ is a substituent represented by Chemical Formula 3; they may be independently connected to Chemical Formula 1 through a substituted or unsubstituted C6 to C30 arylene group (i.e., $L^1$ and $L^3$).

In an implementation, both $R^2$ and $R^4$ may be a substituent or group other than those represented by Chemical Formula 3 or 4. In an implementation, $R^2$ and $R^4$ may each independently be, e.g., a substituted or unsubstituted C1 to C20 alkyl group or a substituted or unsubstituted C3 to C20 cycloalkyl group. In an implementation, $L^5$ may be, e.g., a substituted or unsubstituted C2 to C6 alkylene group. In an implementation, the core may be a bifunctional compound, and a number of 'functional groups' may be based on a number of terminal epoxy groups.'

In an implementation, $R^2$ and $R^4$ may each independently be, e.g., a group represented by Chemical Formula 5-1 or 5-2. In an implementation, the core may be a tetrafunctional or hexafunctional compound, and as the number of terminal epoxy groups (i.e., $R^6$ below) increases, chemical resistance of the core may be further improved:

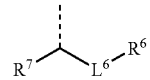

[Chemical Formula 5-1]

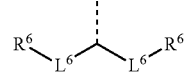

[Chemical Formula 5-2]

In Chemical Formulae 5-1 and 5-2, each $L^6$ may independently be, e.g., a single bond or a substituted or unsubstituted C1 to C10 alkylene group. Each $R^6$ may independently be, e.g., a group represented by a Chemical Formula 6 or a (meth)acrylate group. $R^7$ may be, e.g., a substituted or unsubstituted C1 to C20 alkyl group or a substituted or unsubstituted C3 to C20 cycloalkyl group.

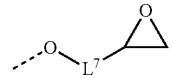

[Chemical Formula 6]

In Chemical Formula 6, $L^7$ may be, e.g., a single bond or a substituted or unsubstituted C1 to C10 alkylene group.

In an implementation, regardless of the type of $R^2$ and $R^4$, both $L^2$ and $L^4$ may be a single bond.

The specific structure of the core represented by Chemical Formula 1 is illustrated and described as a chemical formula as follows.

In an implementation, the core represented by Chemical Formula 1 may be represented by, e.g., one of Chemical Formulae 1-1 to 1-3. In an implementation, Chemical Formula 1-1 is a bifunctional compound, Chemical Formula 1-2 is a tetrafunctional compound, and Chemical Formula 1-3 is a hexafunctional compound, respectively.

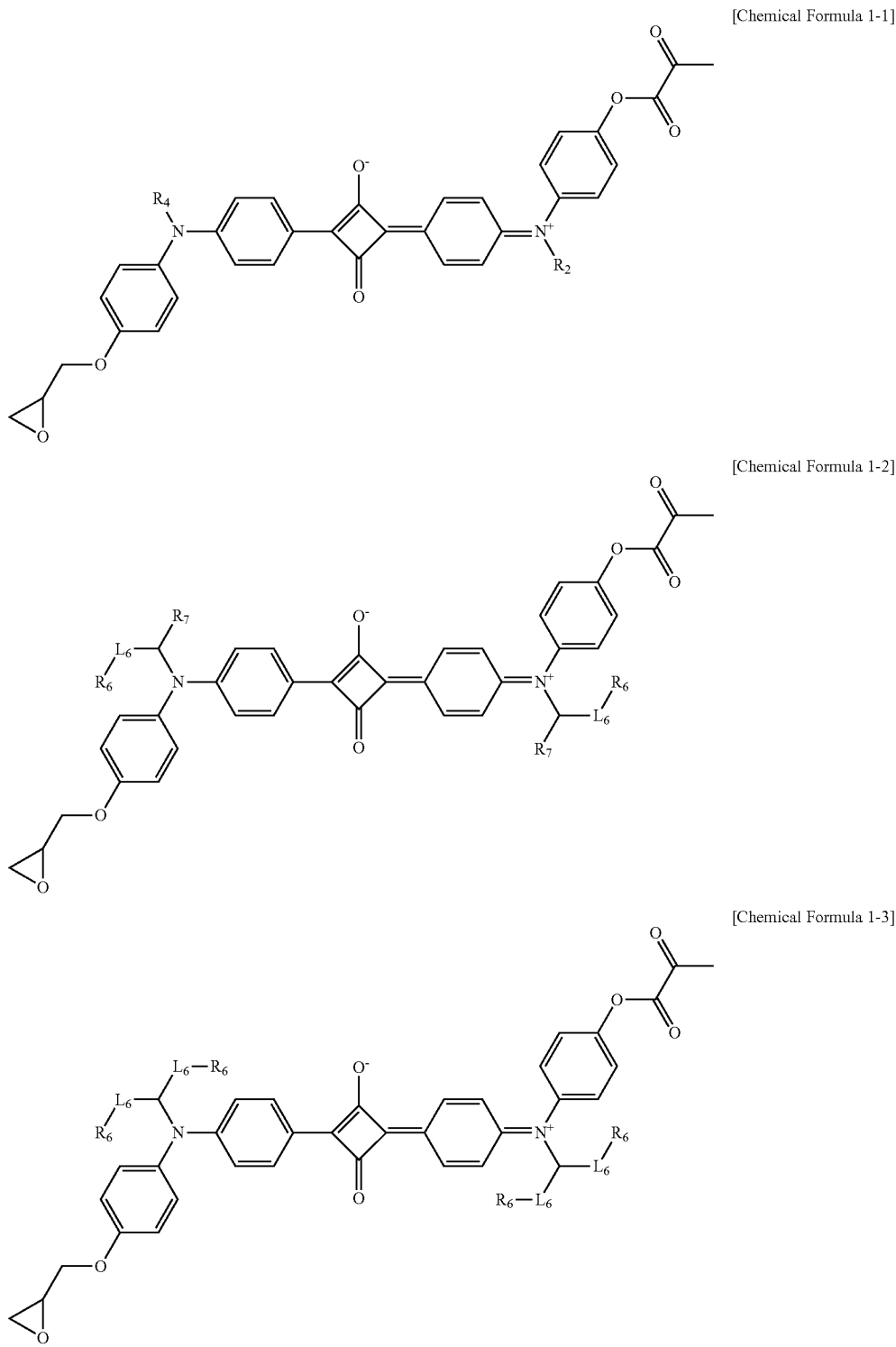

[Chemical Formula 1-1]

[Chemical Formula 1-2]

[Chemical Formula 1-3]

In Chemical Formulae 1-1 to 1-3, $R_2$, $R_4$, and $R_7$ may each independently be, e.g., a substituted or unsubstituted C1 to C20 alkyl group or a substituted or unsubstituted C3 to C20 cycloalkyl group. Each $R_6$ may independently be, e.g., —O—, a substituted or unsubstituted C1 to C6 alkylene-epoxy, or a (meth)acryl group. Each $L_6$ may independently be, e.g., a single bond or a substituted or unsubstituted C1 to C6 alkylene group.

For reference, the core represented by Chemical Formula 1 may include or have three resonance structures, as shown in the following scheme, but in the present specification, only one structure is shown for the compound represented by Chemical Formula 1 for convenience.

[Scheme]

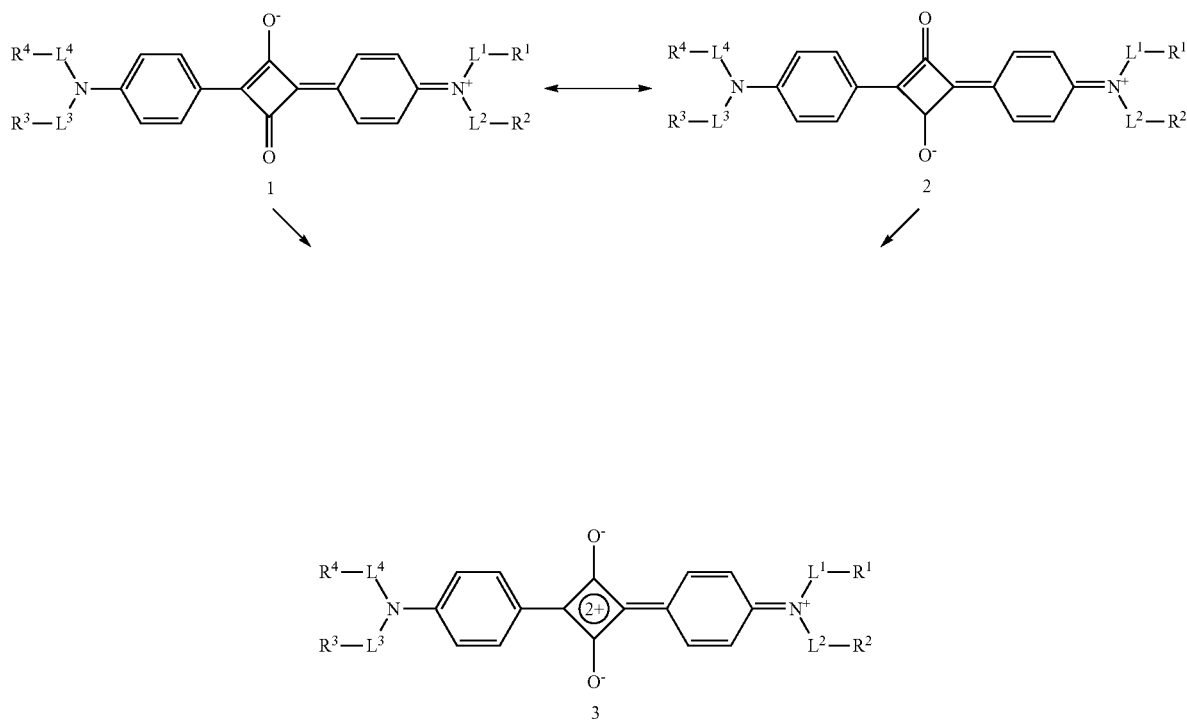

In Chemical Formula 1, the core may be represented by any one of the three resonance structures.

In an implementation, the core represented by Chemical Formula 1 may be represented by one of the following Chemical Formulae.

[Chemical Formula 1-1-1]

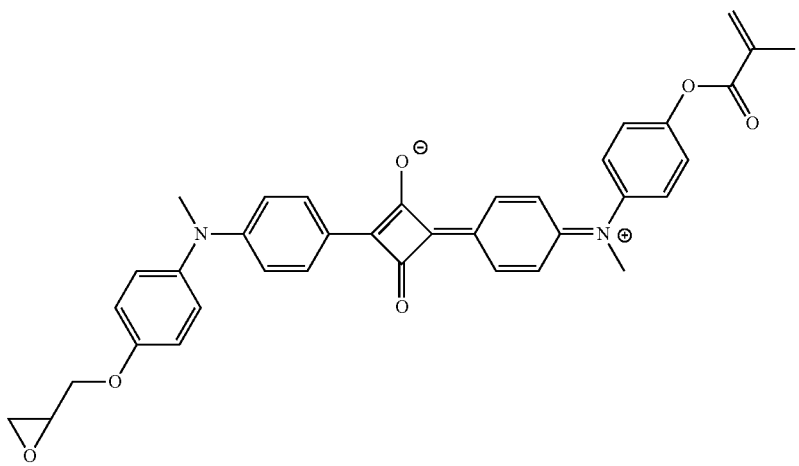

[Chemical Formula 1-1-2]
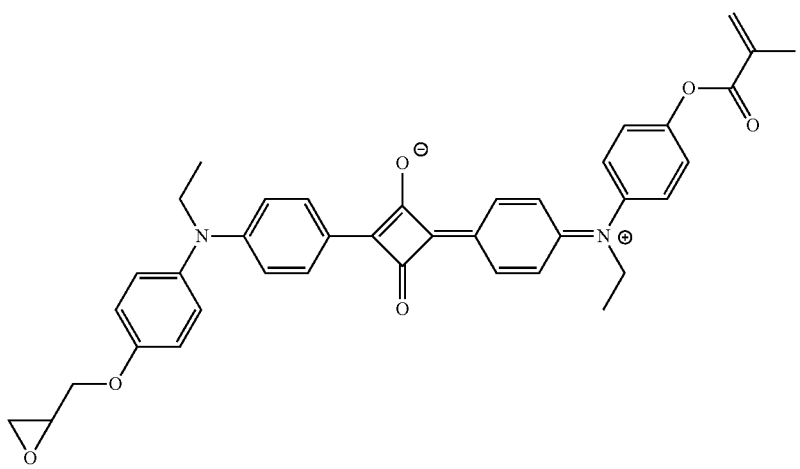
[Chemical Formula 1-1-3]
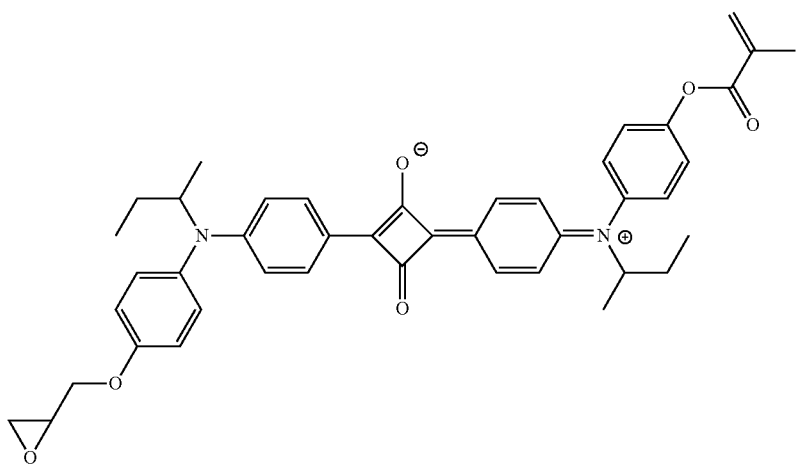
[Chemical Formula 1-1-4]
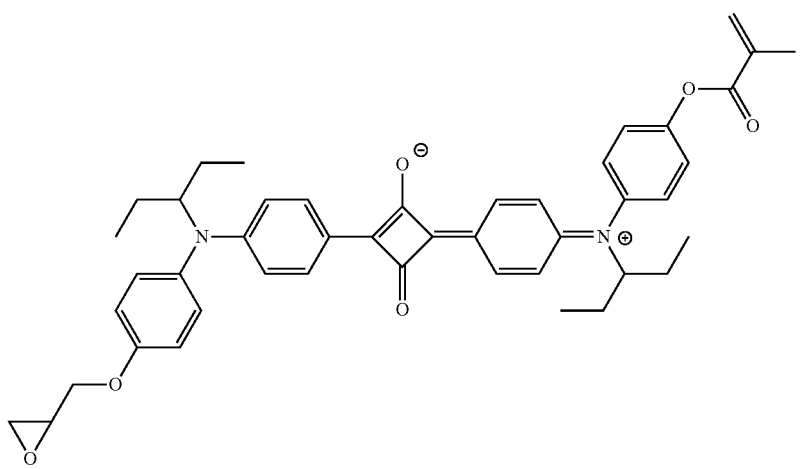

[Chemical Formula 1-1-5]
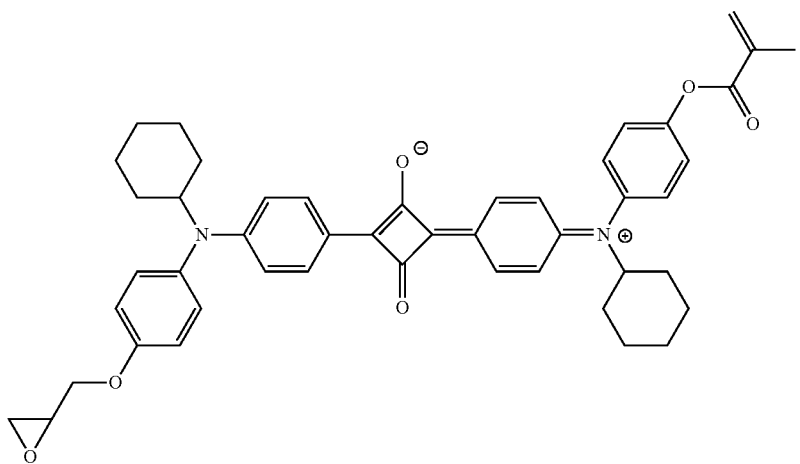
[Chemical Formula 1-2-1]
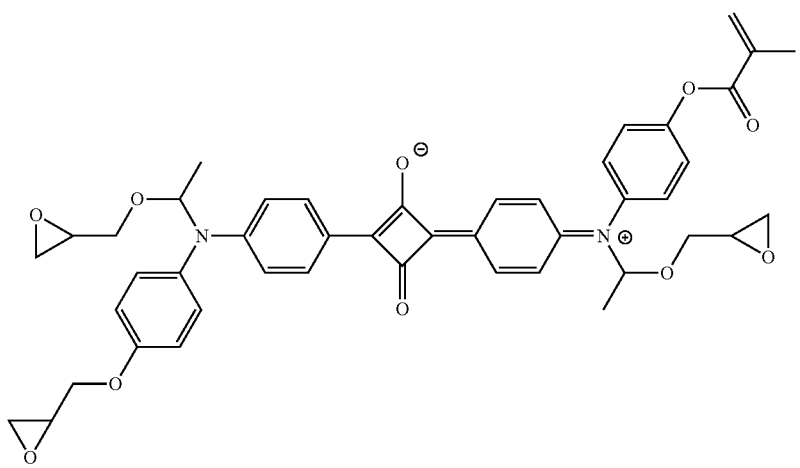
[Chemical Formula 1-2-2]
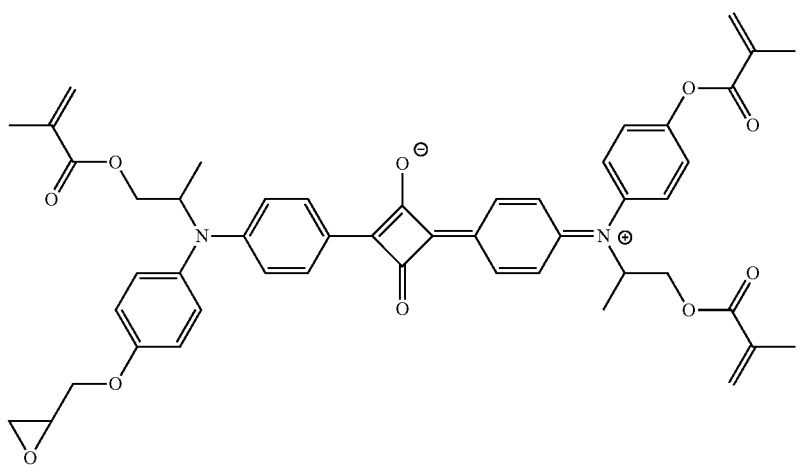

[Chemical Formula 1-3-1]

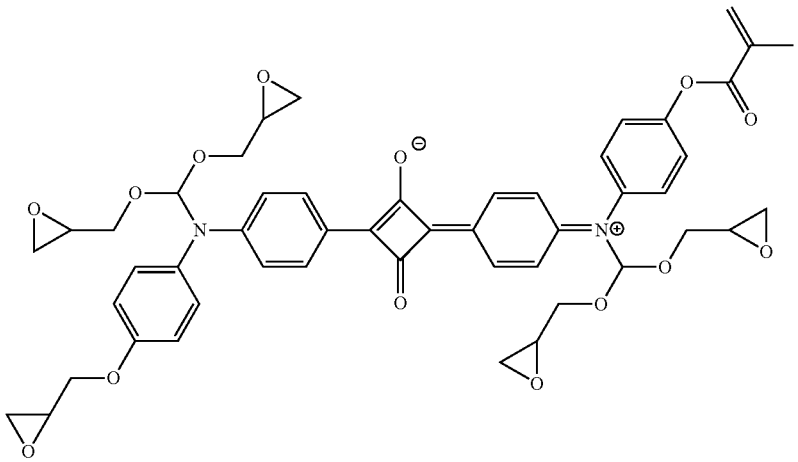

[Chemical Formula 1-3-2]

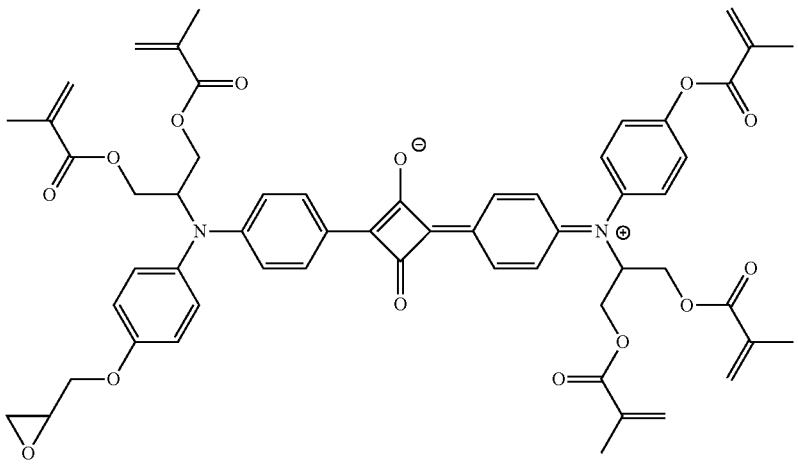

In an implementation, a length of the core represented by Chemical Formula 1 may be about 1 nm to about 3 nm, e.g., about 1.5 nm to about 2 nm. When the compound represented by the above Chemical Formula 1 has a length within the ranges, a core-shell dye including a structure of a core and a shell surrounding the core may be easily formed. In an implementation, when the compound represented by Chemical Formula 1 has a length within the ranges, a structure that a shell of the macrocyclic compound surrounds a compound represented by Chemical Formula 1 may be obtained. If other compounds having a length out of the range were to be used, it could difficult to form the structure that the shell surrounds the core compound, and durability may hardly be improved.

The core represented by Chemical Formula 1 itself may have a maximum absorption peak at a wavelength of about 530 nm to about 680 nm. The core-shell dye including the compound represented by Chemical Formula 1 with the spectral characteristics as a core may be applied to a green photosensitive resin composition for a color filter for a CMOS image sensor.

In an implementation, the core-shell dye may have a different maximum absorption peak depending on whether a halogen group is introduced into the shell represented by Chemical Formula 2.

In an implementation, the shell represented by Chemical Formula 2 may include an amide bond (—CONH—). In an implementation, a hydrogen atom included in the amide bond of the shell represented by Chemical Formula 2 may form a non-covalent bond with an oxygen atom of the compound represented by Chemical Formula 1. In an implementation, these two atoms may form a hydrogen bond and may help enhance the durability of the core-shell dye.

A specific structure of the shell represented by Chemical Formula 2 will be illustrated as follows.

In an implementation, one of $Z^1$ and $Z^2$ may be *—CH—* or a nitrogen atom, and the other of $Z^1$ and $Z^2$ may be *—CH—*. In an implementation, when a nitrogen atom is introduced into either one of $Z^1$ and $Z^2$, compared with when not introduced, non-covalent bonds of the shell and the core or inside the shell increase, thereby further enhancing the durability of the core-shell dye.

$X^1$ and $X^2$ may each independently be, e.g., a halogen atom, and l+m may be an integer of 1 to 4. When halogen atoms are introduced into the shell, compared with when not introduced, a maximum absorption peak of the core-shell dye shifts toward a long wavelength region, realizing excellent matching properties into a green wavelength band.

L' and L'' may each independently be, e.g., a substituted or unsubstituted C1 to C10 alkylene group. In an implementation, excellent solubility may be obtained, and the structure that a shell surrounds a core including the compound represented by Chemical Formula 1 is easy to form.

In an implementation, n may be 2.

The specific structure of the shell represented by Chemical Formula 2 may be shown as follows.

In an implementation, the shell represented by Chemical Formula 2 may be represented by, e.g., Chemical Formula 2-1 or 2-2:

[Chemical Formula 2-1]

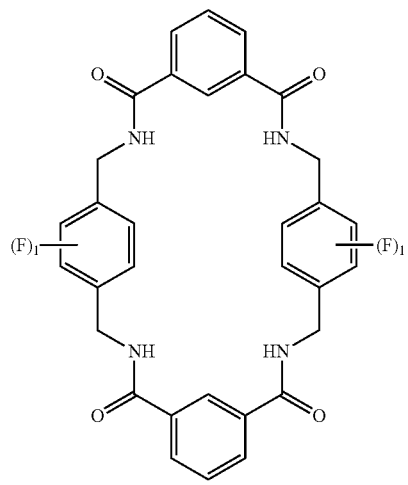

[Chemical Formula 2-2]

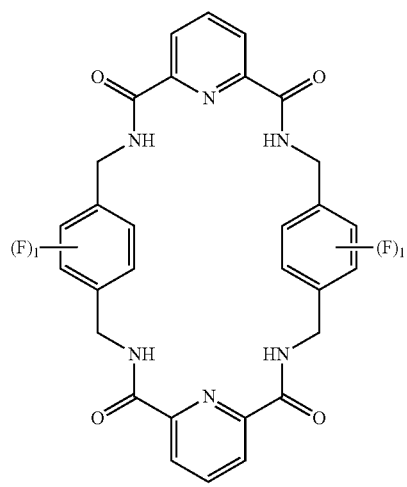

Chemical Formulae 2-1 and 2-2 each include stereoisomers, and l may be, e.g., an integer of 0 to 4.

A core-shell dye using a shell represented by Chemical Formula 2-2 may have good durability. In an implementation, both the shell represented by Chemical Formula 2-1 and the shell represented by Chemical Formula 2-2, when l is an integer of about 1 or more, and as the integer is larger, the core-shell dye may have an effect of shifting the maximum absorption peak more toward a long wavelength region.

In an implementation, the shell represented by Chemical Formula 2 may be represented by Chemical Formula 2-1-1, Chemical Formula 2-1-2, Chemical Formula 2-2-1 or Chemical Formula 2-2-2.

[Chemical Formula 2-1-1]

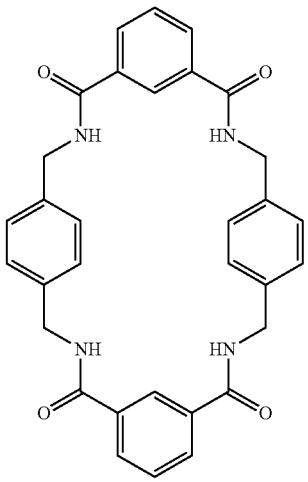

[Chemical Formula 2-1-2]

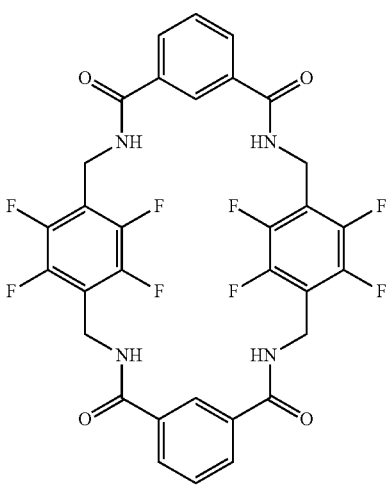

[Chemical Formula 2-2-1]

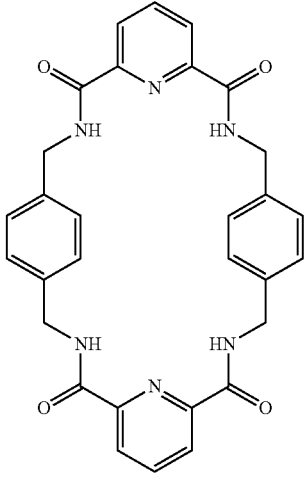

[Chemical Formula 2-2-2]

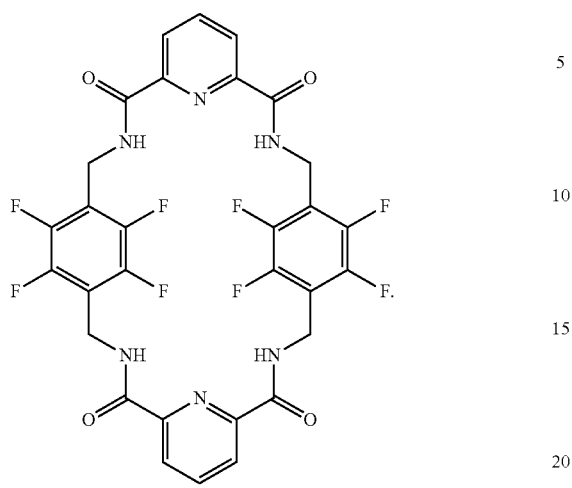

The core-shell dye may include a core including the compound or moiety represented by Chemical Formula 1 and the shell in a mole ratio of 1:1. When the core and the shell are present in the mole ratio, a coating layer (shell) surrounding the core including the compound represented by Chemical Formula 1 may be well formed.

In an implementation, the core-shell dye may be represented by one of the following Chemical Formulae.

[Chemical Formula 7-1-1]

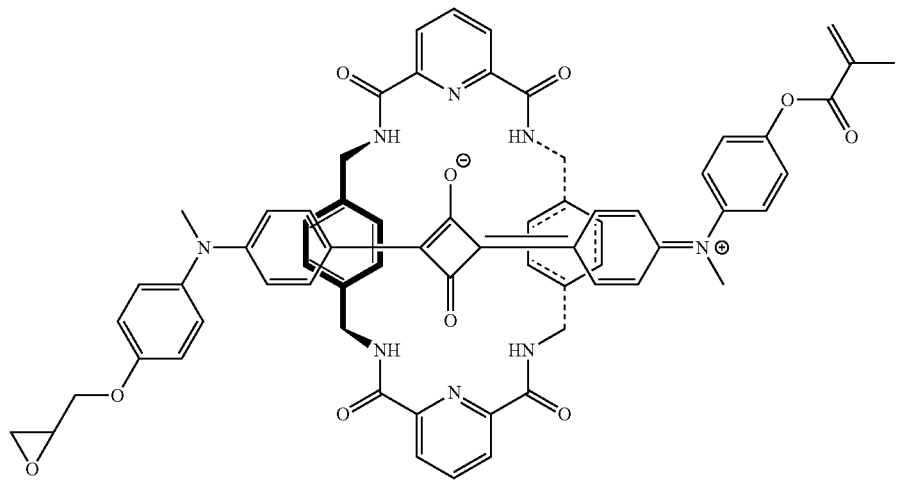

[Chemical Formula 7-1-2]
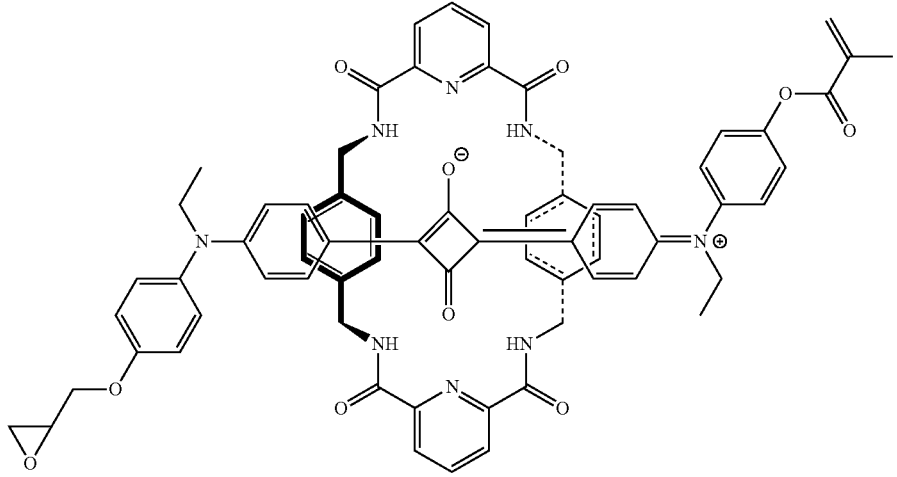
[Chemical Formula 7-1-3]
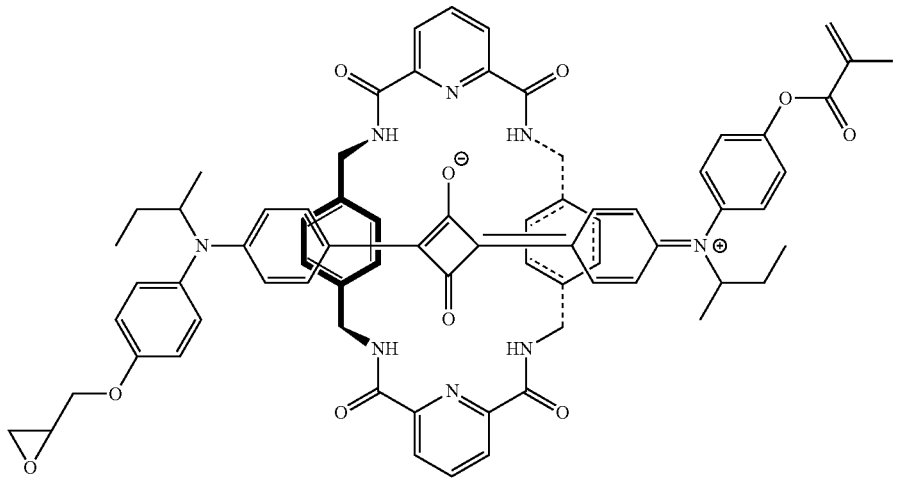
[Chemical Formula 7-1-4]
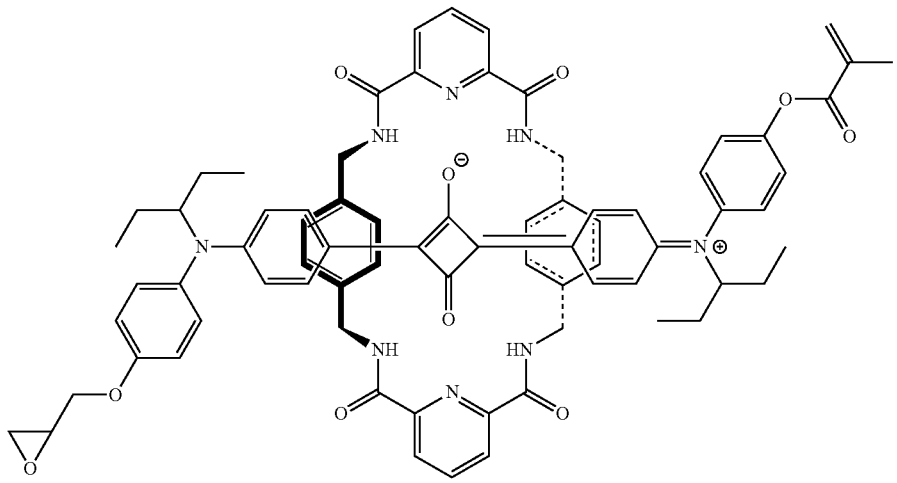

[Chemical Formula 7-1-5]
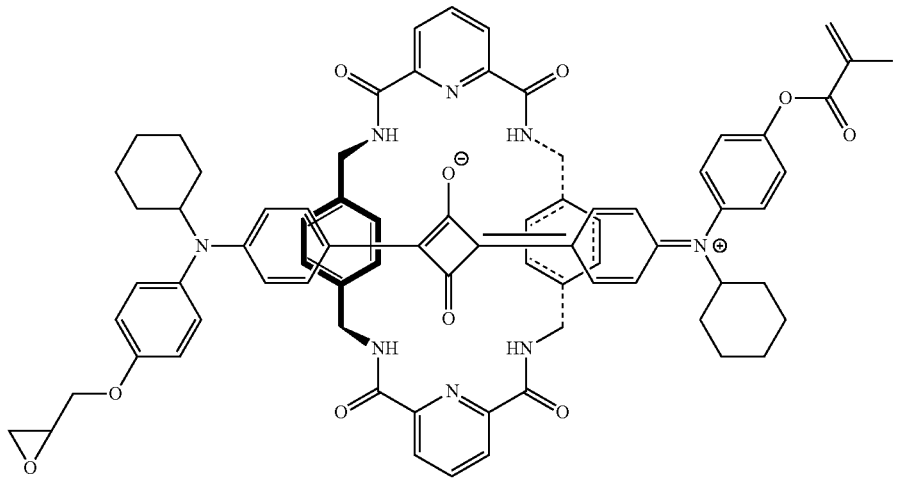
[Chemical Formula 7-2-1]
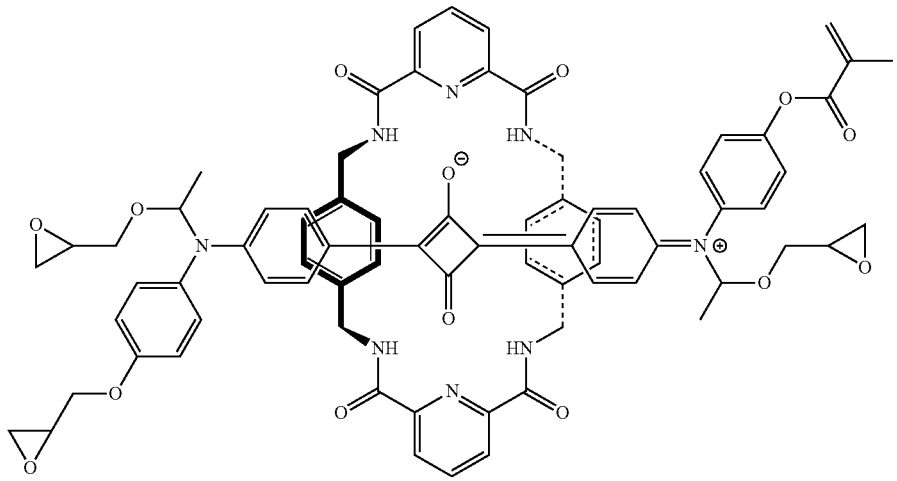
[Chemical Formula 7-2-2]
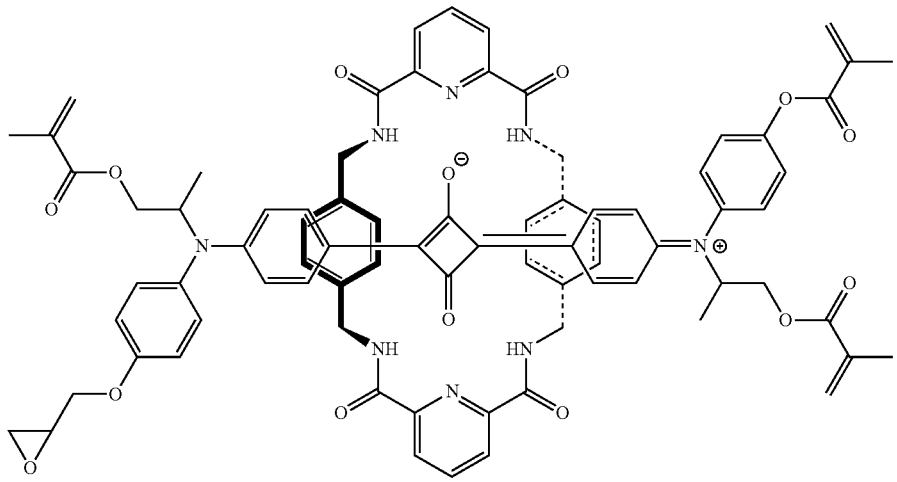

[Chemical Formula 7-3-1]
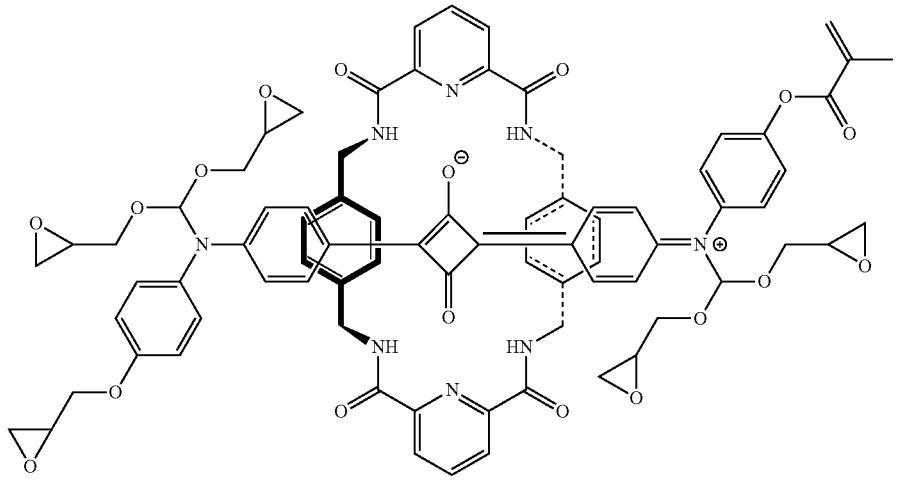
[Chemical Formula 7-3-2]
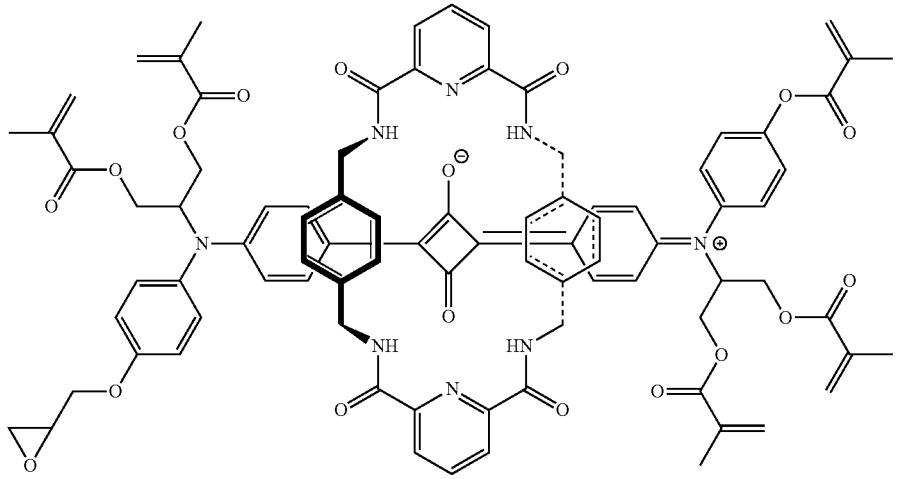
[Chemical Formula 8-1-1]
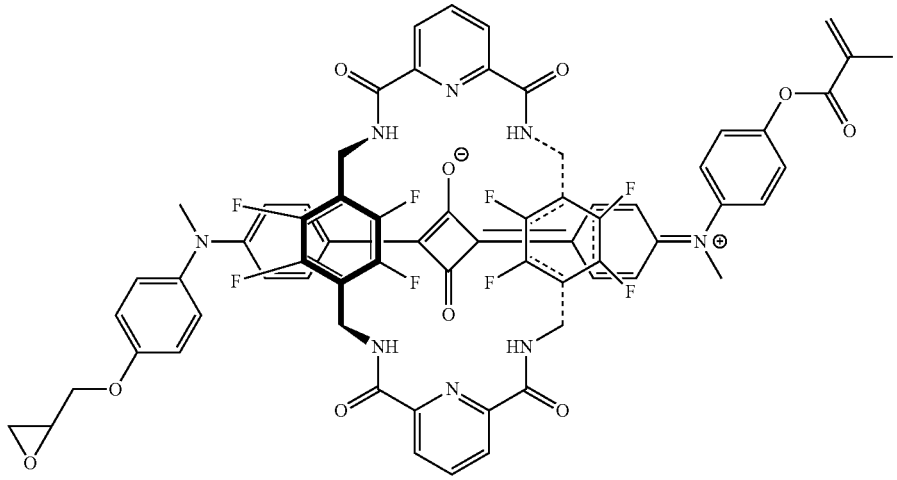

[Chemical Formula 8-1-2]
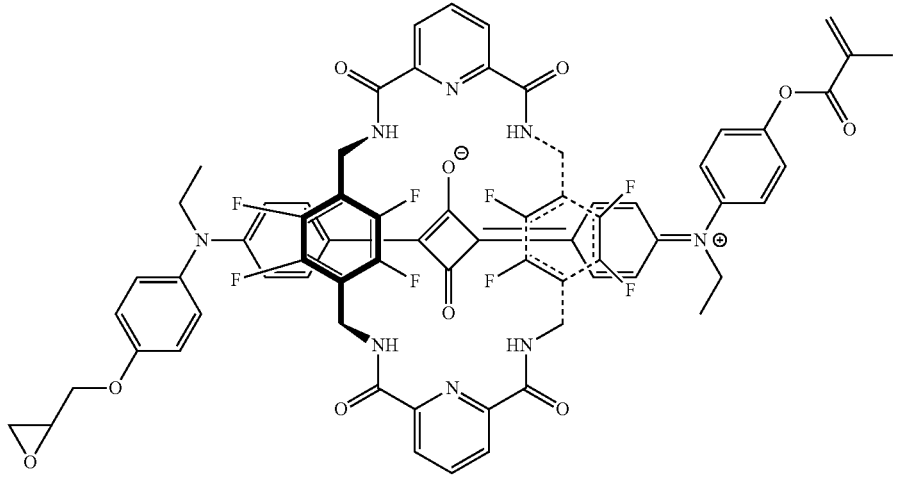
[Chemical Formula 8-1-3]
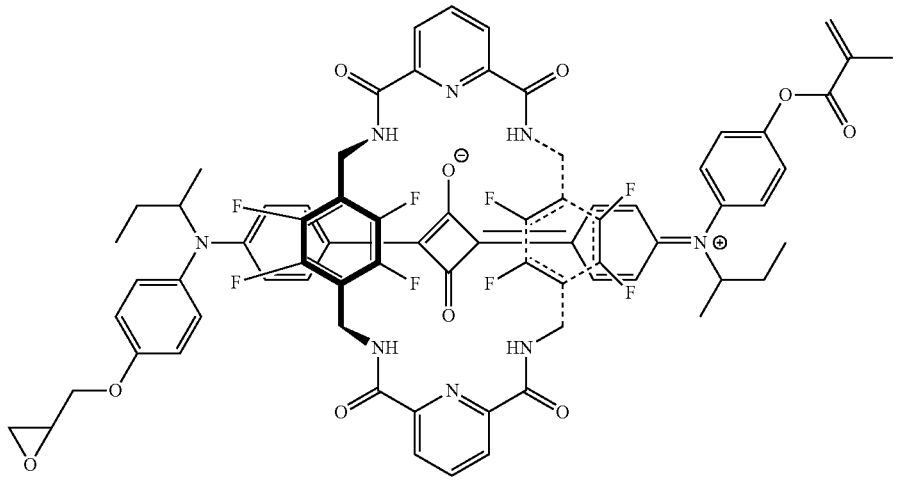
[Chemical Formula 8-1-4]
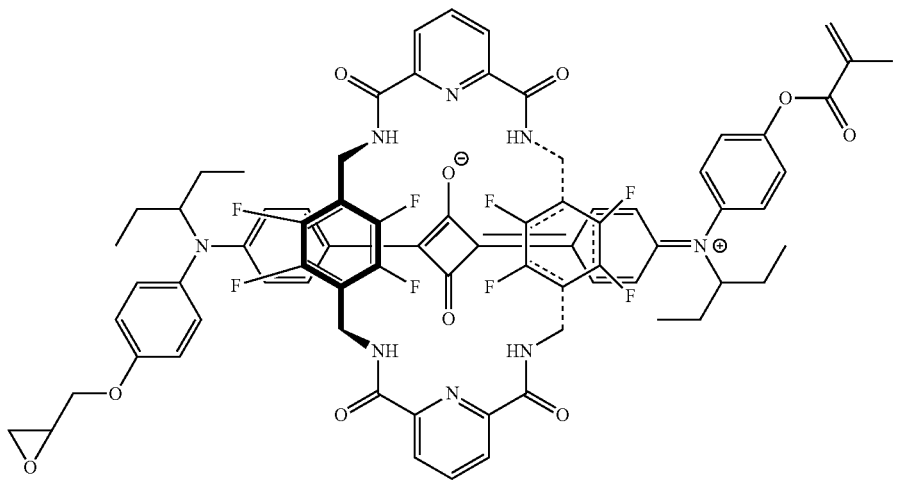

[Chemical Formula 8-1-5]
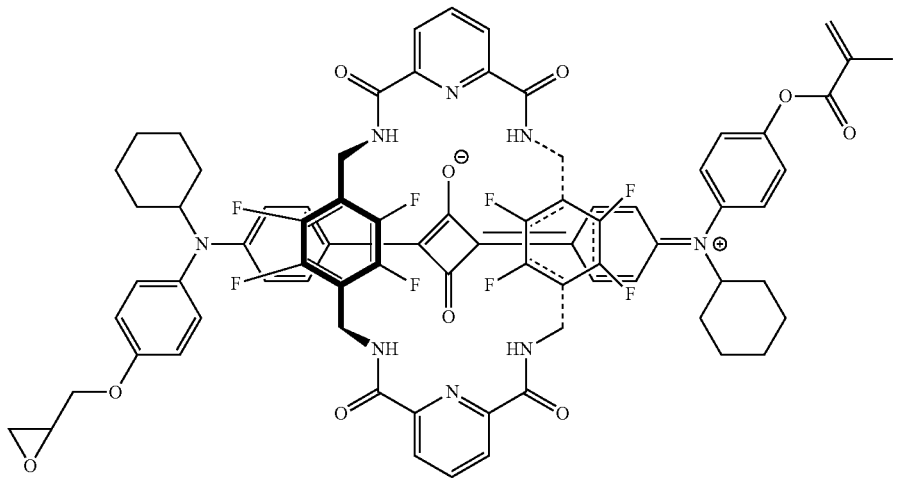
[Chemical Formula 8-2-1]
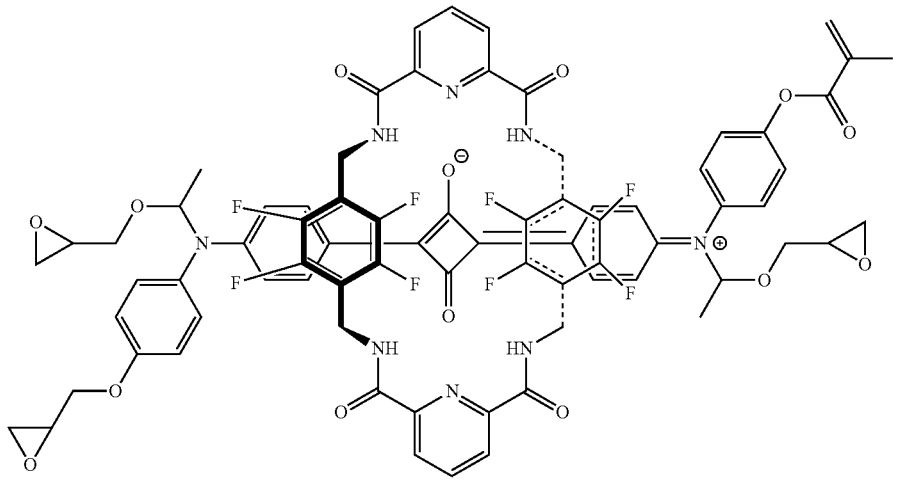
[Chemical Formula 8-2-2]
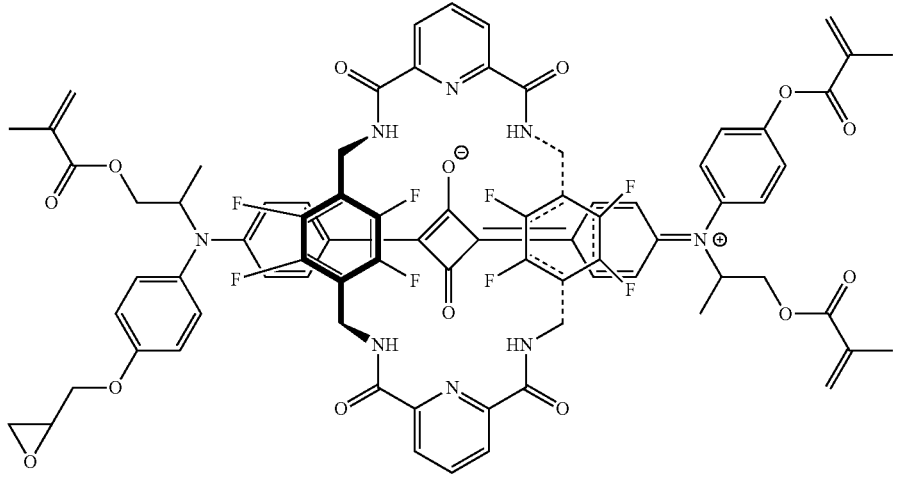

[Chemical Formula 8-3-1]
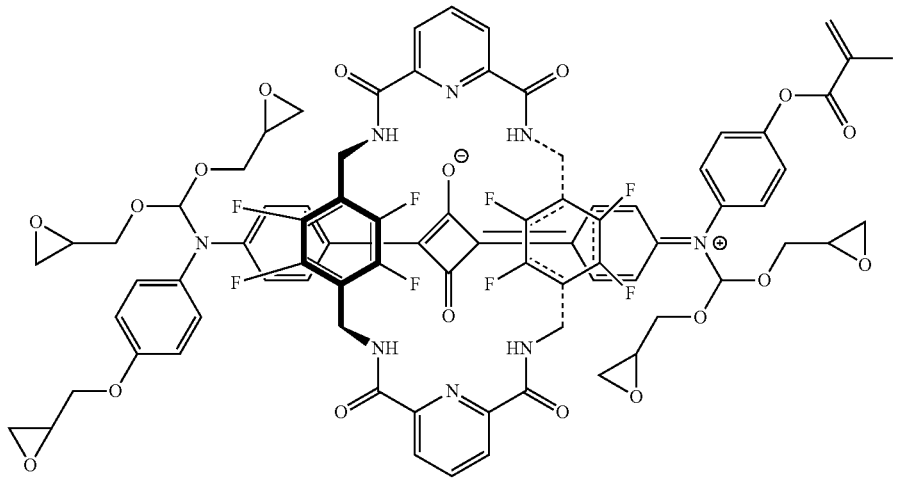
[Chemical Formula 8-3-2]
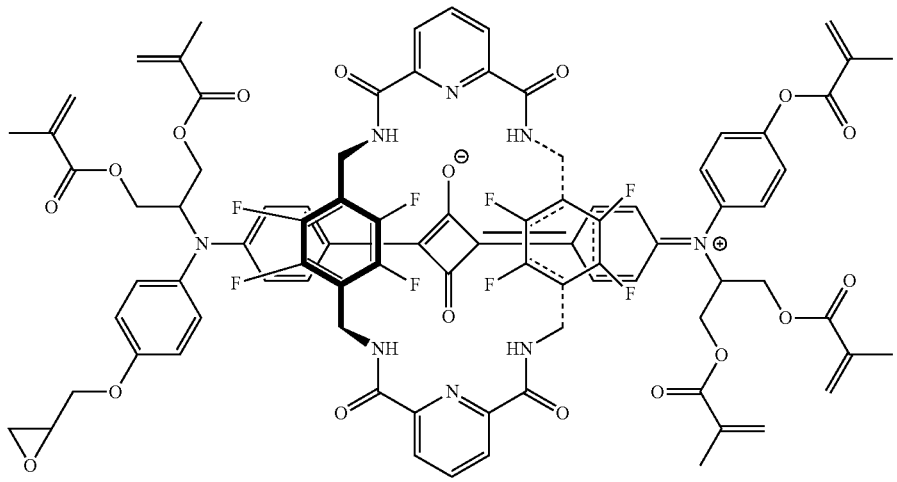
[Chemical Formula 9-1-1]
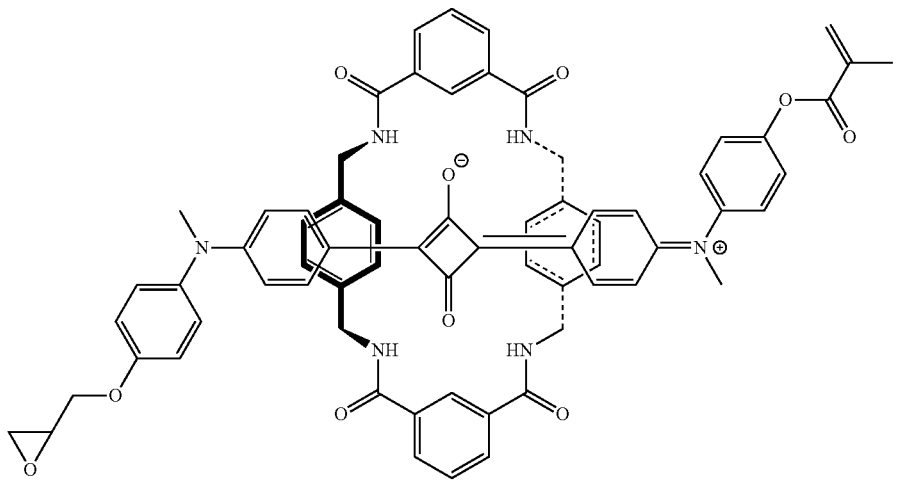

[Chemical Formula 9-1-2]
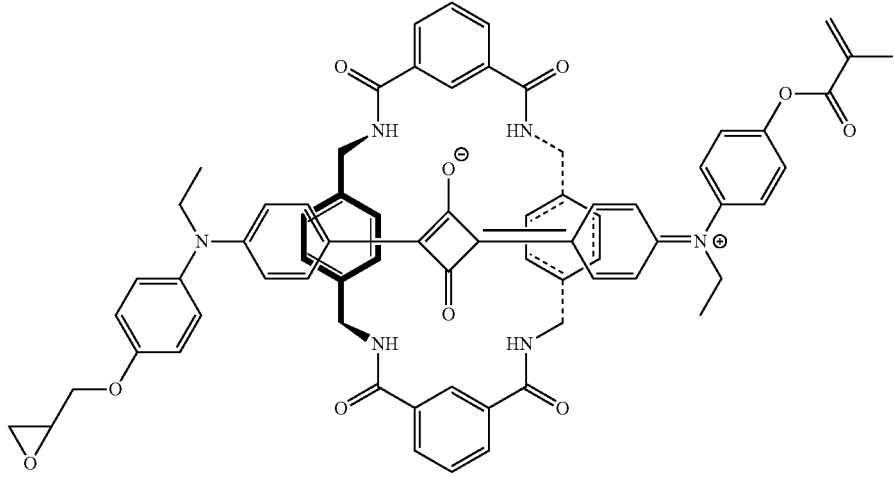
[Chemical Formula 9-1-3]
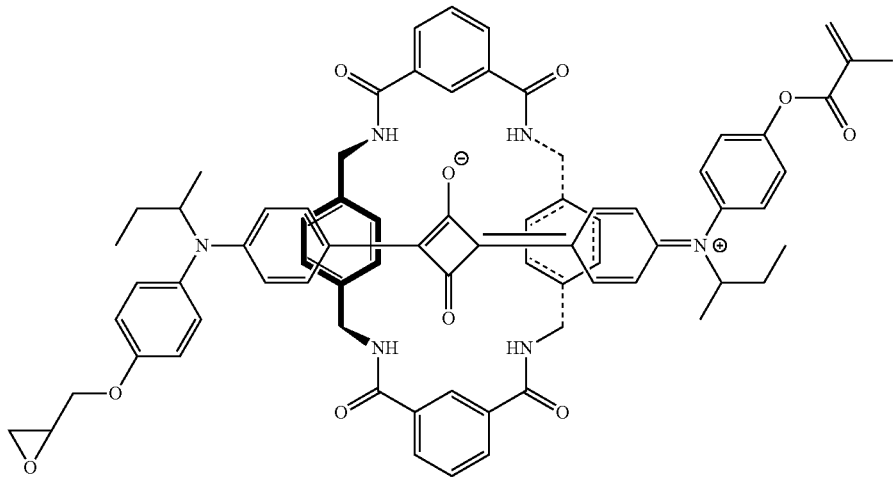
[Chemical Formula 9-1-4]
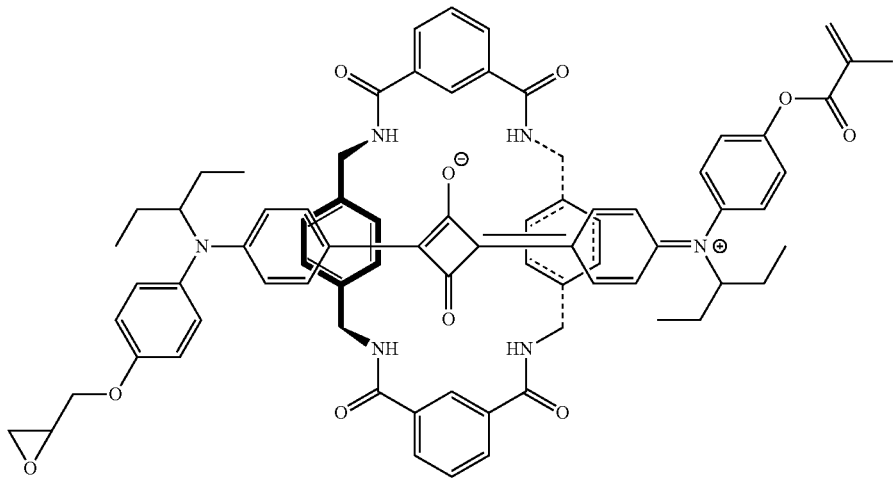

[Chemical Formula 9-1-5]
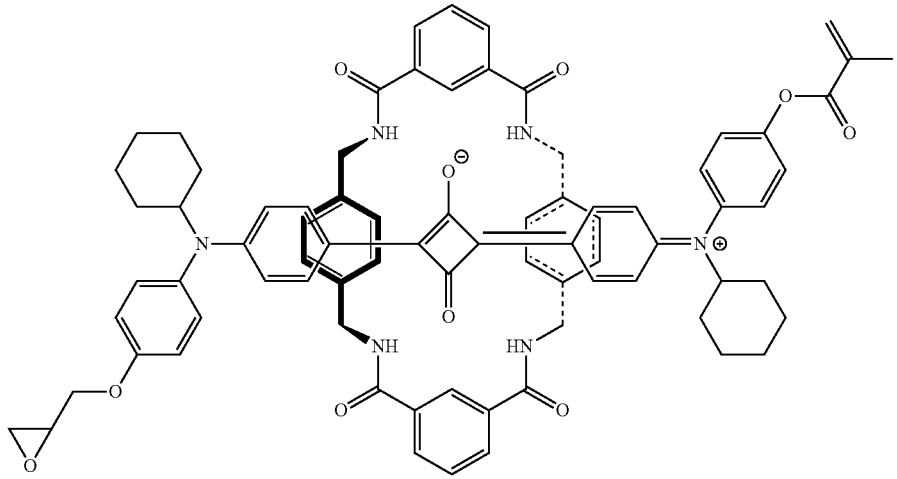
[Chemical Formula 9-2-1]
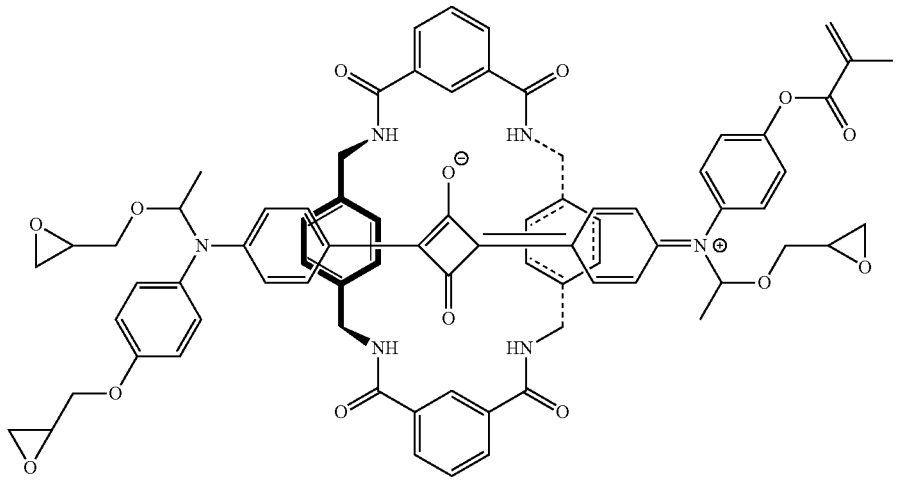
[Chemical Formula 9-2-2]
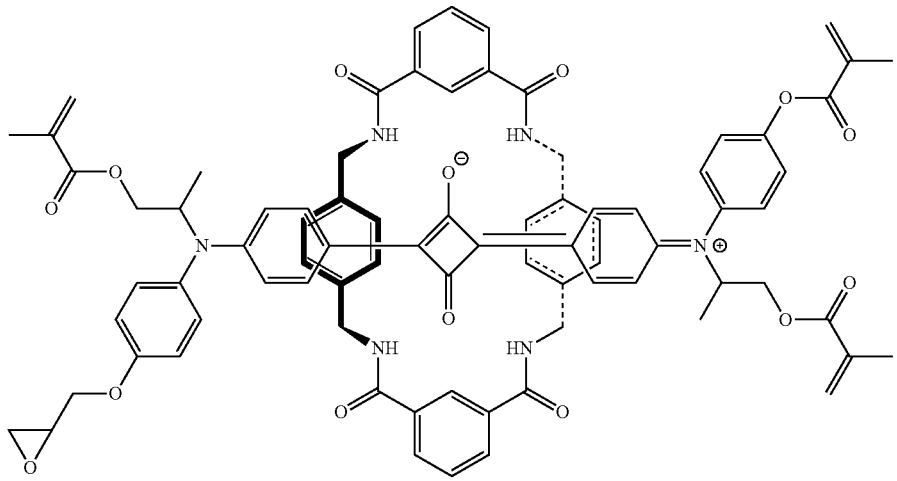

[Chemical Formula 9-3-1]
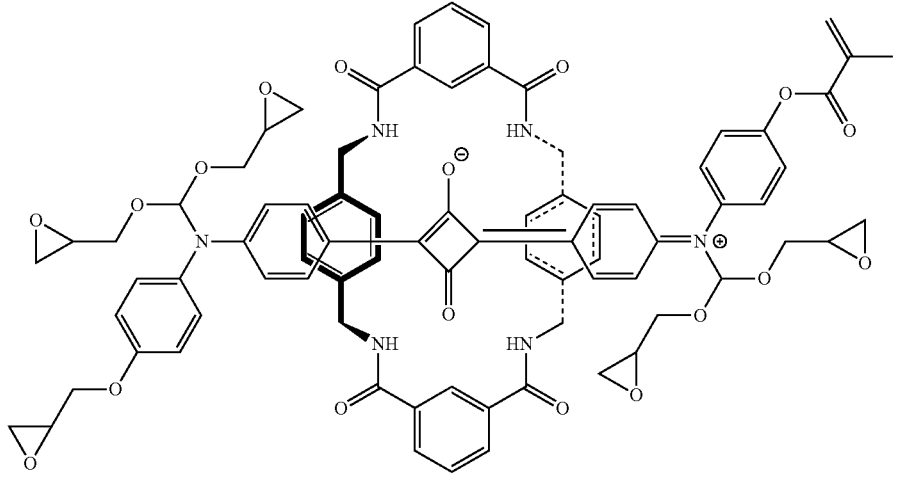
[Chemical Formula 9-3-2]
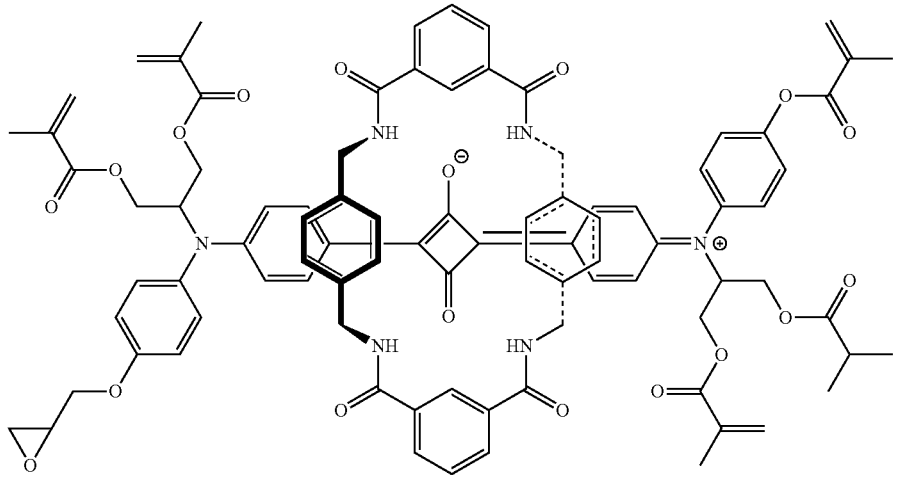
[Chemical Formula 10-1-1]
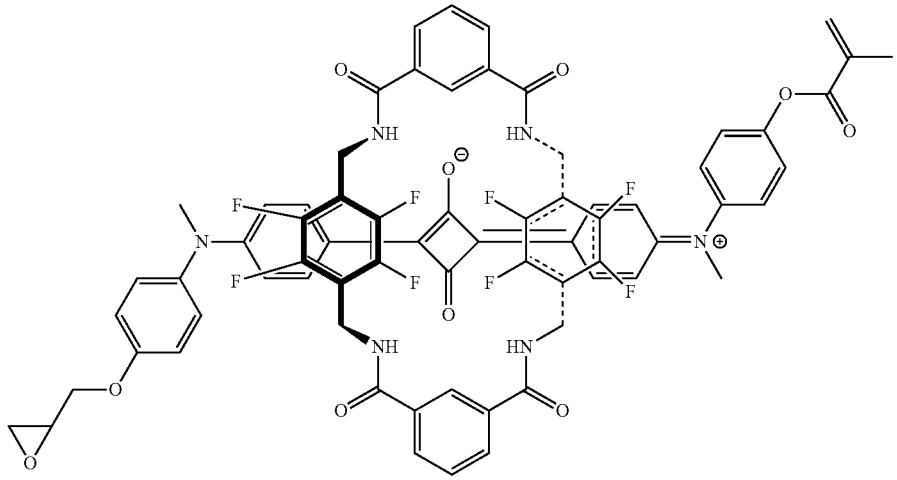

[Chemical Formula 10-1-2]
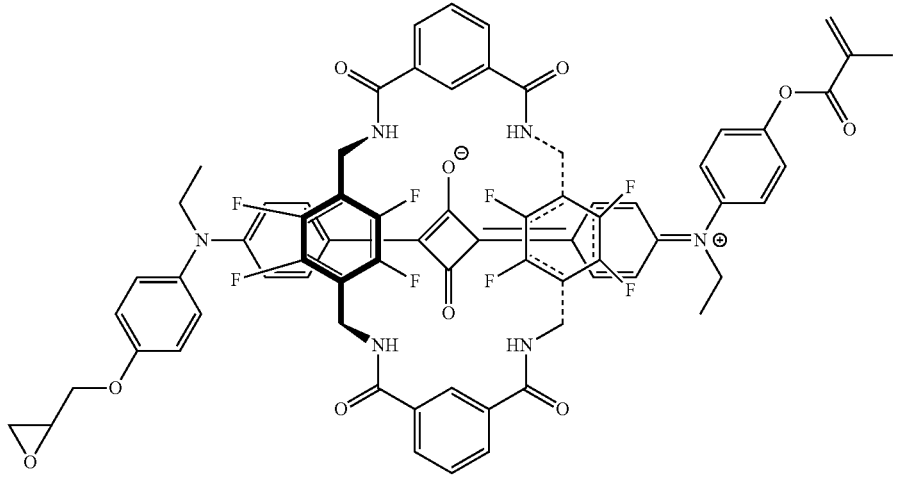
[Chemical Formula 10-1-3]
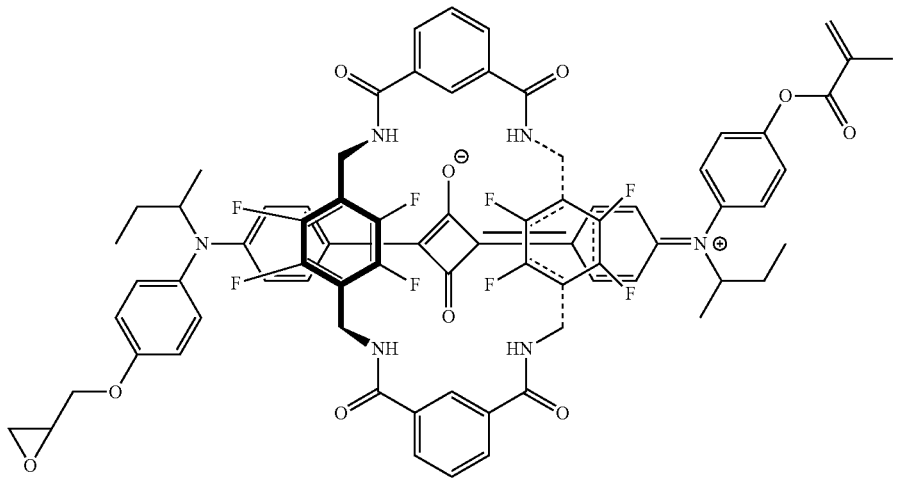
[Chemical Formula 10-1-4]
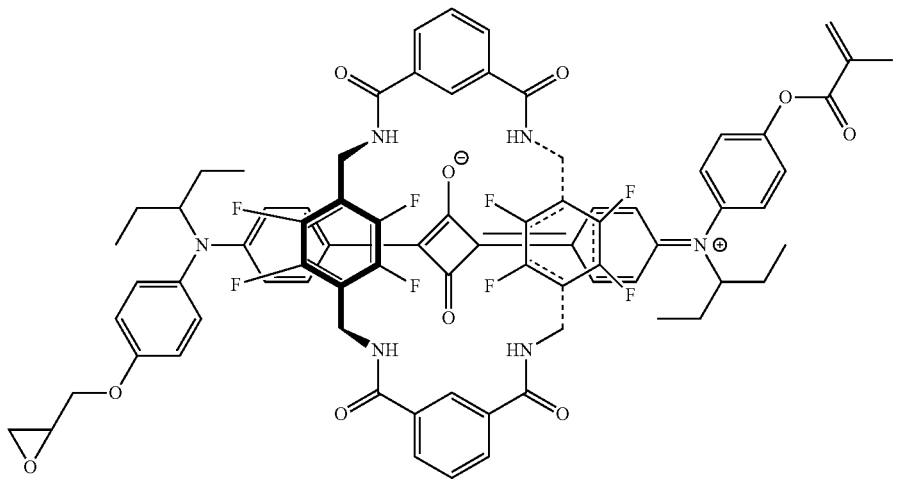

[Chemical Formula 10-1-5]
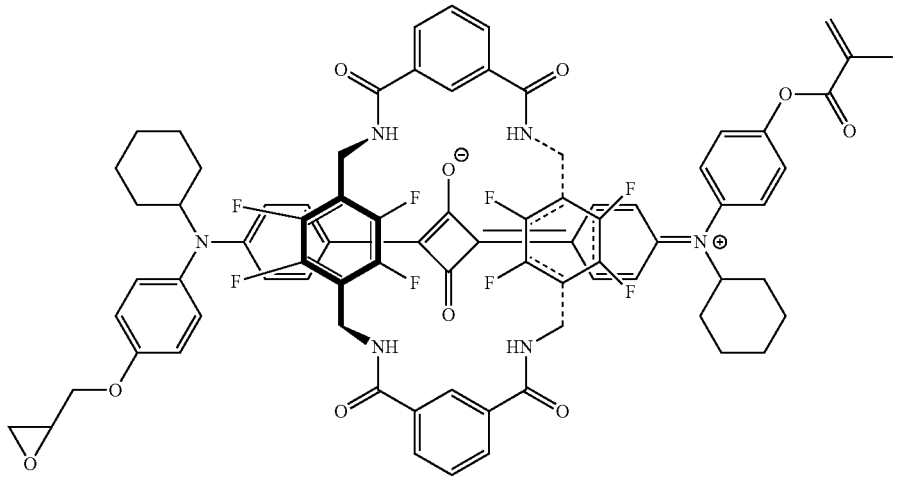
[Chemical Formula 10-2-1]
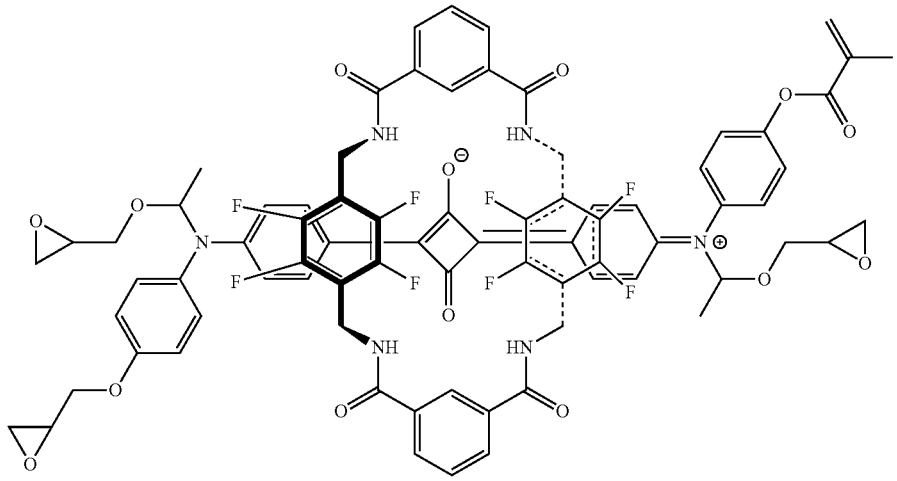
[Chemical Formula 10-2-2]
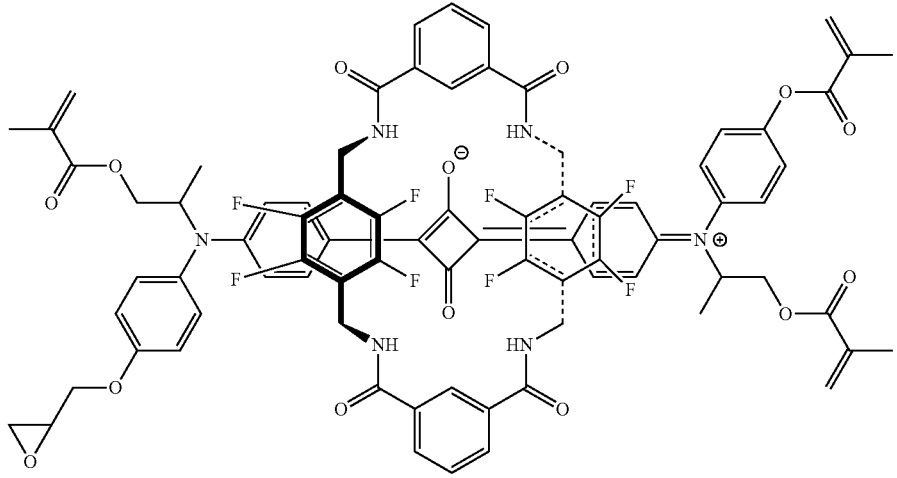

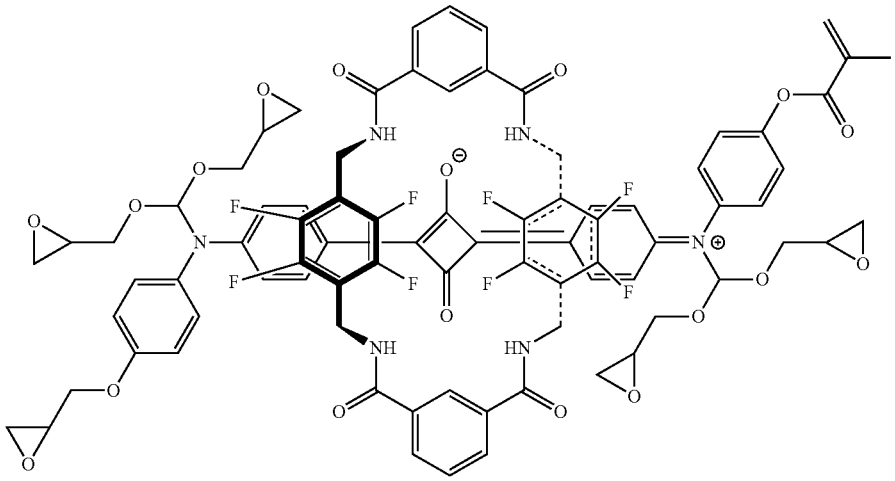

[Chemical Formula 10-3-1]

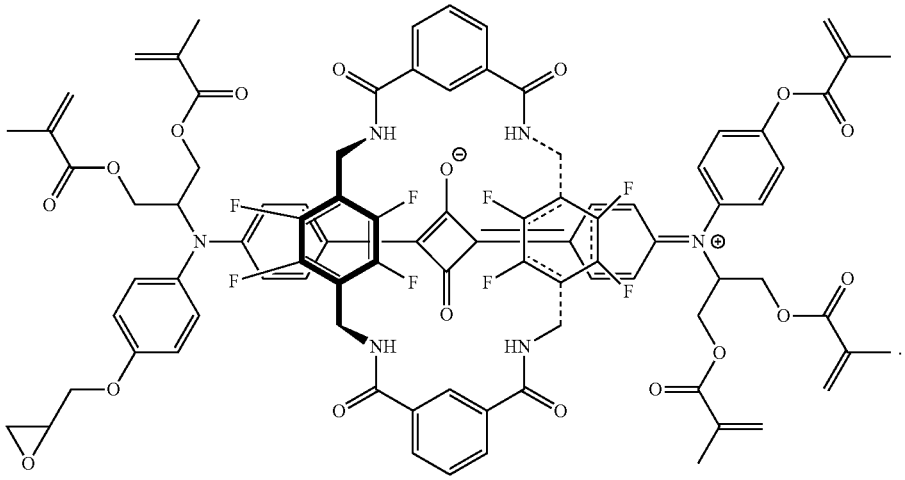

[Chemical Formula 10-3-2]

In an implementation, the core-shell dye may have a maximum absorption peak at a wavelength of about 530 nm to about 700 nm.

If a halogen group were not introduced into the shell represented by Chemical Formula 2, the core-shell dye including the same may have a maximum absorption peak at a wavelength of about 530 nm to about 680 nm. In an implementation, when a halogen group is introduced into the shell represented by Chemical Formula 2, it may have a maximum absorption peak at a wavelength of about 550 nm to about 700 nm.

In an implementation, when a halogen group is introduced into the shell represented by Chemical Formula 2, the maximum absorption peak of the core-shell compound may shift to a long wavelength region by about 20 nm, and matching properties into a green wavelength band may be exhibited, compared with a case where a halogen group is not introduced.

The core-shell dye may be used alone as a green dye, or may be used in combination with an auxiliary dye.

Examples of the auxiliary dye may include triarylmethane dyes, anthraquinone dyes, benzylidene dyes, cyanine dyes, phthalocyanine dyes, azaporphyrin dyes, indigo dyes, xanthene dyes, pyridone azo dyes, and the like.

(Photosensitive Resin Composition)

According to another embodiment, a photosensitive resin composition may include the moiety represented by Chemical Formula 1 or the core-shell dye.

In an implementation, the photosensitive resin composition may include, e.g., (A) a colorant (e.g., the core-shell dye), (B) a binder resin, (C) a photopolymerizable monomer, (D) a photopolymerization initiator, and (E) a solvent.

Hereinafter, each component is described in detail.

(A) Colorant

The colorant may include the core-shell dye described above.

In an implementation, the colorant may further include a pigment in addition to the core-shell dye.

The pigment may include a red pigment, a green pigment, a blue pigment, a yellow pigment, a black pigment, or the like.

Examples of the red pigment may include C.I. Red pigment 254, C.I. Red pigment 255, C.I. Red pigment 264, C.I. Red pigment 270, C.I. Red pigment 272, C.I. Red pigment 177, C.I. Red pigment 89, and the like. Examples of the green pigment may include C.I. Green pigment 7, C.I. Green pigment 36, C.I. Green pigment 58, C.I. Green pigment 59, and the like. Examples of the blue pigment may include copper phthalocyanine pigments such as C.I. Blue pigment 15:6, C.I. Blue pigment 15, C.I. Blue pigment 15:1, C.I. Blue pigment 15:2, C.I. blue pigment 15:3, C.I. Blue pigment 15:4, C.I. Blue pigment 15:5, C.I. Blue pigment 16, and the like. Examples of the yellow pigment may include isoindoline pigments such as C.I. Yellow pigment 139, quinophthalone-based pigments such as C.I. Yellow pigment 138, nickel complex pigments such as C.I. Yellow pigment 150, and the like. Examples of the black pigment include aniline black, perylene black, titanium black, carbon black, and the like. The pigments may be used alone or in combination of two or more.

The pigments may be included in the photosensitive resin composition for a color filter in the form of a dispersion. Such a pigment dispersion may be composed of the pigment, a solvent, a dispersant, a dispersion resin, or the like.

The solvent may include ethylene glycol acetate, ethyl cellosolve, propylene glycol methyl ether acetate, ethyl lactate, polyethylene glycol, cyclohexanone, propylene glycol methyl ether, or the like. In an implementation, propylene glycol methyl ether acetate may be used.

The dispersant may help the pigment be uniformly dispersed in the dispersion, and nonionic, anionic or cationic dispersants may be used respectively. In an implementation, polyalkylene glycol or its ester, polyoxy alkylene, a polyhydric alcohol ester alkylene oxide adduct, an alcohol alkylene oxide adduct, sulfonic acid ester, sulfonic acid salt, carboxylic acid ester, carboxylic acid salt, alkyl amide alkylene oxide adduct, an alkylamine, or the like may be used, and these may be used alone or in combination of two or more.

As the dispersion resin, an acrylic resin including a carboxyl group may be used, which may help improve the stability of the pigment dispersion as well as the patternability of the pixel.

When the core-shell dye and the pigment are mixed and used, they may be used in a weight ratio of about 1:9 to about 9:1, e.g., a weight ratio of about 3:7 to about 7:3. When mixing in the above weight ratio ranges, chemical resistance, durability, and maximum absorption wavelength may be controlled in an appropriate range, and high luminance and contrast ratio may be exhibited in a desired color coordinate.

In an implementation, the core-shell dye may be included in an amount of, e.g., about 0.5 wt % to about 10 wt %, based on the total weight of the photosensitive resin composition for the color filter. When the core-shell dye is used within the above range, chemical resistance, durability, and maximum absorption wavelength may be controlled in an appropriate range, and high luminance and contrast ratio may be exhibited in a desired color coordinate. In an implementation, it may be included in an amount of about 0.5 wt % to about 5 wt %, and even if the amount of dye is reduced in this way, chemical resistance, durability, and maximum absorption wavelength may be controlled in an appropriate range.

(B) Binder Resin

The binder resin may be a copolymer of a first ethylenic unsaturated monomer and a second ethylenic unsaturated monomer that is copolymerizable with the first ethylenic unsaturated monomer and may be a resin including at least one acrylic repeating unit.

The first ethylenic unsaturated monomer may be an ethylenic unsaturated monomer including at least one carboxyl group and examples of the monomer may include acrylic acid, methacrylic acid, maleic acid, itaconic acid, fumaric acid, or a combination thereof.

The first ethylenic unsaturated monomer may be included in an amount ranging from about 5 wt % to about 50 wt %, e.g., about 10 wt % to about 40 wt % based on the total weight of the alkali soluble resin.

Examples of the second ethylenic unsaturated monomer may include an aromatic vinyl compound such as styrene, α-methylstyrene, vinyltoluene, vinylbenzylmethylether, and the like; an unsaturated carboxylic acid ester compound such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; an unsaturated carboxylic acid amino alkyl ester compound such as 2-aminoethyl(meth)acrylate, 2-dimethylaminoethyl(meth)acrylate, and the like; a carboxylic acid vinyl ester compound such as vinyl acetate, vinyl benzoate, and the like; an unsaturated carboxylic acid glycidyl ester compound such as glycidyl(meth)acrylate and the like; a vinyl cyanide compound such as (meth)acrylonitrile and the like; an unsaturated amide compound such as (meth)acrylamide and the like; and the like and may be used alone or as a mixture of two or more.

Specific examples of the binder resin may include a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and the like, and may be used alone or as a mixture of two or more.

The binder resin may have a weight average molecular weight of about 3,000 g/mol to about 150,000 g/mol, e.g., about 5,000 g/mol to about 50,000 g/mol, or about 20,000 g/mol to about 30,000 g/mol. When the weight average molecular weight of the binder resin is within the above ranges, close contacting properties for the substrate may be improved, physical and chemical properties are good, and the viscosity may be appropriate.

The binder resin may have an acid value of about 15 mgKOH/g to about 60 mgKOH/g, e.g., about 20 mgKOH/g to about 50 mgKOH/g. When the acid value of the binder resin is within the above ranges, a pixel pattern may have excellent resolution.

The binder resin may be included in an amount of about 0.1 wt % to about 30 wt %, e.g., about 5 wt % to about 20 wt %, based on the total weight of the photosensitive resin composition. When the binder resin is included within the ranges, the composition may have an excellent developability and improved cross-linking, and thus may have excellent surface flatness when manufactured into a color filter.

(C) Photopolymerizable Monomer

The photopolymerizable monomer may be mono-functional or multi-functional ester of (meth)acrylic acid including at least one ethylenic unsaturated double bond.

The photopolymerizable monomer may have the ethylenic unsaturated double bond and thus, may cause sufficient polymerization during exposure in a pattern-forming process and form a pattern having excellent heat resistance, light resistance, and chemical resistance.

Specific examples of the photopolymerizable monomer may include ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like.

Commercially available examples of the photopolymerizable monomer are as follows. The mono-functional (meth) acrylic acid ester may include Aronix M-101®, M-111®, M-114® of Toagosei Chemistry Industry Co., Ltd.; KAYARAD TC-110S®, TC-120S® of Nippon Kayaku Co., Ltd.; V-158®, V-2311® of Osaka Organic Chemical Ind., Ltd., and the like. Examples of a difunctional (meth)acrylic acid ester may include Aronix M-210®, M-240®, M-6200® of Toagosei Chemistry Industry Co., Ltd., KAYARAD HDDA®, HX-220®, R-604® of Nippon Kayaku Co., Ltd., V-260®, V-312®, V-335 HP® of Osaka Organic Chemical Ind., Ltd., and the like. Examples of a tri-functional (meth) acrylic acid ester may include Aronix M-309®, M-400®, M-405®, M-450®, M-7100®, M-8030®, M-8060® of Toagosei Chemistry Industry Co., Ltd., KAYARAD TMPTA®, DPCA-20®, DPCA-30®, DPCA-60®, DPCA-120® of Nippon Kayaku Co., Ltd., V-295®, V-300®, V-360®, V-GPT®, V-3PA®, V-400® of Osaka Yuki Kayaku Kogyo Co. Ltd., and the like. These may be used alone or as a mixture of two or more.

The photopolymerizable monomer may be treated with acid anhydride to help improve developability.

The photopolymerizable monomer may be included in an amount of about 0.1 wt % to about 30 wt %, e.g., about 5 wt % to about 20 wt % based on the total weight of the photosensitive resin composition. When the photopolymerizable monomer is included within the above ranges, pattern characteristics and developability are improved when manufacturing a color filter.

(D) Photopolymerization Initiator

The photopolymerization initiator may include an acetophenone compound, a benzophenone compound, a thioxanthone compound, a benzoin compound, a triazine compound, an oxime compound, or the like.

Examples of the acetophenone compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloroacetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone compound may include benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone compound may include thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin compound may include benzoin, benzoin methyl ether, benzoin ethyl ether, benzoin isopropyl ether, benzoin isobutyl ether, benzyldimethylketal, and the like.

Examples of the triazine compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-trichloromethyl (piperonyl)-6-triazine, 2-4-trichloromethyl (4'-methoxystyryl)-6-triazine, and the like.

Examples of the oxime compound may include 2-(o-benzoyloxime)-1-[4-(phenylthio)phenyl]-1,2-octanedione, 1-(o-acetyloxime)-1-[9-ethyl-6-(2-methylbenzoyl)-9H-carbazol-3-yl]ethanone, and the like.

The photopolymerization initiator may include a carbazole compound, a diketone compound, a sulfonium borate compound, a diazo compound, an imidazole compound, a biimidazole compound, a fluorene compound, or the like, in addition to the compounds described above.

The photopolymerization initiator may be included in an amount of about 0.1 wt % to about 5 wt %, e.g., about 1 wt % to about 3 wt % based on the total weight of the photosensitive resin composition. When the photopolymerization initiator is included within the above ranges, photopolymerization may occur sufficiently during exposure in a pattern forming process for manufacturing a color filter, thereby improving sensitivity and improving transmittance.

(E) Solvent

The solvent may include a suitable solvent, e.g., alcohols such as methanol and ethanol; ethers such as dichloroethyl ether, n-butyl ether, diisoamyl ether, methylphenyl ether, tetrahydrofuran, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; hydroxyacetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2- methylethyl propionate, hydroxyethyl acetate, methyl 2-hydroxy-3-methylbutanoate, and the like; or ketonate esters such as ethyl pyruvate, and the like, and may be additionally N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like, and they may be used alone or as a mixture of two or more.

Considering miscibility and reactivity, the solvent may include glycol ethers such as ethylene glycol monoethyl ether, or the like; ethylene glycol alkylether acetates such as ethyl cellosolve acetate, or the like; esters such as 2-hydroxyethyl propionate, or the like; diethylene glycols such as diethylene glycol monomethyl ether, or the like; propylene glycol alkylether acetates such as propylene glycol monomethylether acetate, propylene glycol propylether acetate, or the like.

The solvent may be included in a balance amount, e.g., about 20 wt % to about 90 wt % based on the total weight of the photosensitive resin composition. When the solvent is included within the above range, the photosensitive resin composition may have excellent applicability, and excellent flatness may be maintained in a film having a thickness of 3 μm or more.

(F) Other Additives

In an implementation, the photosensitive resin composition may further include other additives, e.g., malonic acid; 3-amino-1,2-propanediol; a silane coupling agent including a vinyl group or a (meth)acryloxy group; a leveling agent; a fluorine surfactant; or a radical polymerization initiator, in order to help prevent stains or spots during the coating, to adjust leveling, or to prevent pattern residue due to non-development.

The photosensitive resin composition may further include an epoxy compound in order to help improve close-contacting properties with a substrate.

Examples of the epoxy compound may include a phenol novolac epoxy compound, a tetramethyl biphenyl epoxy compound, a bisphenol A epoxy compound, an alicyclic epoxy compound, or a combination thereof.

A use amount of the additive may be controlled depending on desired properties.

Another embodiment provides a color filter manufactured using the aforementioned photosensitive resin composition. A method of manufacturing the color filter is as follows.

The photosensitive resin composition for a color filter may be coated to have a thickness of about 3.1 μm to about 3.4 μm using an appropriate method such as a spin coating, a slit coating and the like, on a bare glass substrate or on a glass substrate on which a protective layer, $SiN_x$ is coated in a thickness of about 500 Å to about 1500 Å. After the coating, the composition may be irradiated with light to form a pattern for a color filter. After irradiation of the light, the coating layer may be treated with an alkali developing solution, and the non-irradiated region thereof may be dissolved, forming a pattern for a color filter. This process may be repeated depending on the desired number of R, G, and B colors, manufacturing a color filter having a desired pattern.

In addition, the image pattern acquired by the development may be cured through heat treatment, actinic ray irradiation, or the like, resultantly improving crack resistance, solvent resistance, or the like.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example 1: Bifunctional Group Asymmetric Core-Unsubstituted Shell Compound (1) Synthesis of Intermediate Compound 1-1

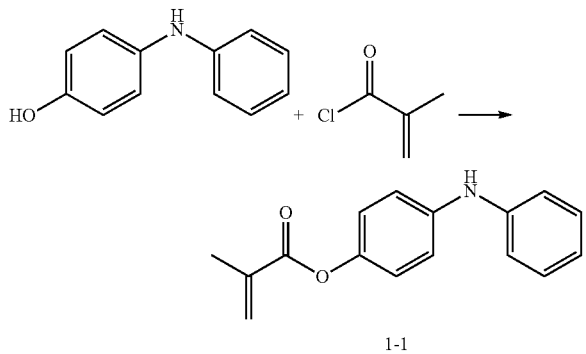

4-hydroxydiphenylamine (1.0 mmol), methacryloyl chloride (1.2 mmol), and triethylamine (2.0 mmol) were added to chloroform and then, reacted at 0° C. for 1 hour. After methylene chloride (MC) extraction, Compound 1-1 as an intermediate was obtained through silica chromatography.

(2) Synthesis of Intermediate Compound 1-2

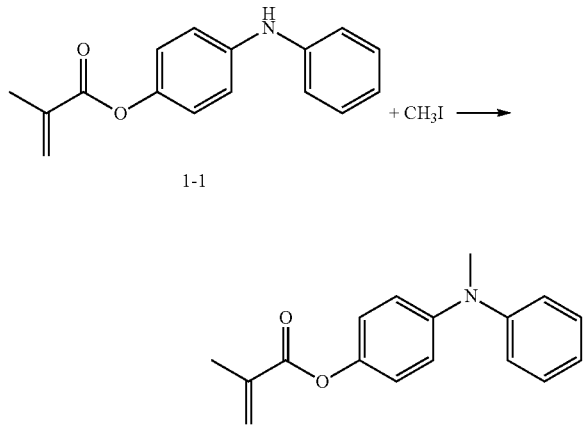

Compound 1-1 (1.0 mmol), iodomethane (1.0 mmol), and $K_2CO_3$ (2 mmol) were reacted in MC, obtaining Compound 1-2 as an intermediate.

(3) Synthesis of Intermediate Compound 1-3

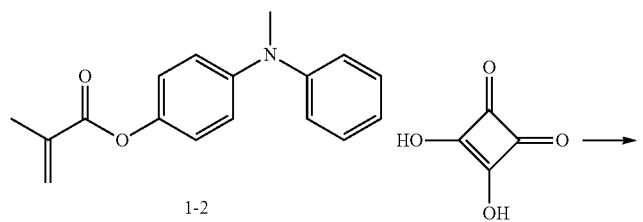

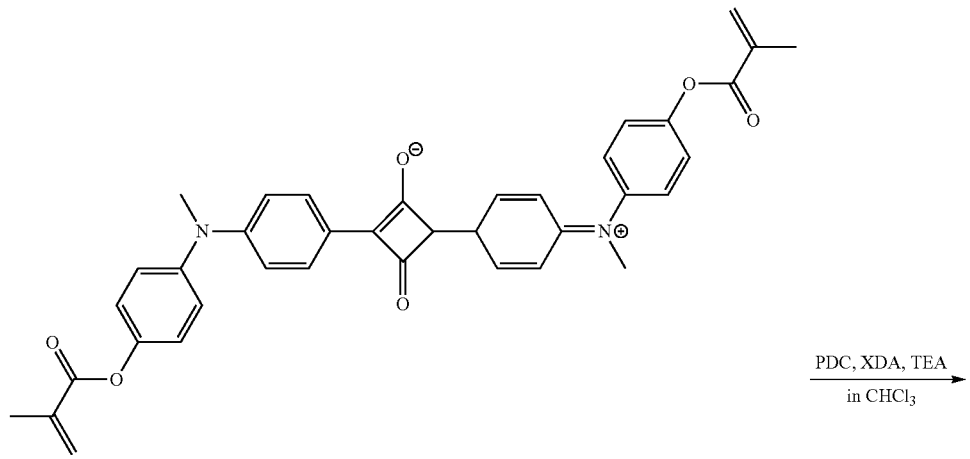

Compound 1-2 (1.0 mmol), 3,4-dihydroxy-3-cyclobutene-1,2-dione (0.5 mmol), and triethylorthoformate (TEOF) (0.15 mol) were added to amyl alcohol and then, heated at 90° C. and stirred for 7 hours. The amyl alcohol was removed through distillation under a reduced pressure and purified through column chromatography, obtaining Compound 1-3 as an intermediate.

(4) Synthesis of Intermediate Compound 1-4

-continued

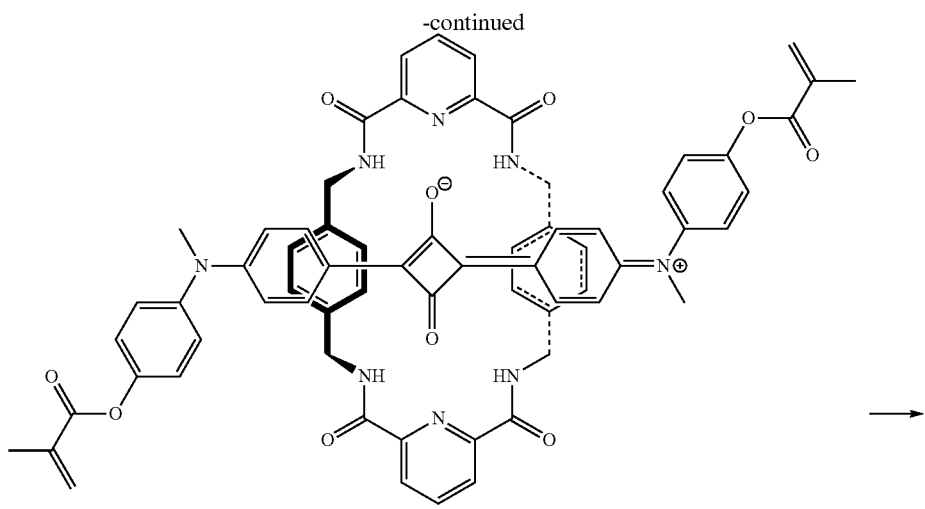

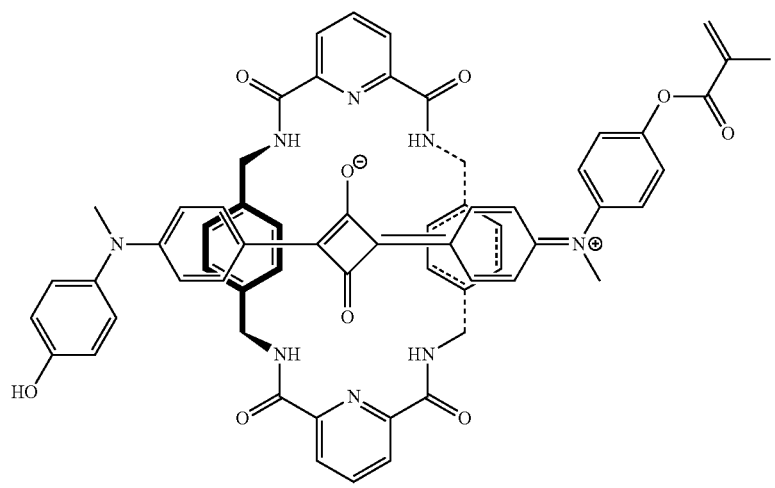

Compound 1-3 (5 mmol) was dissolved in 600 mL of chloroform, and then, pyridine-2,6-dicarbonyl dichloride (20 mmol) and p-xylylenediamine (20 mmol) were dissolved in 60 mL of chloroform and then, added dropwise thereto at ambient temperature for 5 hours. After distilling the mixture under a reduced pressure, the previous process was repeated three times.

Subsequently, hydrogen peroxide (3 eq) and trimethylamine (6 eq) were added thereto in-situ. After 30 minutes, the mixture was filtered to remove salt, and a product was obtained by separation through column chromatography by blowing off the solvent. Through this, Compound 1-4 was obtained as a final intermediate.

(5) Synthesis of Compound Represented by Chemical Formula 7-1-1
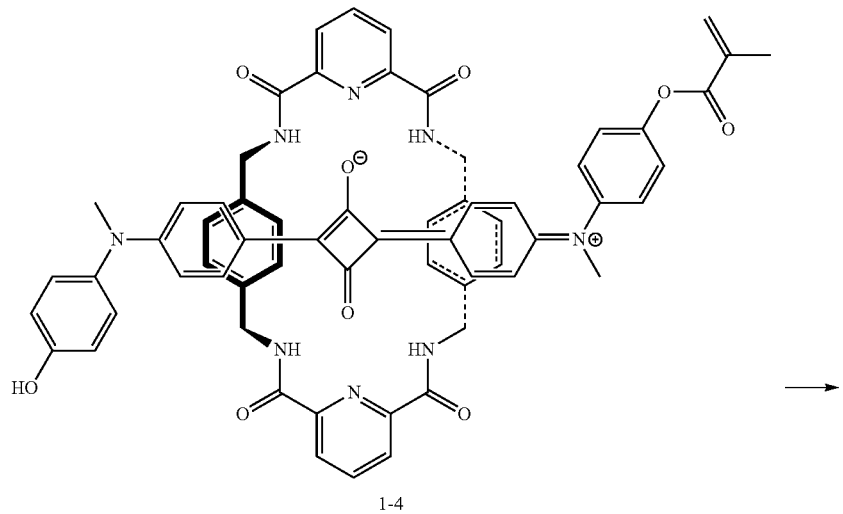
1-4
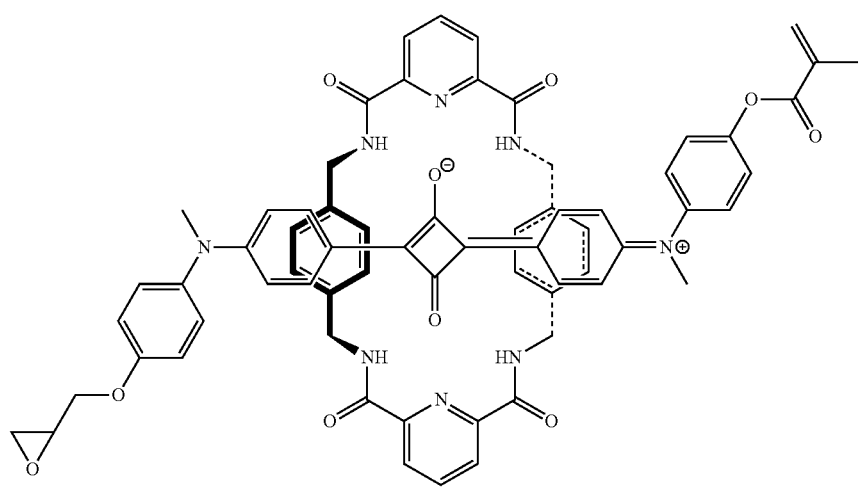
Compound 1-4 (1 mmol), epichlorohydrin (7 mmol), and KOH (3 mmol) were reacted in DMSO at 45° C. Subsequently, the resultant was distilled under a reduced pressure and separated through column chromatography, obtaining a compound represented by Chemical Formula 7-1-1.

[Chemical Formula 7-1-1]

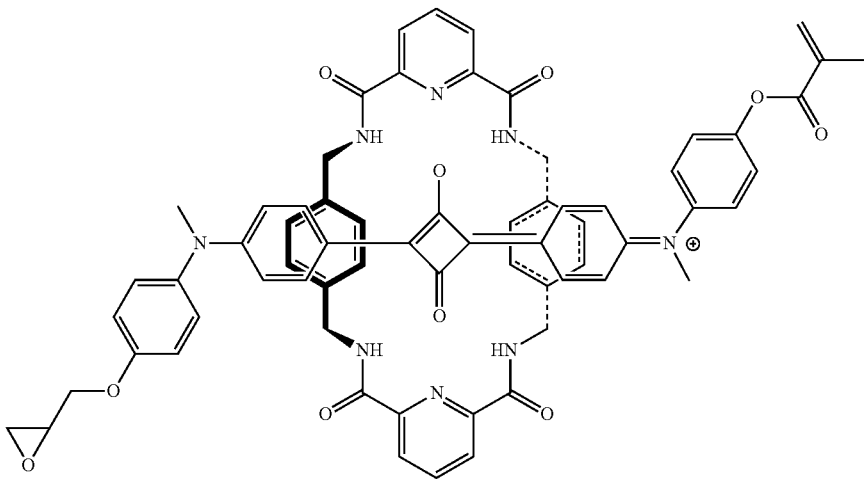

MALDI-TOF MS: 1135.25 m/z

Synthesis Example 2: Tetrafunctional Asymmetric Core-Unsubstituted Shell Compound

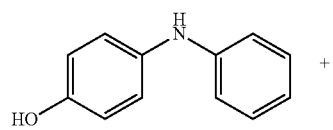

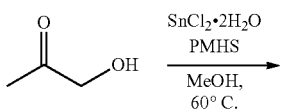

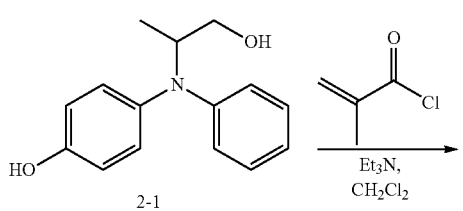

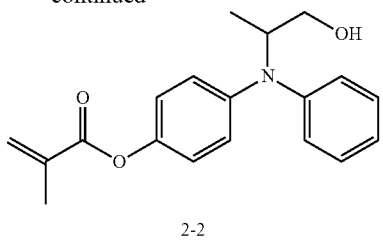

2-2

4-hydroxydiphenylamine (0.1 mol), hydroxyacetone (0.15 mol), $SnCl_2·2H_2O$ (0.02 mol), and poly(methylhyrdosiloxane) (0.2 mol) were added to methanol and then, heated at 60° C. and stirred for 10 hours. After removing a polymer produced therein through a filter and a portion of the methanol through distillation under a reduced pressure, a product from extraction with ethyl acetate was washed with 10% HCl and water. The extracted organic layer was distilled under a reduced pressure and purified through column chromatography, obtaining Compound 2-1 as an intermediate. Compound 2-1 (0.05 mol) and $Et_3N$ (0.11 mol) were added to MC, and after correcting the temperature to 0° C., methacryloyl chloride (1.05 mol) was slowly added thereto in a dropwise fashion and then, stirred for 2 hours. A product from extraction with MC was washed with water. The extracted organic layer was distilled under a reduced pressure and purified through column chromatography, obtaining Compound 2-2 as an intermediate.

Subsequently, a compound represented by Chemical Formula 7-2-2 was synthesized in the same manner as in Synthesis Example 1, except that Compound 2-2 was used instead of Compound 1-2.

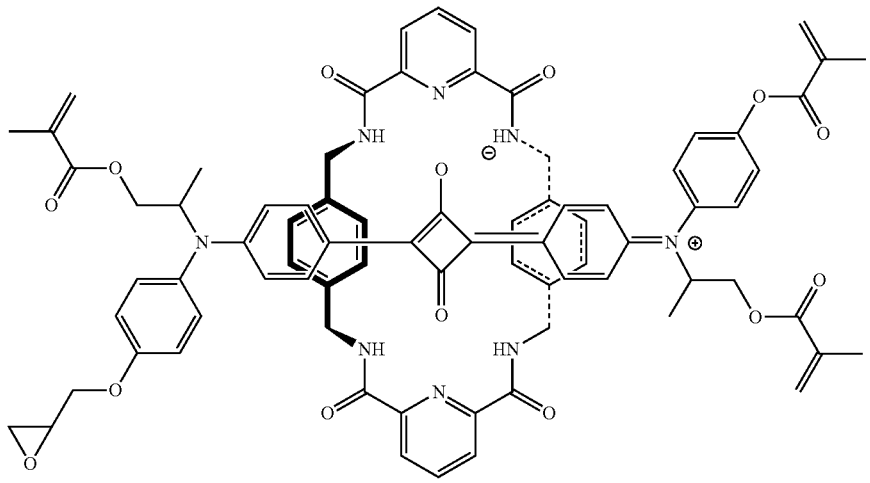
MALDI-TOF MS: 1359.5 m/z
Synthesis Example 3: Hexa-Functional Asymmetric Core-Unsubstituted Shell Compound
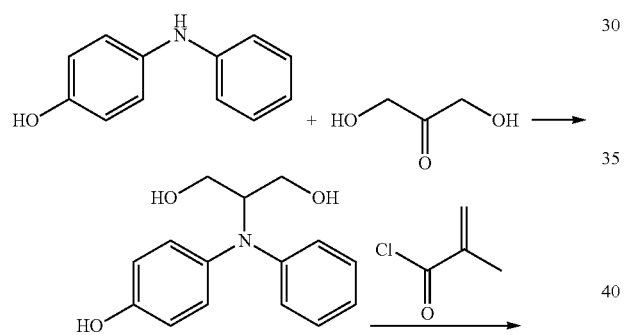
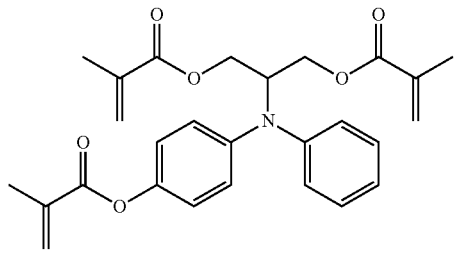
A compound represented by Chemical Formula 7-3-3 was synthesized in the same manner as in Synthesis Example 2, except that 1,3-dihydroxyacetone was used instead of the hydroxyacetone, as described above.
[Chemical Formula 7-3-2]
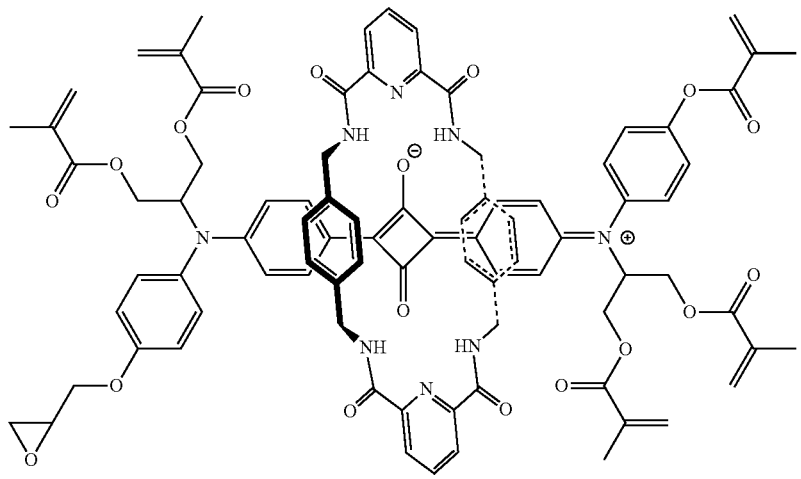
MALDI-TOF MS: 1525.68 m/z

Synthesis Example 4: Bifunctional Asymmetric Core-F Substituted Shell Compound

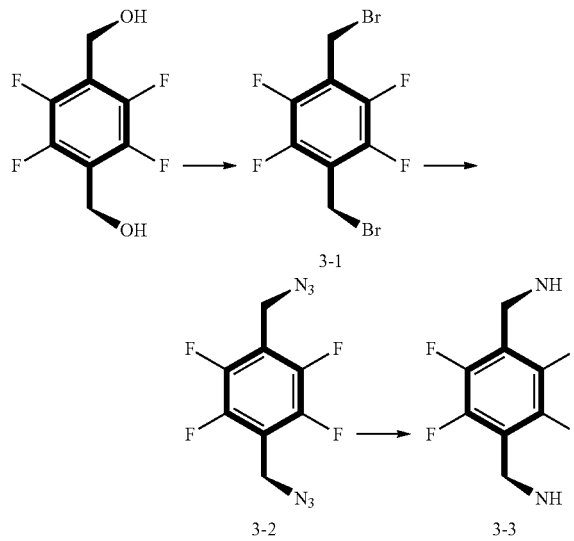

2,3,5,6-tetrafluoro-1,4-benzenedimethanol and $PBr_3$ were dissolved in DMF and then, reacted under a nitrogen atmosphere at 0° C. for 1 hour. After 3 hours at ambient temperature, Compound 3-1 as an intermediate was obtained by removing a solvent after MC extraction and then, performing silica column purification.

Compound 3-1 and $NaN_3$ were reacted in acetone under reflux for 7 hours. When a reaction was completed, Compound 3-2 as an intermediate was obtained by removing a solvent after ether extraction.

Compound 3-2 and $LiAlH_4$ were reacted in THF under a nitrogen atmosphere for 1 hour. When a reaction was completed, a filtrate therefrom was treated with MC extraction, and a solvent was removed therefrom, obtaining Compound 3-3 as an intermediate.

A compound represented by Chemical Formula 8-1-1 was synthesized in the same manner as in Synthesis Example 1, except that Compound 3-3 was used instead of the p-xylylenediamine.

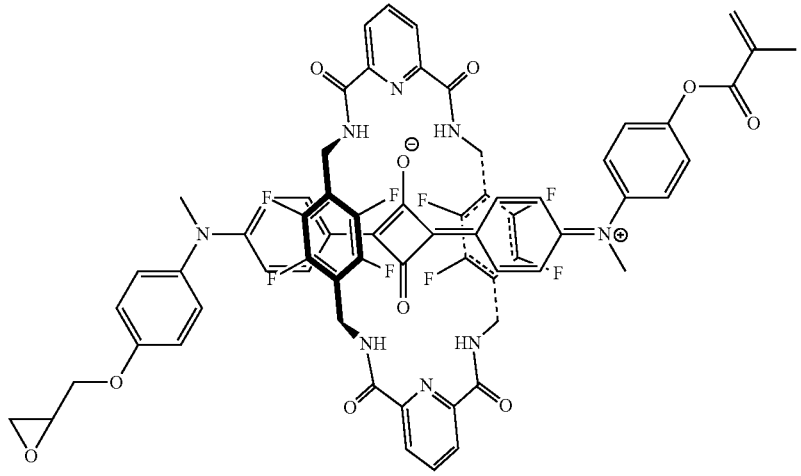

[Chemical Formula 8-1-1]

MALDI-TOF MS: 1279.17 m/z

Synthesis Example 5: Tetrafunctional Asymmetric Core-F Substituted Shell Compound A compound represented by Chemical Formula 8-2-2 was synthesized in the same manner as in Synthesis Example 2, except that Compound 3-3 was used instead of the p-xylylenediamine.

[Chemical Formula 8-2-2]

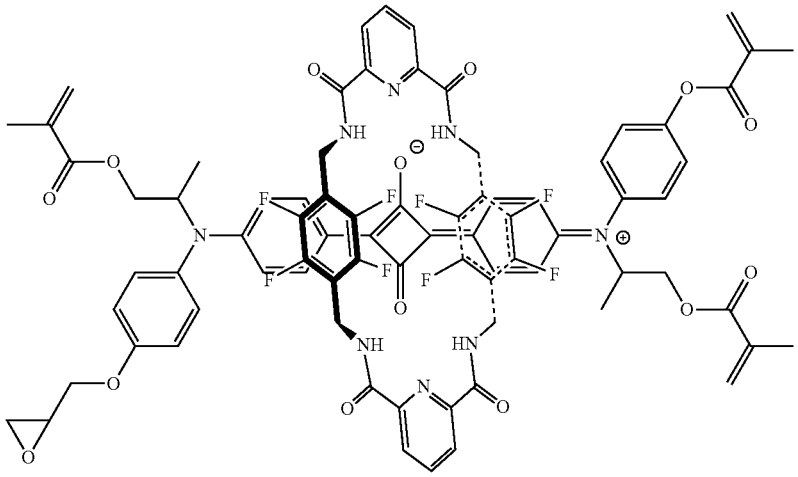

MALDI-TOF MS: 1503.43 m/z

Synthesis Example 6: Hexafunctional Asymmetric Core-F Substituted Shell Compound A compound represented by Chemical Formula 8-3-2 was synthesized in the same manner as in Synthesis Example 3, except that Compound 3-3 was used instead of the p-xylenediamine.

[Chemical Formula 8-3-2]

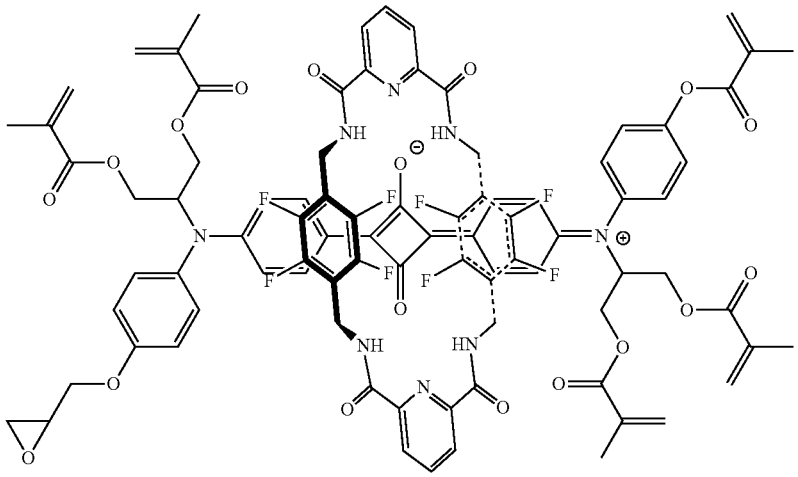

MALDI-TOF MS: 1669.6 m/z

Comparative Synthesis Example 1: Zero Functional Core-Unsubstituted Shell Compound (1) Synthesis of Zero Functional Core N,4-dimethyl-N-phenylbenzenamine (100 mmol) and 3,4-dihydroxy-cyclobut-3-ene-1,2-dione (50 mmol) were added to toluene (300 mL) and butanol (300 mL) and then, refluxed, and water produced therefrom was removed with a Dean-stark distillation device. The reactant was stirred for 12 hours, distilled under a reduced pressure, and purified through column chromatography, obtaining a zero functional core represented by the following chemical formula.

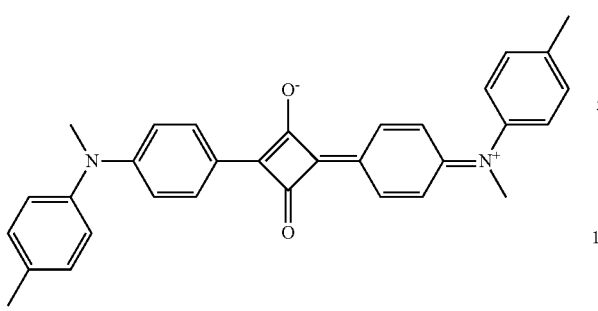

MALDI-TOF MS: 472.59 m/z

(2) Synthesis of Zero Functional Core-Unsubstituted Shell Dye

The zero functional core (5 mmol) was dissolved in 600 mL of chloroform, and pyridine-2,6-dicarbonyl dichloride (20 mmol) and p-xylylenediamine (20 mmol) were dissolved in 60 mL of chloroform and then, simultaneously added dropwise thereto at ambient temperature for 5 hours. Subsequently, after distilling the mixture under a reduced pressure, the previous process was repeated three times.

Subsequently, hydrogen peroxide (3 eq) and trimethylamine (6 eq) were added thereto in-situ. After 30 minutes, the mixture was filtered, and after removing a salt and blowing off a solvent, a product therein was separated through column chromatography.

As a result, a compound represented by the following chemical formula was obtained.

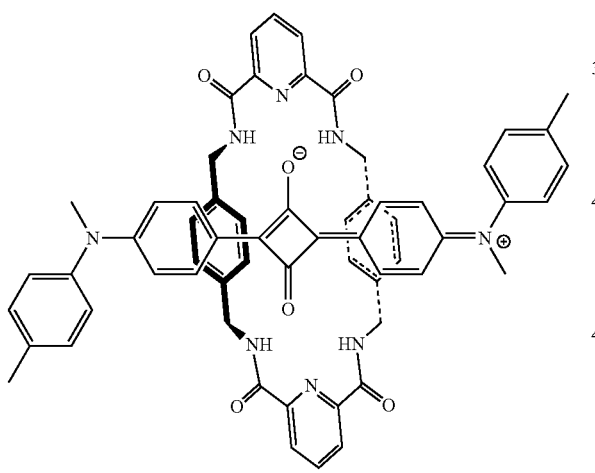

MALDI-TOF MS: 107.16 m/z

Comparative Synthesis Example 2: Bifunctional Symmetric Core (Epoxy)-Unsubstituted Shell Compound Compound B-2 as an intermediate was obtained in the same manner as in the synthesis method of Compound 1-2, except that 4-[[(1,1-dimethylethyl)dimethylsilyl]oxy]-N-phenylbenzenamine (Compound B-1) was used instead of Compound 1-1.

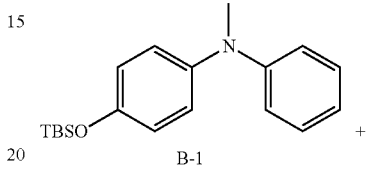

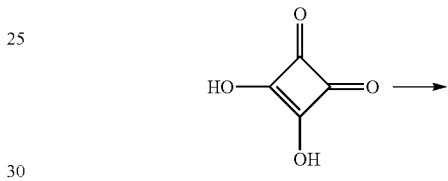

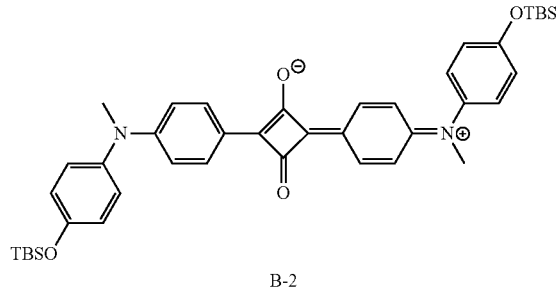

Compound B-1 (100 mmol) and 3,4-dihydroxy-cyclobut-3-ene-1,2-dione (50 mmol) were added to toluene (300 mL) and butanol (300 mL) and then, refluxed, and water produced therein was removed with a Dean-stark distillation device. The reactant was stirred for 12 hours, distilled under a reduced pressure, and purified through column chromatography, obtaining Compound B-2 as an intermediate.

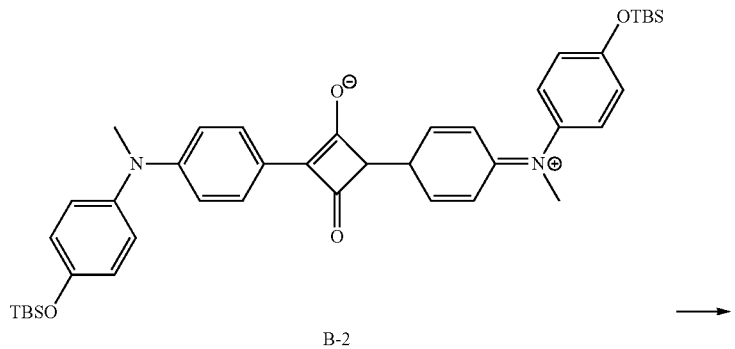

-continued

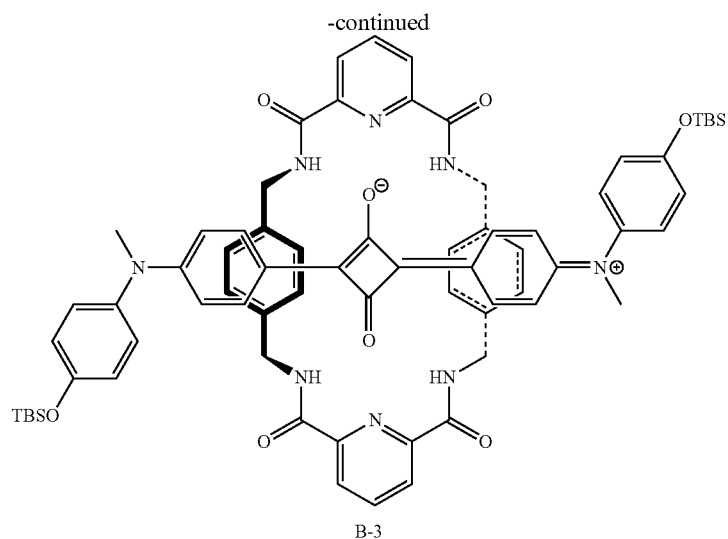

B-3

Compound B-2 (5 mmol) was dissolved in 600 mL of chloroform, and pyridine-2,6-dicarbonyl dichloride (20 mmol) and p-xylylenediamine (20 mmol) dissolved in 60 mL of chloroform were simultaneously added dropwise thereto at ambient temperature for 5 hours. After 12 hours, the mixture was distilled under a reduced pressure and separated through column chromatography, obtaining Compound B-3 as an intermediate.

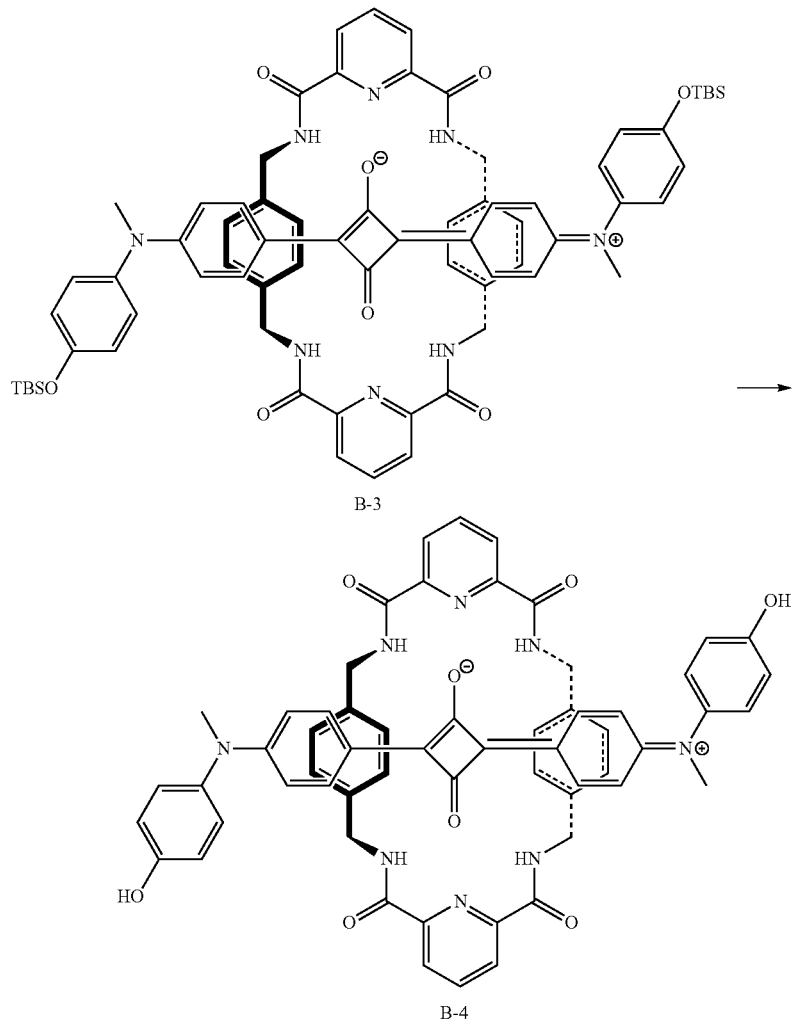

Compound B-3 (5 mmol) was dissolved in 50 mL of tetrahydrofuran, and tetrabutylammonium fluoride (11 mmol) was added thereto at ambient temperature. After 30 minutes, Compound B-4 was obtained by separation through column chromatography.

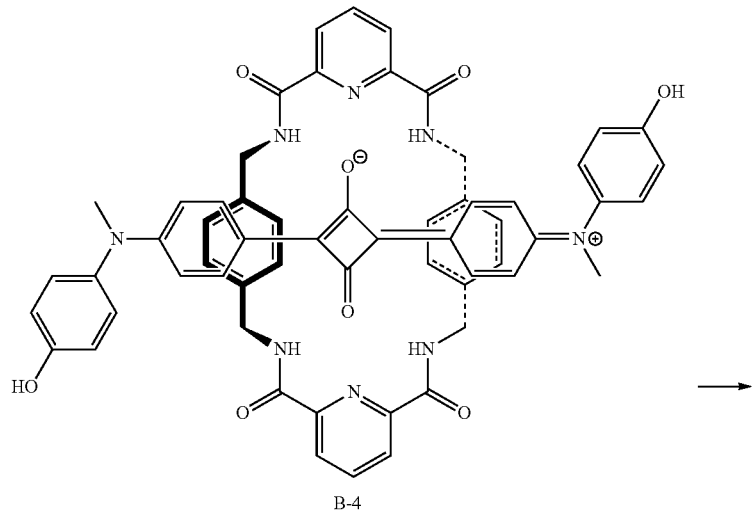

B-4

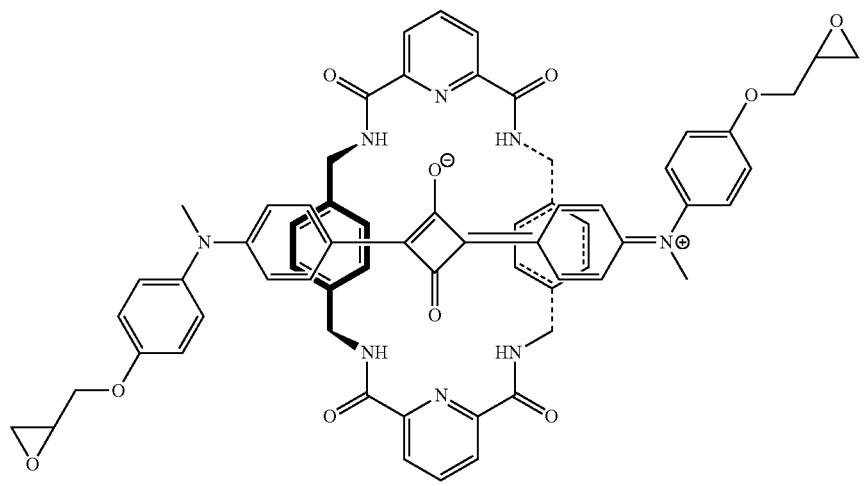

Compound B-4 (1 mmol), epichlorohydrin (14 mmol), and KOH (6 mmol) were reacted in DMSO at 45° C. Subsequently, the resultant was distilled under a reduced pressure and separated through column chromatography, obtaining the following compound.

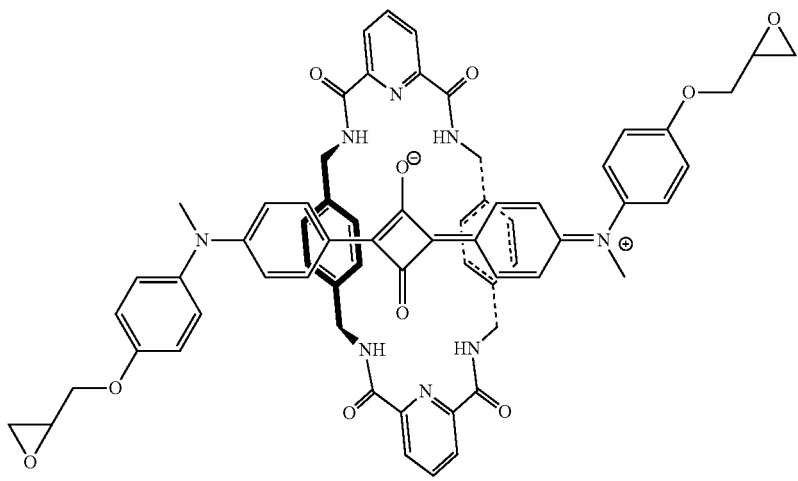
MALDI-TOF MS: 1123.24 m/z
Comparative Synthesis Example 3: Bifunctional Symmetric Core (Acrylate)-Unsubstituted Shell Compound
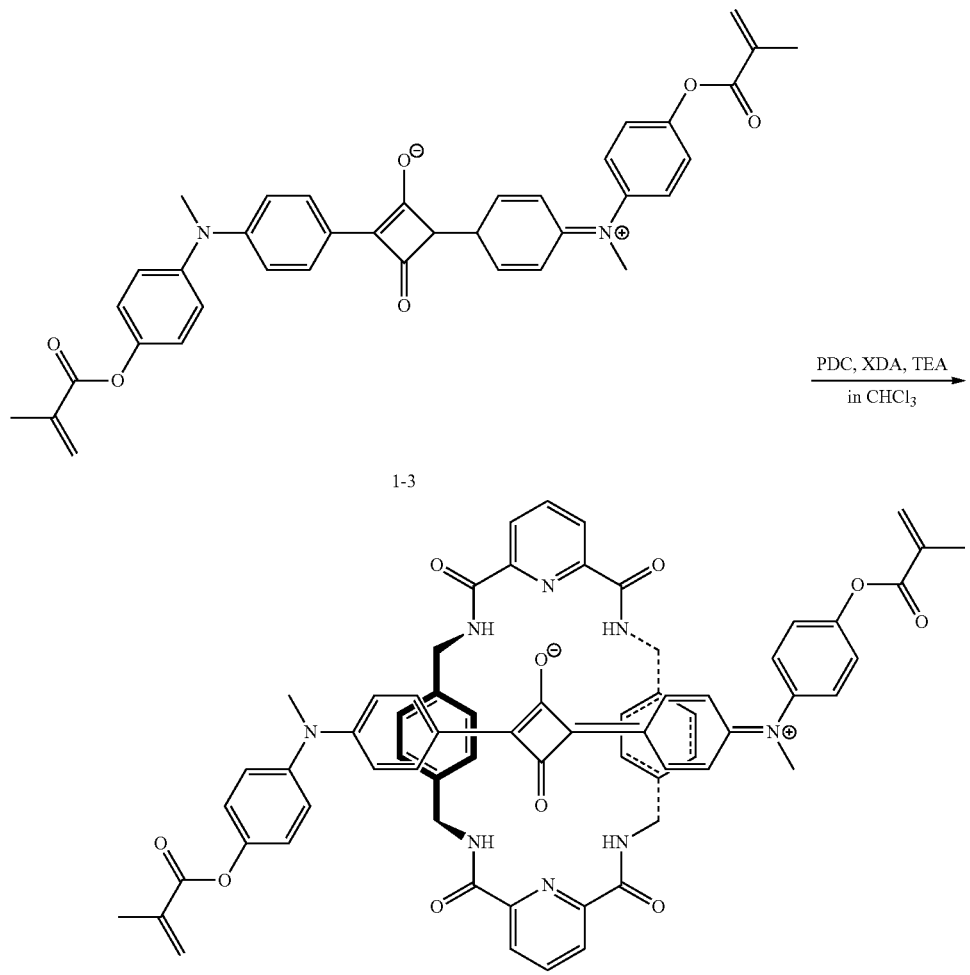

Compound 1-3 (5 mmol) was dissolved in 600 mL of chloroform, and then, pyridine-2,6-dicarbonyl dichloride (20 mmol) and p-xylylenediamine (20 mmol) were dissolved in 60 mL of chloroform and simultaneously added dropwise thereto at ambient temperature for 5 hours. After distilling the mixture under a reduced pressure, the previous process was repeated three times. Subsequently, a compound represented by the following chemical formula was obtained by purification through column chromatography.

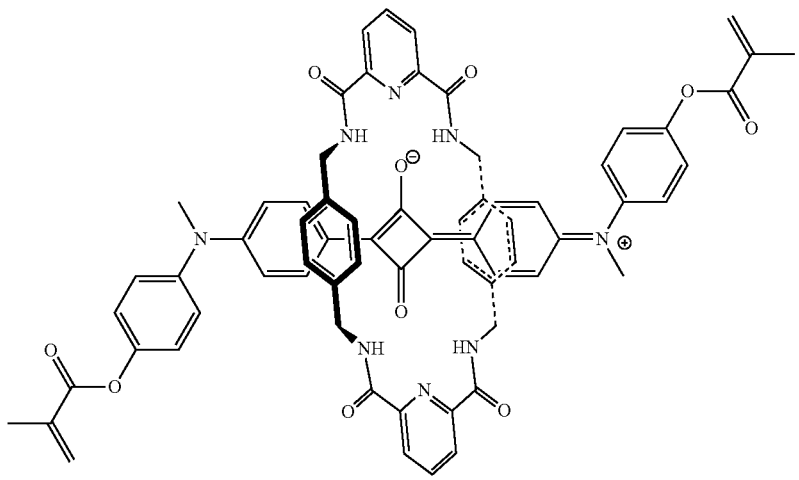

MALDI-TOF MS: 1147.26 m/z (Preparation of Photosensitive Resin Composition)

Photosensitive resin compositions were prepared using the following components.

(A) Dye
- (A-1) Core-shell dye prepared in Synthesis Example 1 (Chemical Formula 7-1-1)
- (A-2) Core-shell dye prepared in Synthesis Example 2 (Chemical Formula 7-2-2)
- (A-3) Core-shell dye prepared in Synthesis Example (Chemical Formula 7-3-2)
- (A-4) Core-shell dye prepared in Synthesis Example 4 (Chemical Formula 8-1-1)
- (A-5) Core-shell dye prepared in Synthesis Example 5 (Chemical Formula 8-2-2)
- (A-6) Core-shell dye prepared in Synthesis Example 6 (Chemical Formula 8-3-2)
- (A-7) Core-shell dye prepared in Comparative Synthesis Example 1
- (A-8) Core-shell dye prepared in Comparative Synthesis Example 2
- (A-9) Core-shell dye prepared in Comparative Synthesis Example 3
(A') Pigment Dispersion
- (A'-1) C.I. Green Pigment 7
- (A'-2) C.I. Green Pigment 36
(B) Binder Resin
  Methacrylic acid/benzyl methacrylate copolymer having a weight average molecular weight of 22,000 g/mol (a mixed weight ratio=15 wt %/85 wt %)
(C) Photopolymerizable Monomer
  Dipentaerythritol hexaacrylate
(D) Photopolymerization Initiator
- (D-1) 1,2-octanedione
- (D-2) 2-dimethylamino-2-(4-methyl-benzyl)-1-(4-morpholin-4-yl-phenyl)-butan-1-one (E) Solvent
- (E-1) cyclohexanone
- (E-2) propylene glycol methyletheracetate Examples 1 to 6 and Comparative Examples 1 to 3

Each of photosensitive resin compositions was prepared by mixing components in compositions shown in Tables 1 and 2. Specifically, a photopolymerization initiator was dissolved in a solvent and then, stirred for 2 hours at ambient temperature, a dye (or pigment dispersion) was added thereto and then, stirred for 30 minutes, and a binder resin and a photopolymerizable monomer were added thereto and then, stirred for 2 hours at ambient temperature. The obtained solution was filtered 3 times to remove impurities, preparing each photosensitive resin composition.

TABLE 1

(unit: wt %)

| | | Examples | | | | | |
|---|---|---|---|---|---|---|---|
| | | 1 | 2 | 3 | 4 | 5 | 6 |
| (A) dye | A-1 | 2 | — | — | — | — | — |
| | A-2 | — | 2 | — | — | — | — |
| | A-3 | — | — | 2 | — | — | — |
| | A-4 | — | — | — | 2 | — | — |
| | A-5 | — | — | — | — | 2 | — |
| | A-6 | — | — | — | — | — | 2 |
| (A') pigment dispersion | A'-1 | — | — | — | — | — | — |
| | A'-2 | — | — | — | — | — | — |
| (B) binder resin | | 3.5 | 3.5 | 3.5 | 3.5 | 3.5 | 3.5 |
| (C) photopolymerizable monomer | | 8 | 8 | 8 | 8 | 8 | 8 |
| (D) photopolymerization initiator | D-1 | 1 | 1 | 1 | 1 | 1 | 1 |
| | D-2 | 0.5 | 0.5 | 0.5 | 0.5 | 0.5 | 0.5 |
| (E) solvent | E-1 | 40 | 40 | 40 | 40 | 40 | 40 |
| | E-2 | 45 | 45 | 45 | 45 | 45 | 45 |
| Total | | 100 | 100 | 100 | 100 | 100 | 100 |

TABLE 2

(unit: wt %)

|  |  | Comparative Examples | | |
|---|---|---|---|---|
|  |  | 1 | 2 | 3 |
| (A) dye | A-7 | 2 | — | — |
|  | A-8 | — | 2 | — |
|  | A-9 | — | — | 2 |
| (A) pigment dispersion | A'-1 | — | — | — |
|  | A'-2 | — | — | — |
| (B) binder resin |  | 3.5 | 3.5 | 3.5 |
| (C) photopolymerizable monomer |  | 8 | 8 | 8 |
| (D) photopolymerization initiator | D-1 | 1 | 1 | 1 |
|  | D-2 | 0.5 | 0.5 | 0.5 |
| (E) solvent | E-1 | 40 | 40 | 40 |
|  | E-2 | 45 | 45 | 45 |
| Total |  | 100 | 100 | 100 |

EVALUATIONS

Evaluation 1: Evaluation of Chemical Resistance and Wavelength Matching Properties The photosensitive resin compositions according to Examples 1 to 6 and Comparative Examples 1 to 3 were respectively used to manufacture a color filter specimen.

Specifically, each photosensitive resin composition was applied to be 1 μm to 3 μm thick on a 1 mm-thick degreased glass substrate and dried on a 90° C. hot plate for 2 minutes, obtaining films.

Each color filter specimen was examined with respect to wavelength matching properties through a maximum absorption wavelength (λmax). Specifically, a UV-Vis-NIR spectrometer (UV-3600 Plus, Shimadzu Scientific instruments) was used to confirm the maximum absorption wavelength (λmax) of each color filter specimen and simultaneously, measure absorbance intensity at the wavelength (absorbance intensity before immersion in a solution).

The color filter specimens were evaluated with respect to chemical resistance by immersing each color filter specimen in a PGMEA solution at ambient temperature for 10 minutes and measuring absorption intensity (absorption intensity after the solution immersion) at a maximum absorption wavelength (λmax) in the aforementioned method.

The chemical resistance was quantified by putting the absorption intensity of each color filter specimen before and after the solution immersion, and calculated according to Equation 1, and the results are shown in Table 3.

Chemical resistance={1−(absorption intensity after solution immersion)/(absorption intensity before solution immersion)}×100%  [Equation 1]

TABLE 3

|  | Chemical resistance | Maximum absorption wavelength (wavelength matching properties) |
|---|---|---|
| Example 1 | 3.0% | 649 nm |
| Example 2 | 2.8% | 652 nm |
| Example 3 | 2.6% | 651 nm |
| Example 4 | 3.0% | 669 nm |
| Example 5 | 2.8% | 671 nm |
| Example 6 | 2.6% | 672 nm |
| Comparative Example 1 | 92% | 630 nm |
| Comparative Example 2 | 3.1% | 632 nm |
| Comparative Example 3 | 91% | 651 nm |

Referring to Table 3, the core-shell dyes of Examples 1 to 6 exhibited greatly improved chemical resistance and wavelength matching properties, compared with the core-shell dyes of Comparative Examples 1 to 3.

Specifically, each core-shell dye of Comparative Examples 1 and 3 had a core including no epoxy group at the terminal end and exhibited significantly inferior chemical resistance.

Each of the core-shell dyes according to Examples 1 to 6 and Comparative Example 2 had a core including an epoxy group and thus exhibited improved chemical resistance, compared with each of the core-shell dyes according to Comparative Examples 1 and 3.

Each of the core-shell dyes according to Comparative Examples 1 and 2 had a core including no (meth)acrylate group at the terminal end and exhibited a maximum absorption peak around about 630 nm.

Each of the core-shell dyes according to Examples 1 to 3 and Comparative Example 3 had a core including a (meth)acrylate group and thus exhibited a maximum absorption peak around about 650 nm, unlike Comparative Examples 1 and 2.

Comparing Examples 1 to 3 and Examples 4 to 6, the core introduced a halogen group into the shell and thus shifted a maximum absorption peak toward a long wavelength region by about 20 nm and realized excellent matching properties into a green wavelength band.

However, the introduction of the halogen group into the shell was optional.

Evaluation 2: Evaluation of Durability

Each color filter specimen according to Examples 1 to 6 and Comparative Examples 1 to 3 was manufactured in the same manner as in Evaluation 1.

Specifically, each of the photosensitive resin compositions was coated to be 1 μm to 3 μm thick on a 1 mm-thick degreased glass substrate and dried on a 90° C. hot plate for 2 minutes, obtaining films.

Each of the films was exposed by using a high-pressure mercury lamp with a main wavelength of 365 nm and dried in a 200° C. oven for 20 minutes and then, measured with respect to color coordinate changes by using a spectrophotometer (MCPD3000, Otsuka Electronics Co., Ltd.) to examine durability, and the results are shown in Table 4.

Durability Evaluation Criteria
  Good: The color coordinate change value is less than or equal to 0.005
  Inferior: The color coordinate change value exceeds 0.005

TABLE 4

|  | Durability |
|---|---|
| Example 1 | good |
| Example 2 | good |
| Example 3 | good |
| Example 4 | good |
| Example 5 | good |
| Example 6 | good |
| Comparative Example 1 | inferior |
| Comparative Example 2 | inferior |
| Comparative Example 3 | inferior |

Referring to Table 4, the core-shell dyes of Examples 1 to 6 exhibited improved durability compared with the ones of Comparative Examples 1 to 3.

Evaluation 3: Evaluation of Luminance

Each of the color filter specimens according to Examples 1 to 6 and Comparative Examples 1 to 3 was manufactured in the same manner in Evaluation 1.

Specifically, the films were obtained by coating each photosensitive resin composition to be 1 μm to 3 μm thick on a 1 mm-thick degreased glass substrate and drying it on a 90° C. hot plate for 2 minutes.

Each of the films was exposed by using a high-pressure mercury lamp with a main wavelength of 365 nm and dried in a 200° C. forced convection for 5 minutes. The pixel layers were measured with respect to luminance by using a spectrophotometer (MCPD3000, Otsuka Electronics Co., Ltd.), and the results are shown in Table 5.

TABLE 5

|  | Luminance |
| --- | --- |
| Example 1 | 67.2 |
| Example 2 | 67.1 |
| Example 3 | 67.3 |
| Example 4 | 67.2 |
| Example 5 | 67.4 |
| Example 6 | 67.5 |
| Comparative Example 1 | 64.7 |
| Comparative Example 2 | 64.5 |
| Comparative Example 3 | 65.3 |

Referring to Table 5, the core-shell dyes of Examples 1 to 6 exhibited improved luminance, compared with Comparative Examples 1 to 3.

The core-shell dyes of Examples 1 to 6 exhibited improved luminance, e.g., by improving chemical resistance and durability, when applied to a color filter.

By way of summation and review, a pigment dispersion method may be one method of manufacturing the color filter. When the pigment dispersion method is used to manufacture a color filter, there may be limits to luminance and a contrast ratio, which could be due to a size of pigment particles. A color imaging device for an image sensor may use a smaller dispersed particle size to form a fine pattern.

A method of using a dye that does not form particles (instead of the pigment) to manufacture a color filter may be considered. The dye could have inferior chemical resistance, wavelength matching properties, patternability, or the like, relative to those of the pigment.

One or more embodiments may provide a core-shell dye capable of forming a fine pattern even if an amount applied to the resin composition is reduced while exhibiting excellent properties, e.g., chemical resistance, wavelength matching properties, patternability, and durability.

The core-shell dye according to the embodiment may exhibit improved properties such as chemical resistance, patternability, and durability by itself, and may have improved matching properties into a green wavelength band.

The photosensitive resin composition including the core-shell dye may form a fine pattern, even if the dye content is reduced, and the deterioration of chemical resistance after curing and thermal processing may be suppressed, so that a green color filter for a CMOS image sensor may be economically provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A core-shell dye, comprising:

a core represented by Chemical Formula 1; and a shell represented by Chemical Formula 2, the shell surrounding the core,

[Chemical Formula 1]

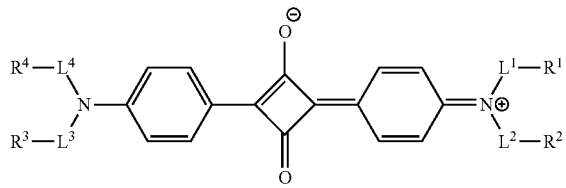

wherein:

in Chemical Formula 1, $L^1$ to $L^4$ are each independently a single bond, a substituted or unsubstituted C1 to C20 alkylene group, or a substituted or unsubstituted C6 to C30 arylene group; and $R^1$ to $R^4$ are each independently hydrogen, a substituted or unsubstituted C1 to C20 alkyl group, a substituted or unsubstituted C3 to C20 cycloalkyl group, or a substituted or unsubstituted C6 to C30 aryl group;

provided that at least one of $R^1$ and $R^2$ is substituted with a substituted or unsubstituted epoxy group at a terminal end and at least one of $R^3$ and $R^4$ is substituted with a substituted or unsubstituted (meth)acrylate group at a terminal end;

[Chemical Formula 2]

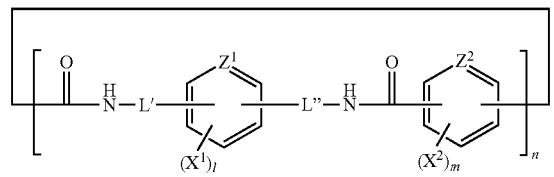

in Chemical Formula 2,

L' and L" are each independently a single bond or a substituted or unsubstituted C1 to C10 alkylene group;

$Z^1$ and $Z^2$ are each independently *—CR—* or a nitrogen atom, in which R is a hydrogen atom or a substituted or unsubstituted C1 to C10 alkyl group;

$X^1$ and $X^2$ are each independently a halogen or a substituted or unsubstituted C1 to C20 alkyl group;

l and m are each independently an integer of 0 to 4; and n is an integer of 2 or more.

2. The core-shell dye as claimed in claim 1, wherein:
R$^1$ is an epoxy group represented by Chemical Formula 4,
R$^3$ is a (meth)acrylate group represented by Chemical Formula 3,

[Chemical Formula 3]

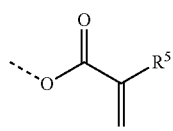

in Chemical Formula 3, R$^5$ is a hydrogen atom or a substituted or unsubstituted C1 to C10 alkyl group;

[Chemical Formula 4]

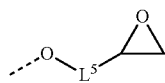

in Chemical Formula 4, L$^5$ is a single bond or a substituted or unsubstituted C1 to C10 alkylene group.

3. The core-shell dye as claimed in claim 1, wherein L$^1$ and L$^3$ are each independently a C6 to C30 arylene group.

4. The core-shell dye as claimed in claim 1, wherein:
R$^2$ and R$^4$ are each independently a substituted or unsubstituted C1 to C20 alkyl group, a substituted or unsubstituted C3 to C20 cycloalkyl group, a group represented by Chemical Formula 5-1, or a group represented by Chemical Formula 5-2,

[Chemical Formula 5-1]

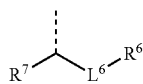

[Chemical Formula 5-2]

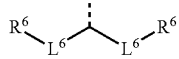

in Chemical Formulas 5-1 and 5-2,
each L$^6$ is independently a single bond or a substituted or unsubstituted C1 to C10 alkylene group;
each R$^6$ is independently a group represented by a Chemical Formula 6 or a substituted or unsubstituted (meth) acrylate group; and
R$^7$ is a substituted or unsubstituted C1 to C20 alkyl group or a substituted or unsubstituted C3 to C20 cycloalkyl group;

[Chemical Formula 6]

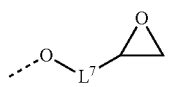

in Chemical Formula 6, L$^7$ is a single bond or a substituted or unsubstituted C1 to C10 alkylene group.

5. The core-shell dye as claimed in claim 1, wherein both L$^2$ and L$^4$ are a single bond.

6. The core-shell dye as claimed in claim 1, wherein
the core represented by Chemical Formula 1 is represented by one of Chemical Formulas 1-1 to 1-3,

[Chemical Formula 1-1]

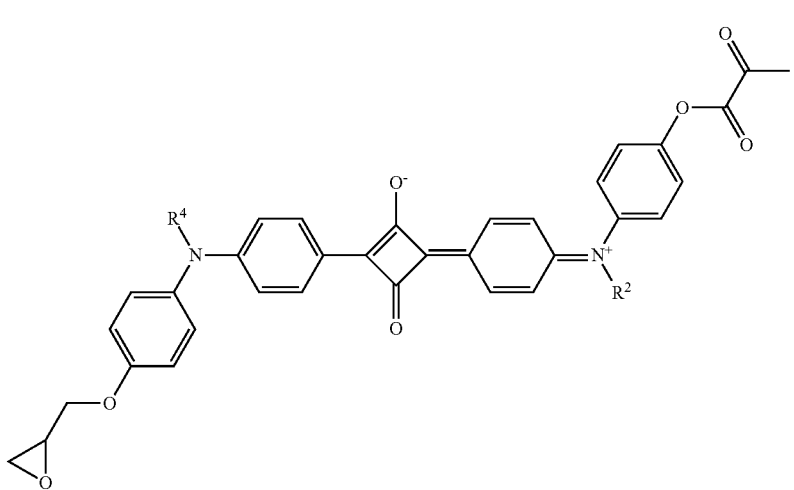

[Chemical Formula 1-2]

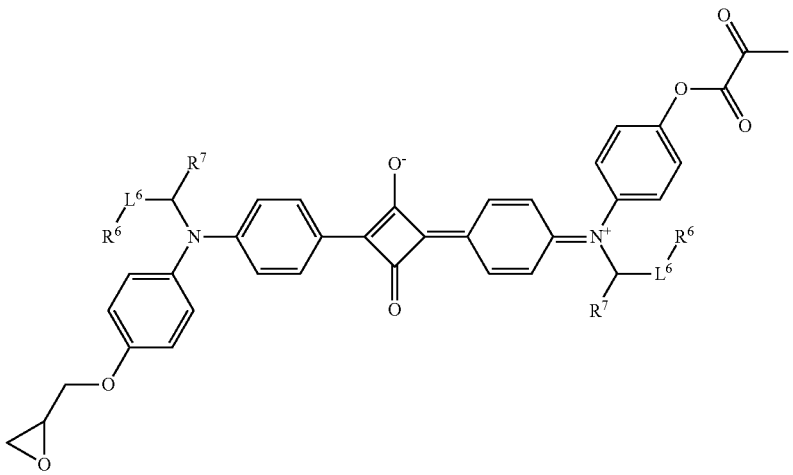

[Chemical Formula 1-3]

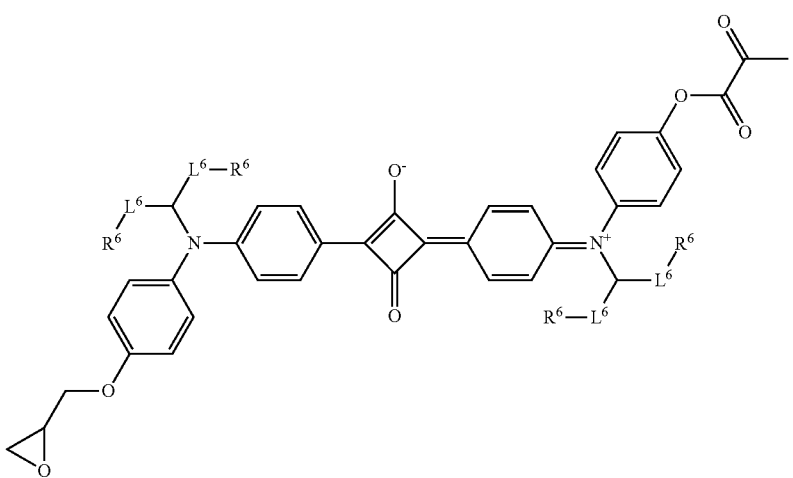

in Chemical Formulas 1-1 to 1-3, each $L_6$ is independently a single bond or a substituted or unsubstituted C1 to C10 alkylene group;

$R^2$, $R^4$, and $R^7$ are each independently a substituted or unsubstituted C1 to C20 alkyl group or a substituted or unsubstituted C3 to C20 cycloalkyl group; and each $R^6$ is independently a group represented by a Chemical Formula 6 or a substituted or unsubstituted (meth)acrylate group;

[Chemical Formula 6]

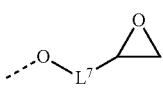

in Chemical Formula 6, $L^7$ is a single bond or a substituted or unsubstituted C1 to C10 alkylene group.

7. The core-shell dye as claimed in claim 1, wherein the core represented by Chemical Formula 1 is represented by one of the following Chemical Formulae,

[Chemical Formula 1-1-1]
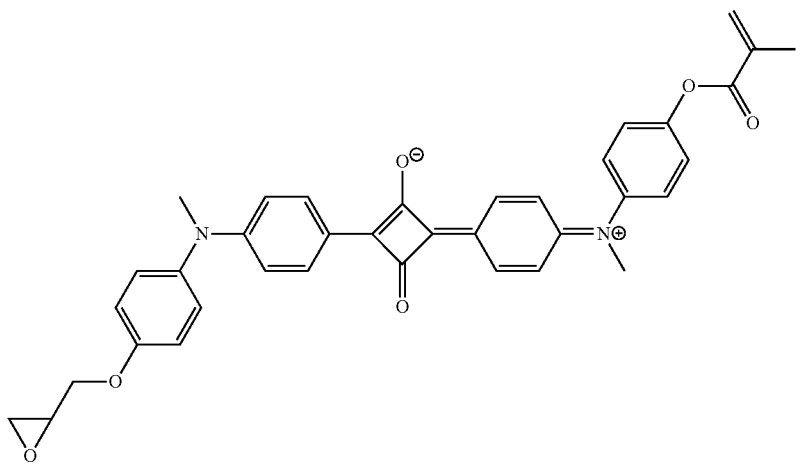
[Chemical Formula 1-1-2]
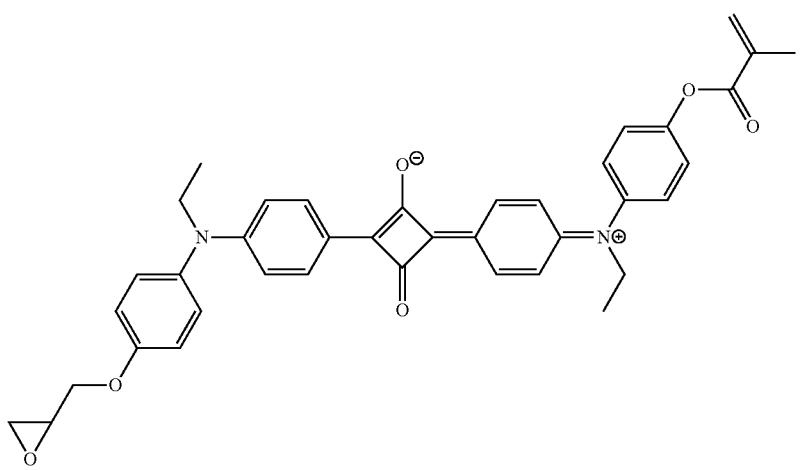
[Chemical Formula 1-1-3]
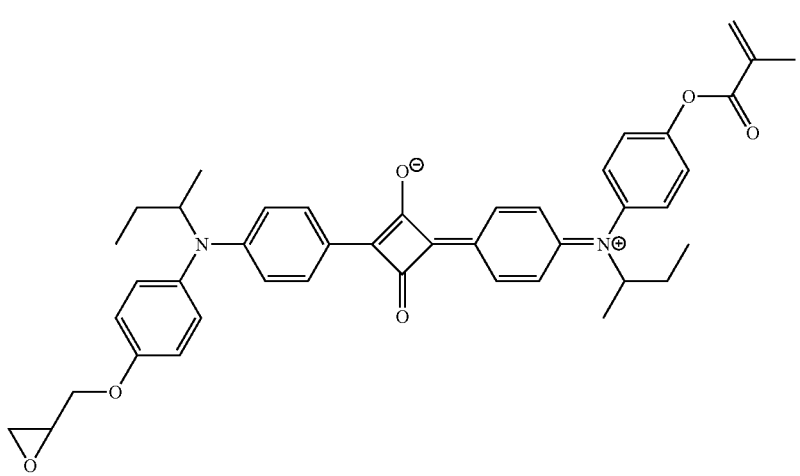

[Chemical Formula 1-1-4]
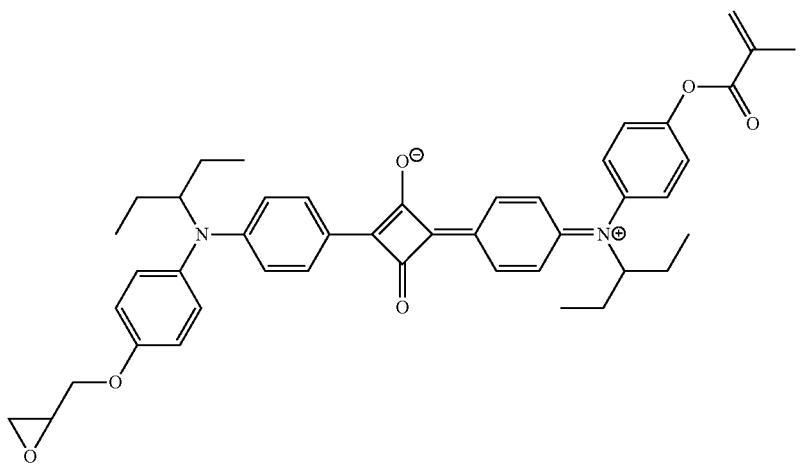
[Chemical Formula 1-1-5]
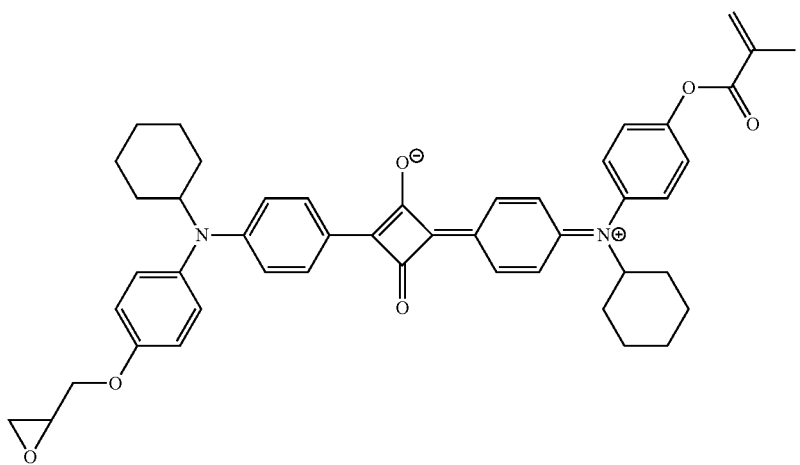
[Chemical Formula 1-2-1]
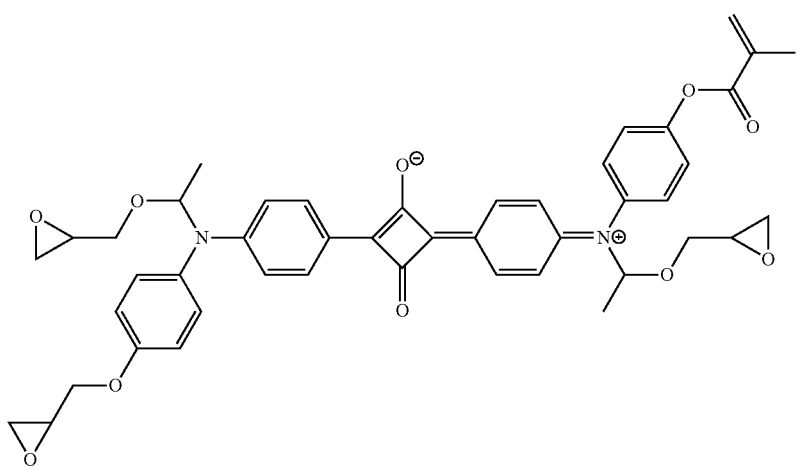

[Chemical Formula 1-2-2]
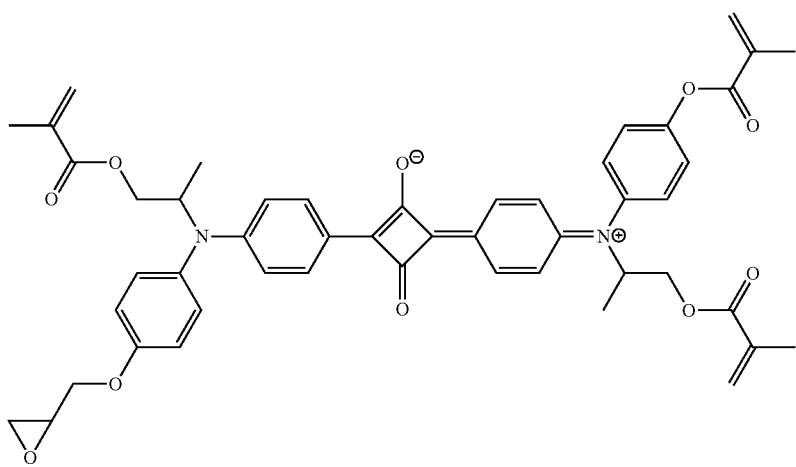
[Chemical Formula 1-3-1]
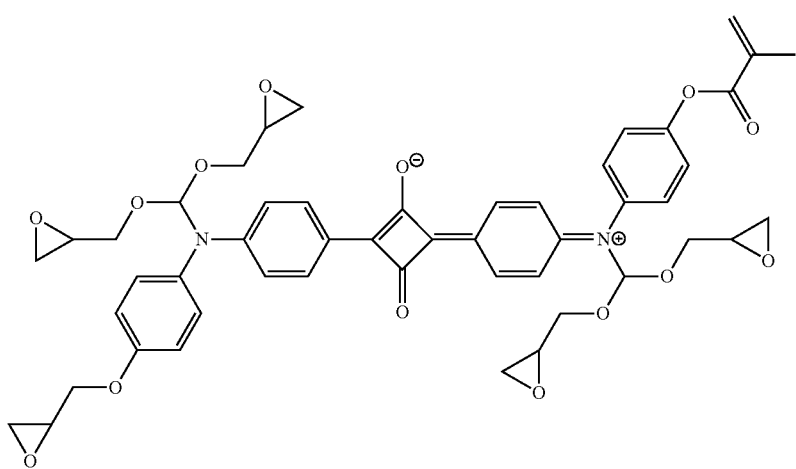
[Chemical Formula 1-3-2]
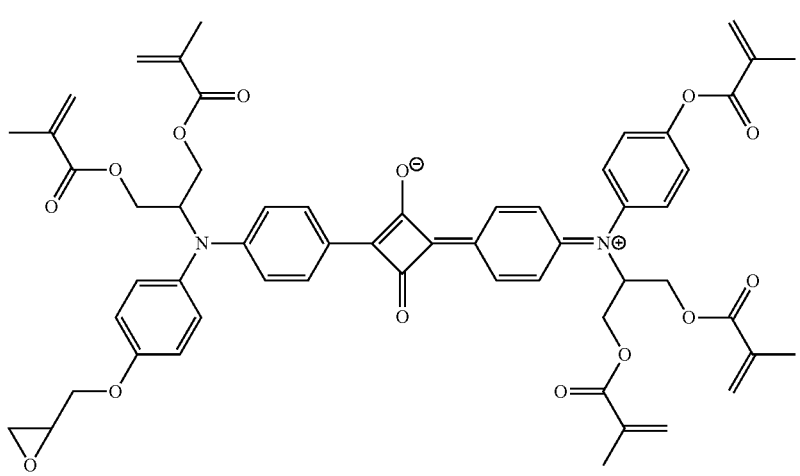

8. The core-shell dye as claimed in claim 1, wherein:
one of $Z^1$ or $Z^2$ is *—CH—* or a nitrogen atom, and the other one of $Z^1$ or $Z^2$ is *—CH—*.

9. The core-shell dye as claimed in claim 1, wherein: $X^1$ and $X^2$ are each independently a halogen atom, and l+m is an integer of 1 to 4.

10. The core-shell dye as claimed in claim 1, wherein L' and L" are each independently a substituted or unsubstituted C1 to C10 alkylene group.

11. The core-shell dye as claimed in claim 1, wherein n is 2.

12. The core-shell dye as claimed in claim 1, wherein:
the shell represented by Chemical Formula 2 is represented by Chemical Formula 2-1 or Chemical Formula 2-2,

[Chemical Formula 2-1]

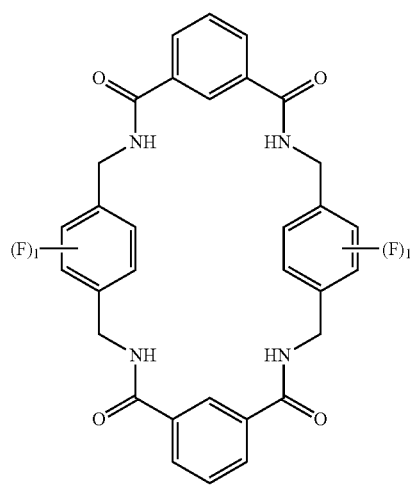

[Chemical Formula 2-2]

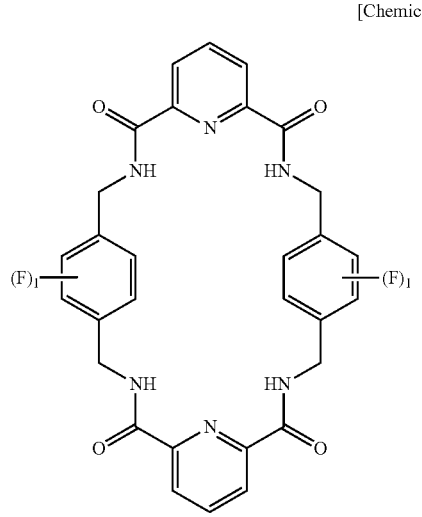

in Chemical Formulas 1-1 and 1-2, l is an integer of 0 to 4.

13. The core-shell dye as claimed in claim 1, wherein:
the shell represented by Chemical Formula 2 is represented by Chemical Formula 2-1-1, Chemical Formula 2-1-2, Chemical Formula 2-2-1, or Chemical Formula 2-2-2,

[Chemical Formula 2-1-1]

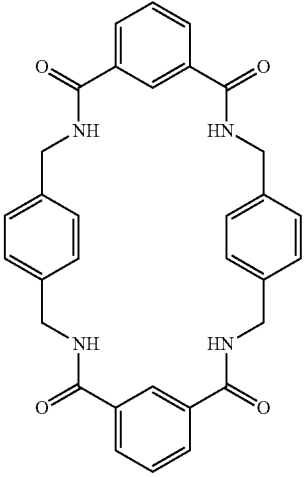

[Chemical Formula 2-1-2]

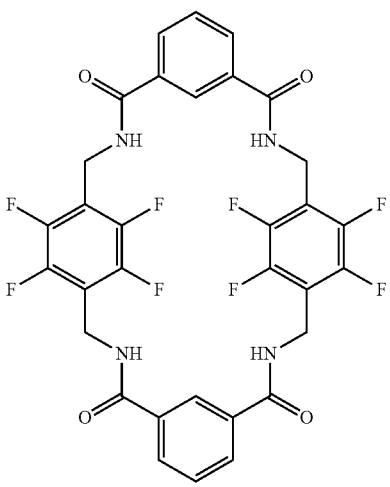

[Chemical Formula 2-2-1]

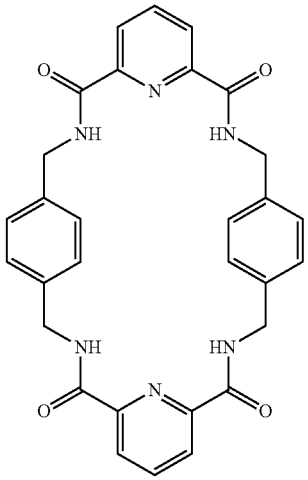

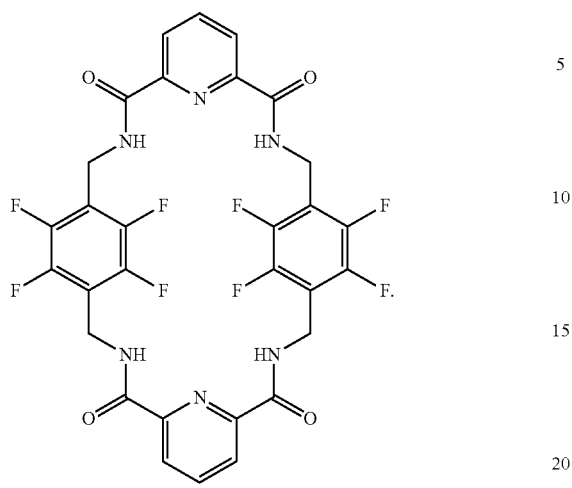
14. The core-shell dye as claimed in claim 1, wherein the core-shell dye includes the core and the shell in a mole ratio of 1:1.
15. The core-shell dye as claimed in claim 1, wherein the core-shell dye is represented by one of the following Chemical Formulae,
[Chemical Formula 7-1-1]
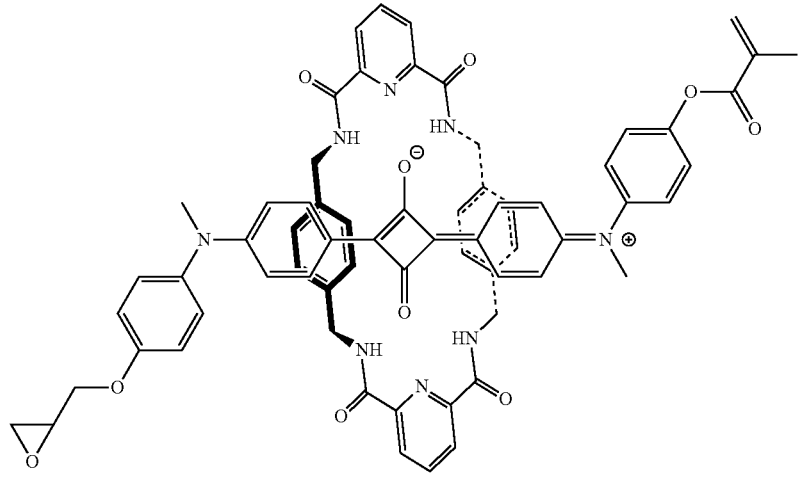
[Chemical Formula 7-1-2]
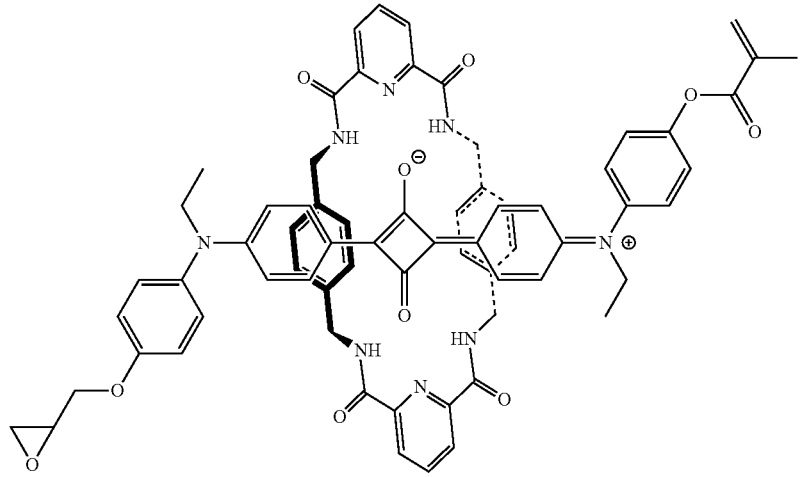

[Chemical Formula 7-1-3]
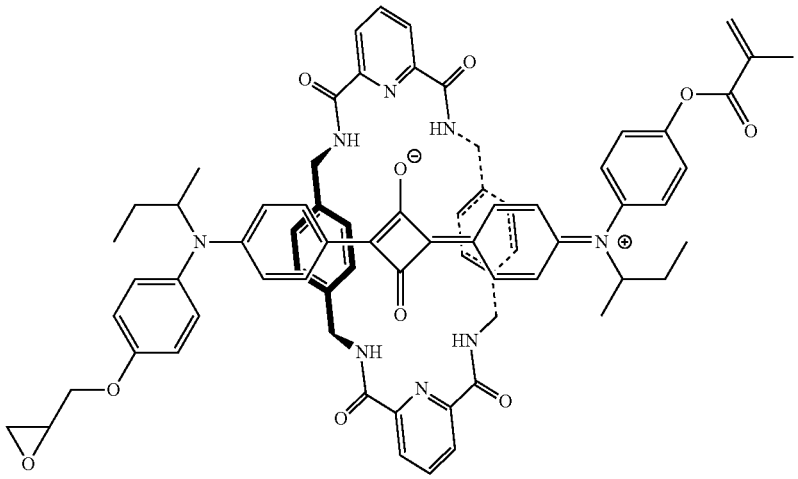
[Chemical Formula 7-1-4]
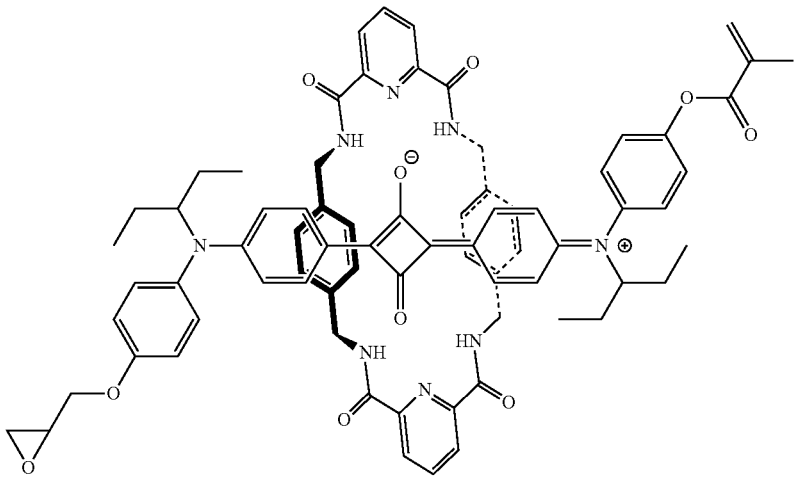
[Chemical Formula 7-1-5]
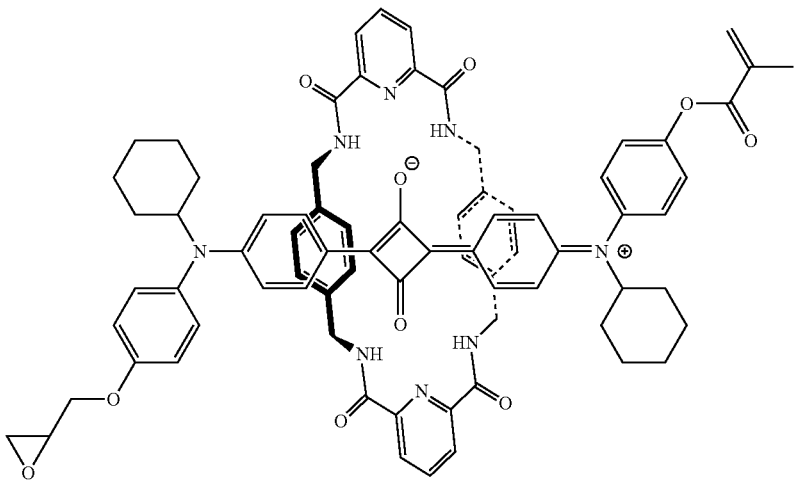

[Chemical Formula 7-2-1]
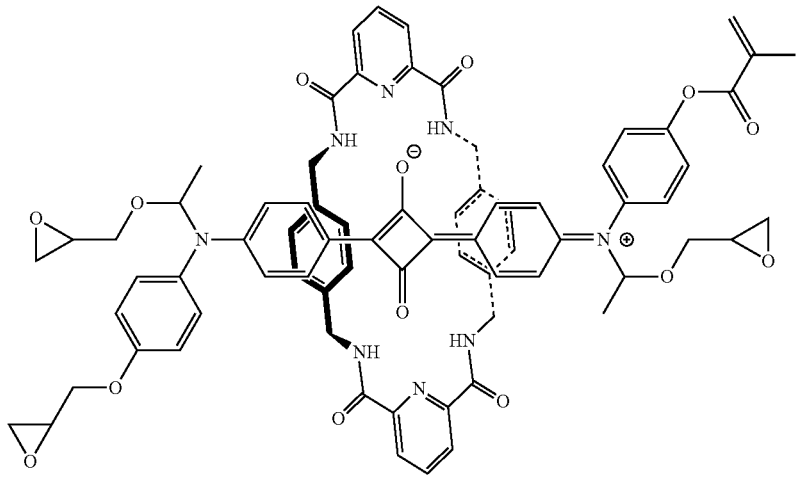
[Chemical Formula 7-2-2]
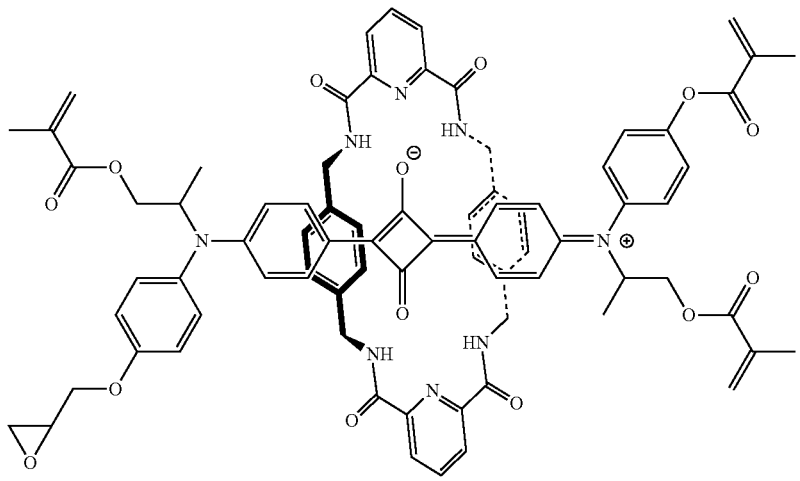
[Chemical Formula 7-3-1]
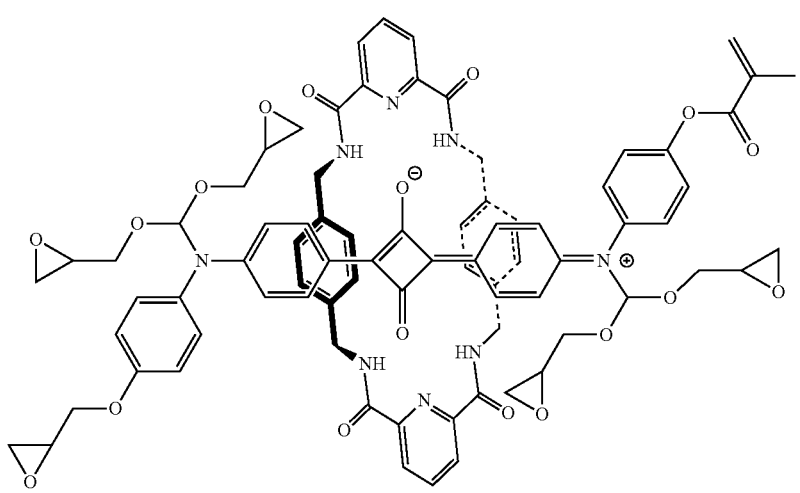

[Chemical Formula 7-3-2]
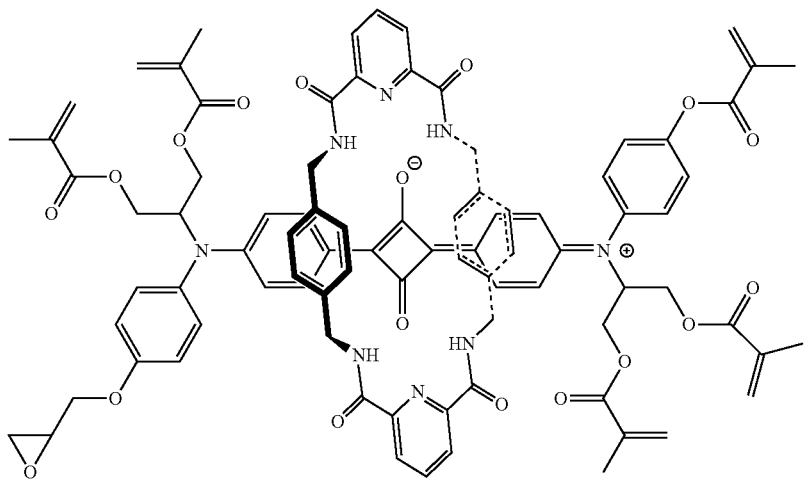
[Chemical Formula 8-1-1]
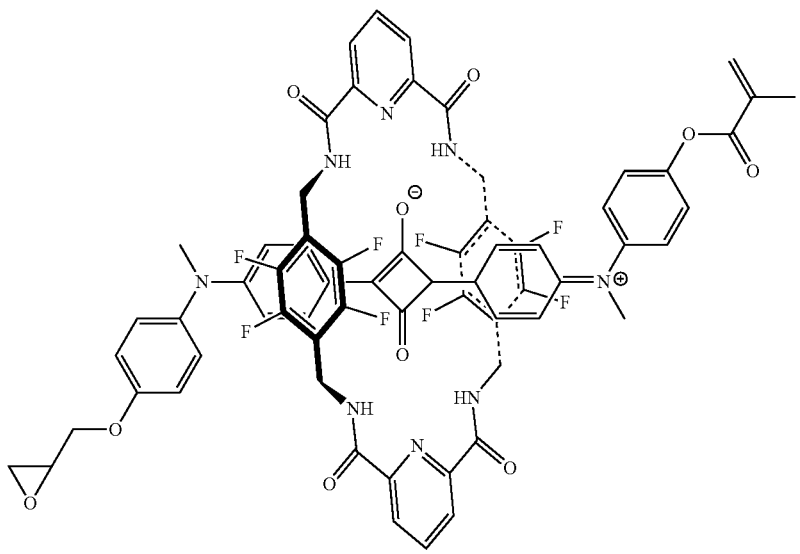
[Chemical Formula 8-1-2]
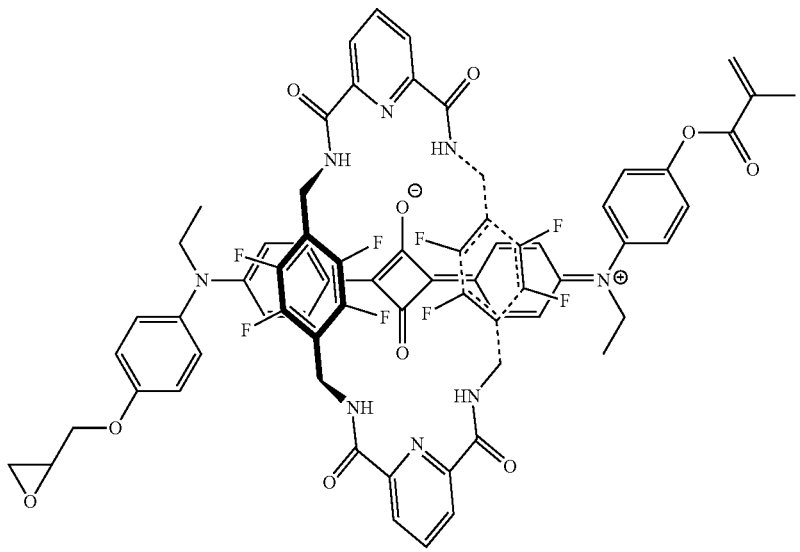

[Chemical Formula 8-1-3]
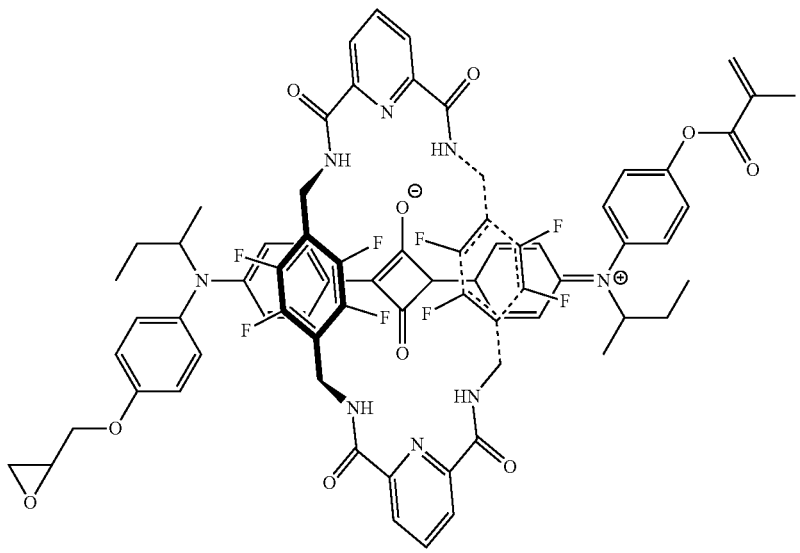
[Chemical Formula 8-1-4]
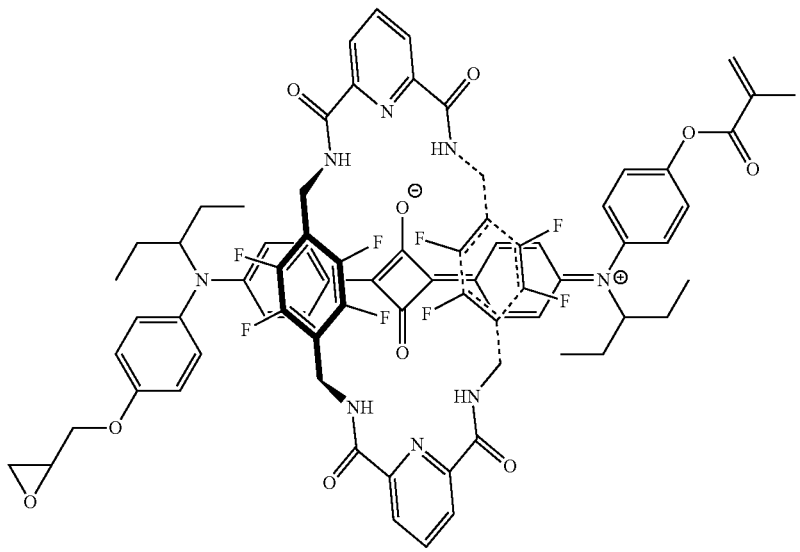
[Chemical Formula 8-1-5]
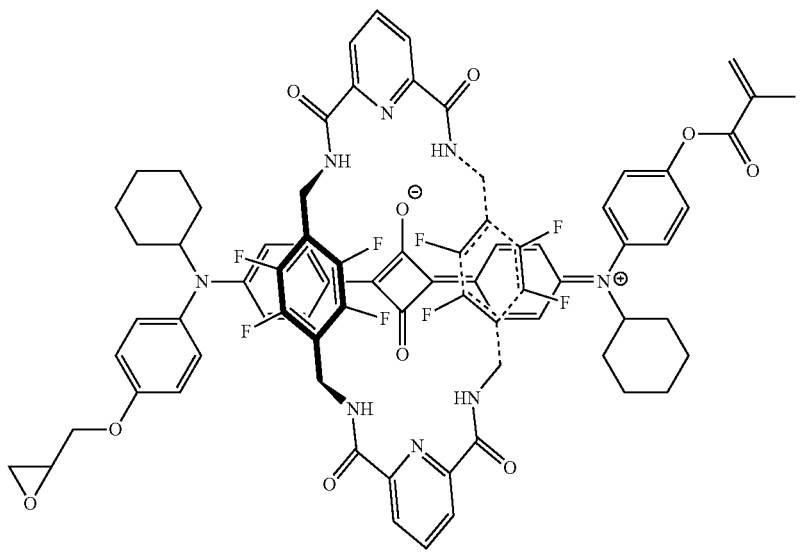

[Chemical Formula 8-2-1]
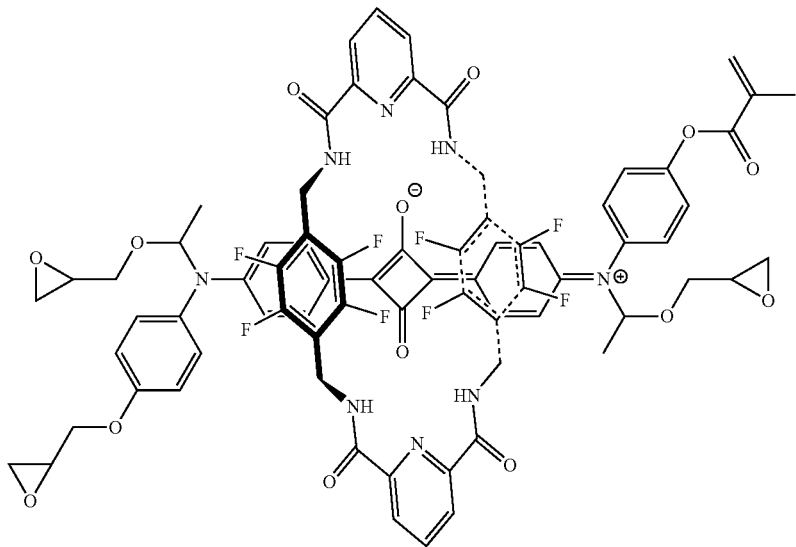
[Chemical Formula 8-2-2]
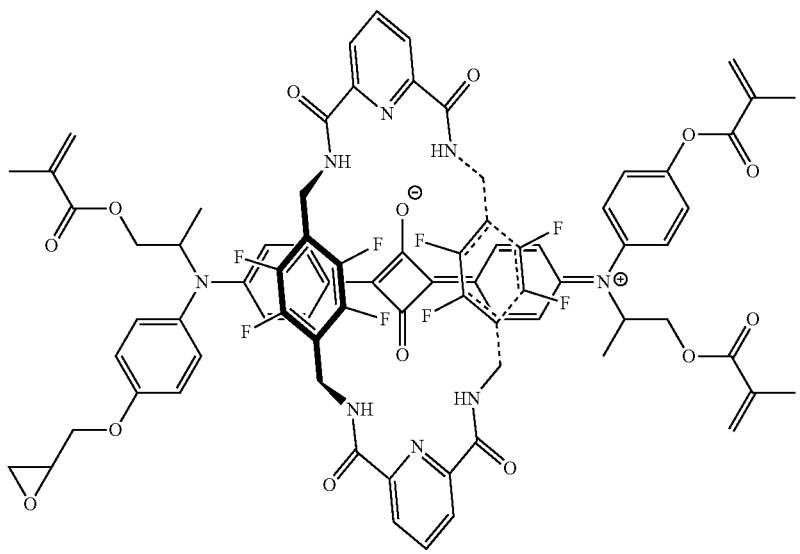

[Chemical Formula 8-3-1]
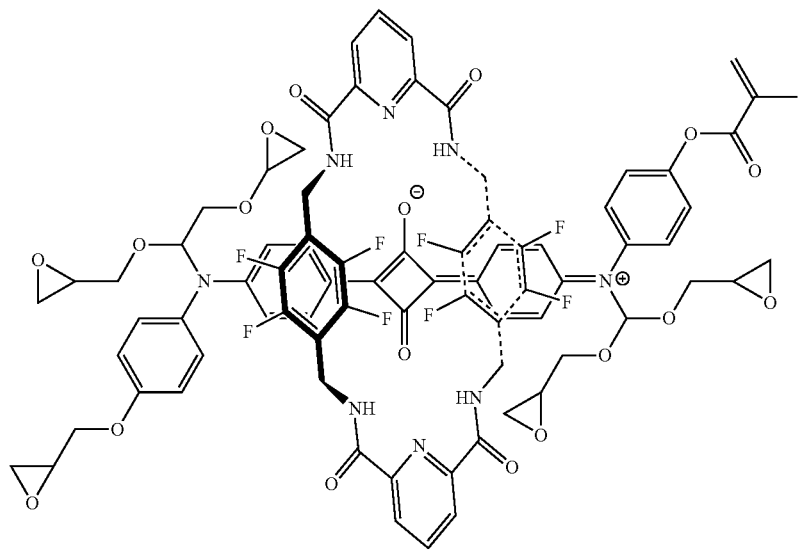
[Chemical Formula 8-3-2]
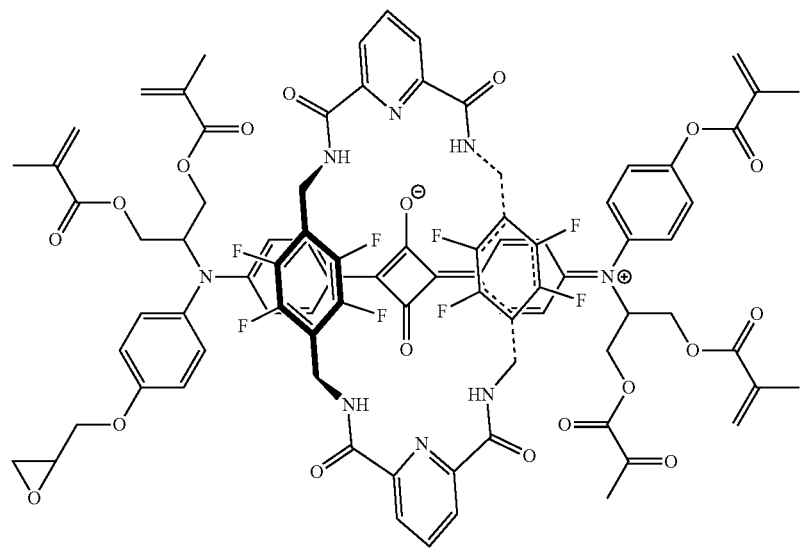

[Chemical Formula 9-1-1]
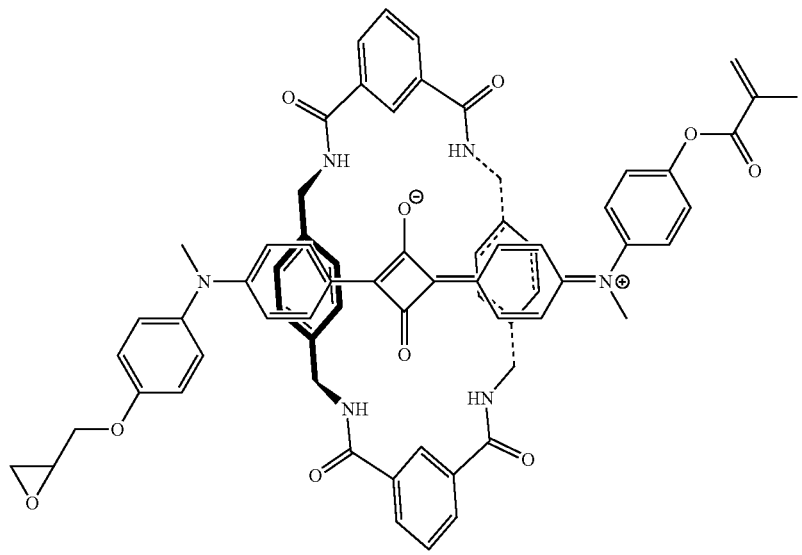
[Chemical Formula 9-1-2]
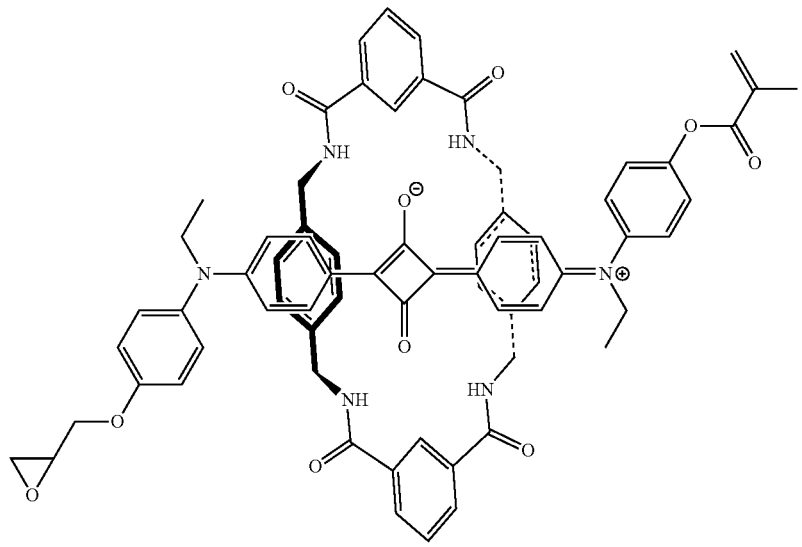
[Chemical Formula 9-1-3]
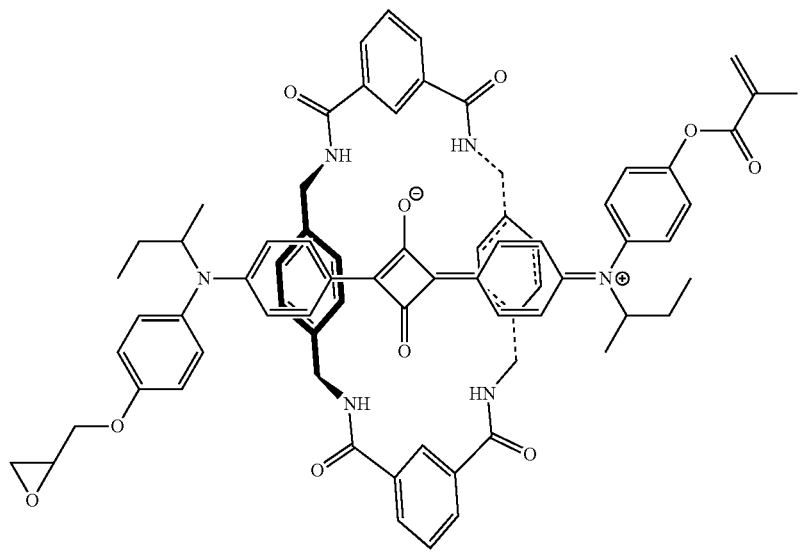

[Chemical Formula 9-1-4]
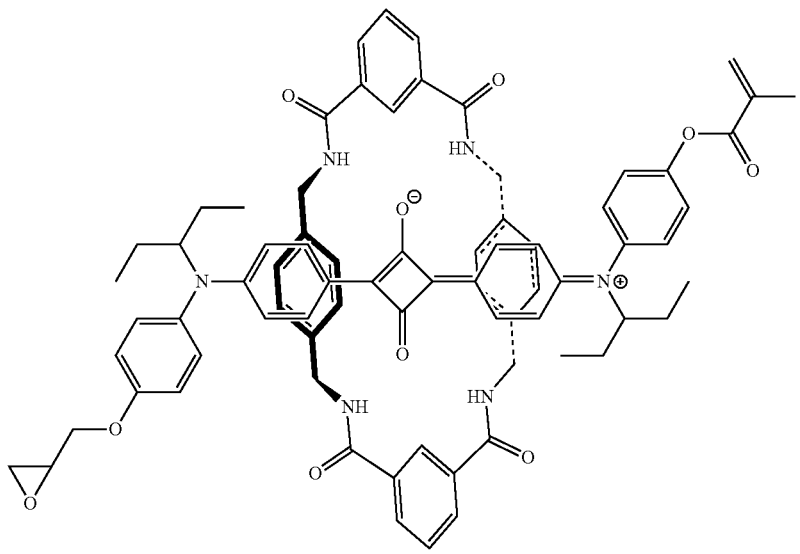
[Chemical Formula 9-1-5]
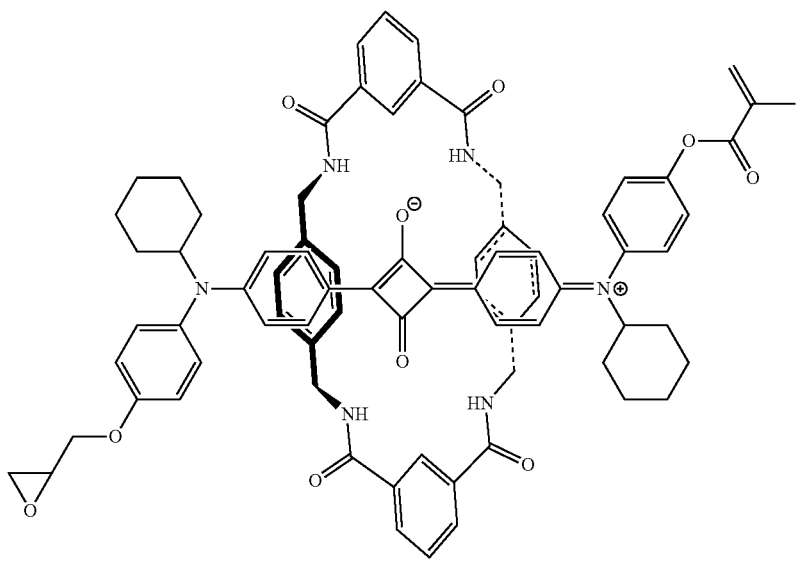
[Chemical Formula 9-2-1]
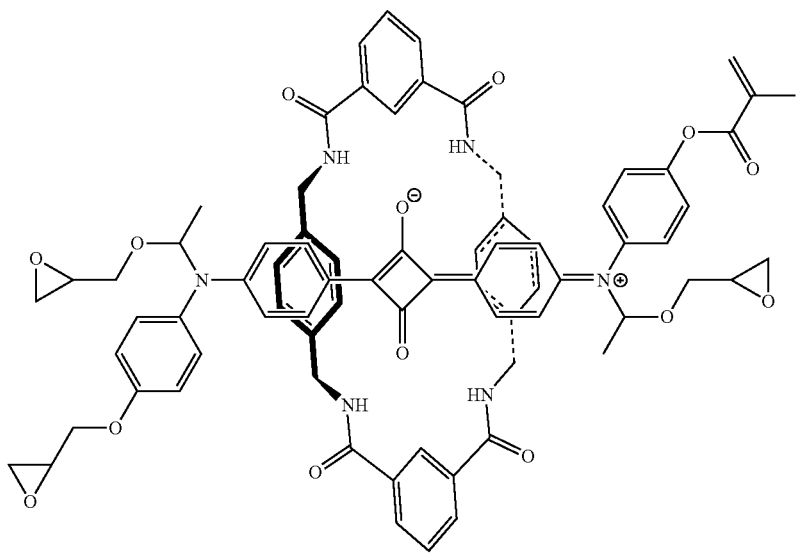

[Chemical Formula 9-2-2]
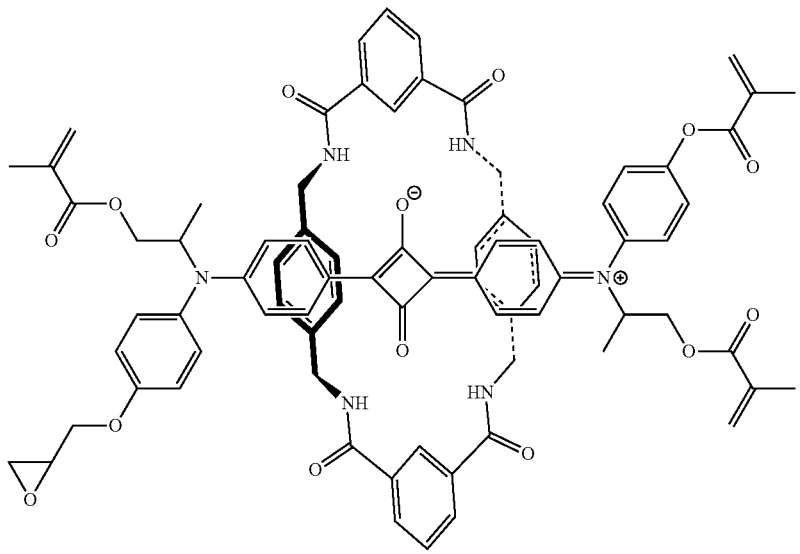
[Chemical Formula 9-3-1]
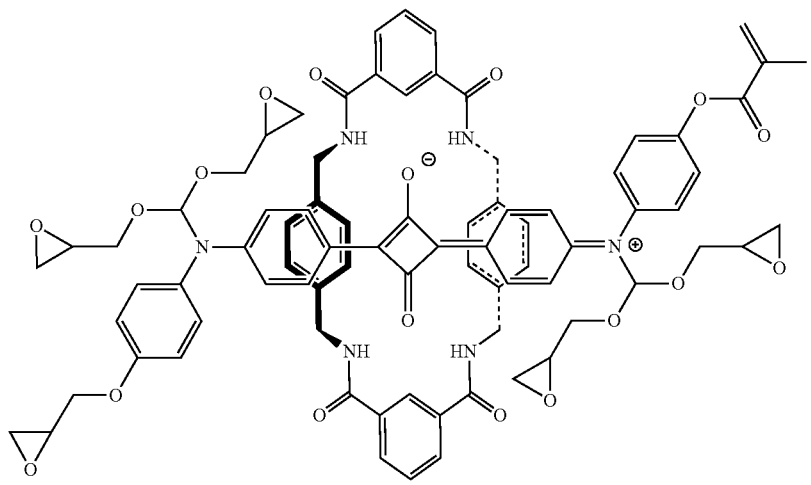
[Chemical Formula 9-3-2]
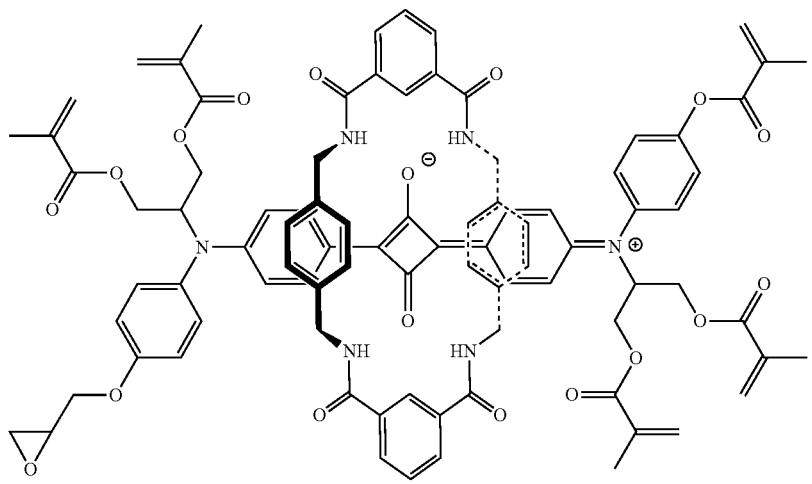

[Chemical Formula 10-1-1]
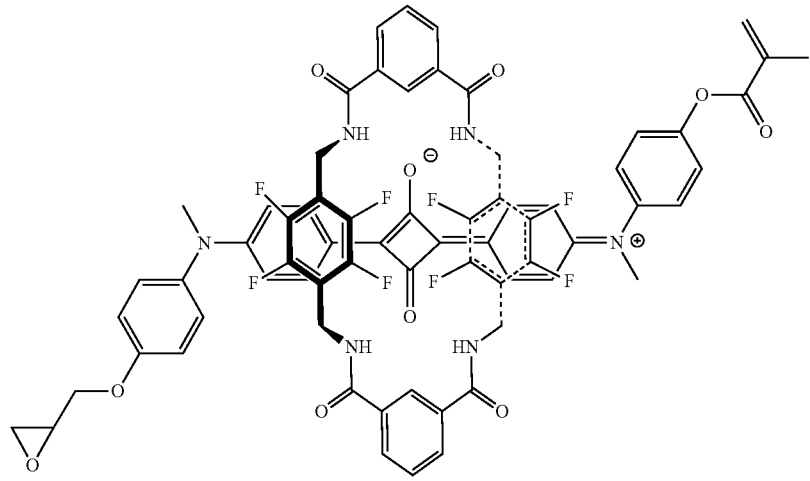
[Chemical Formula 10-1-2]
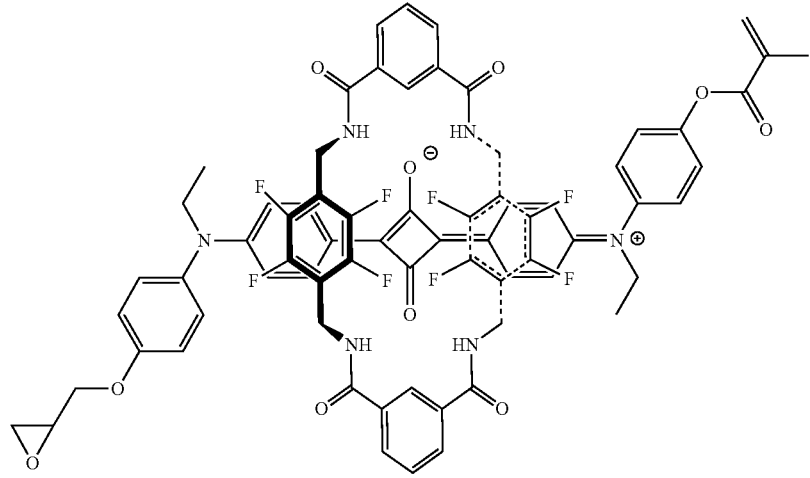
[Chemical Formula 10-1-3]
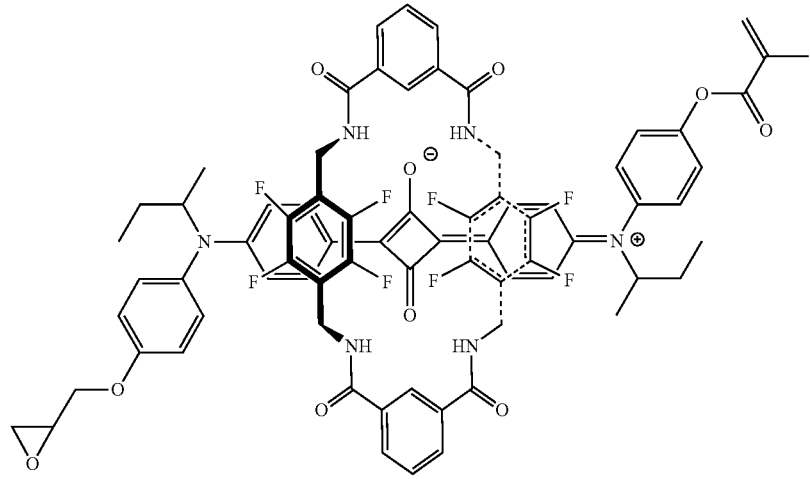

[Chemical Formula 10-1-4]
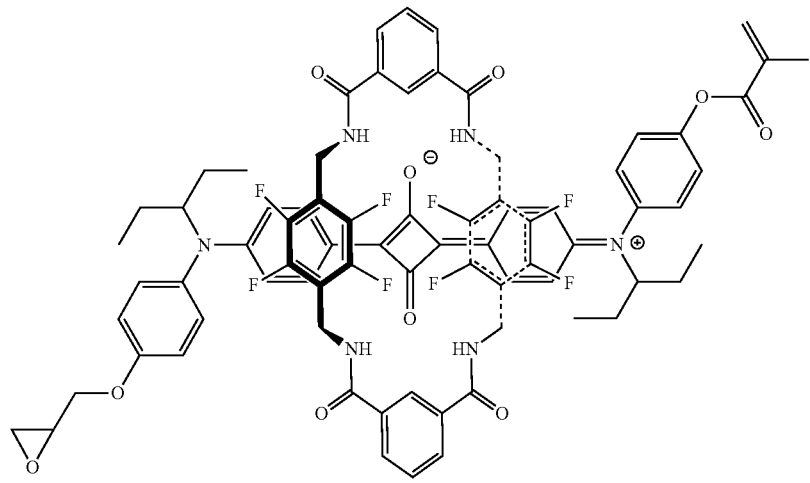
[Chemical Formula 10-1-5]
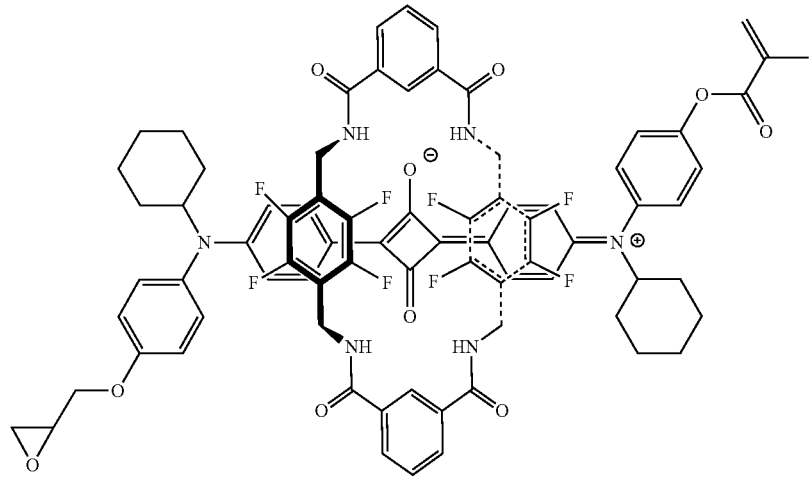
[Chemical Formula 10-2-1]
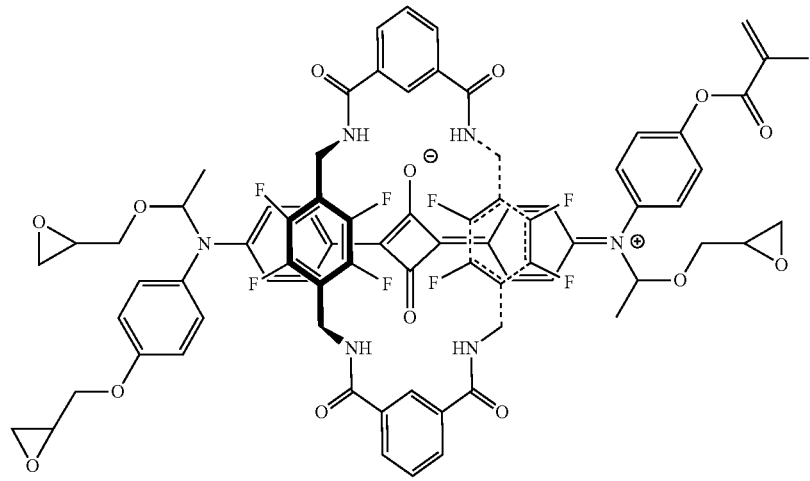

[Chemical Formula 10-2-2]

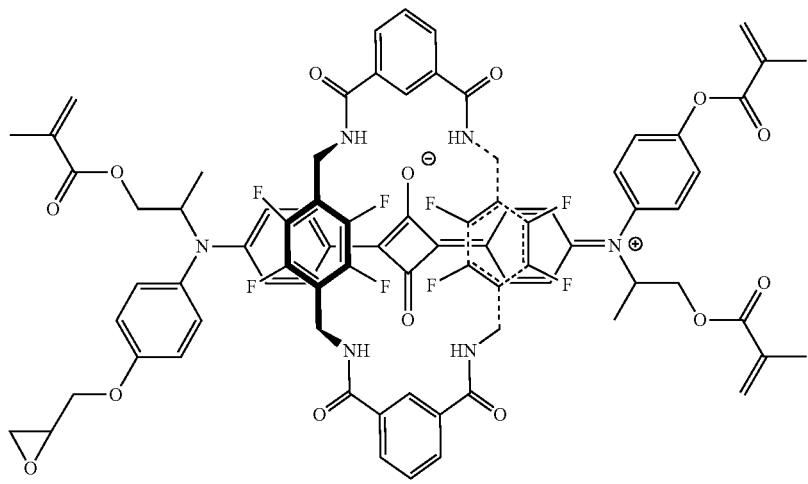

[Chemical Formula 10-3-1]

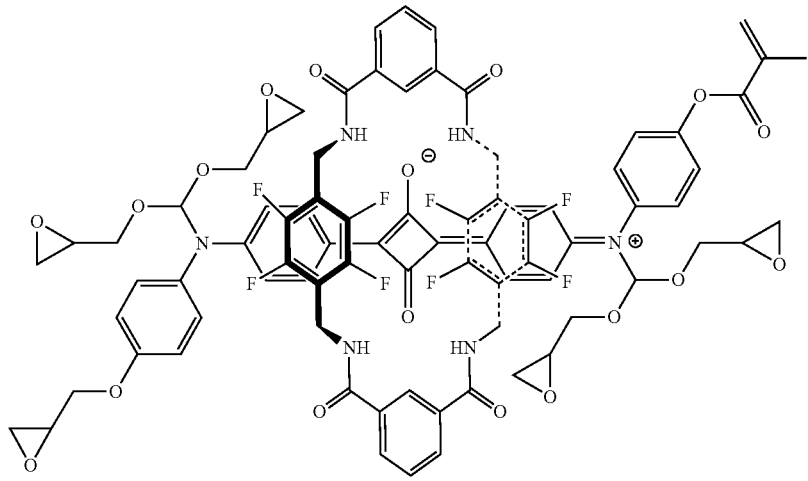

[Chemical Formula 10-3-2]

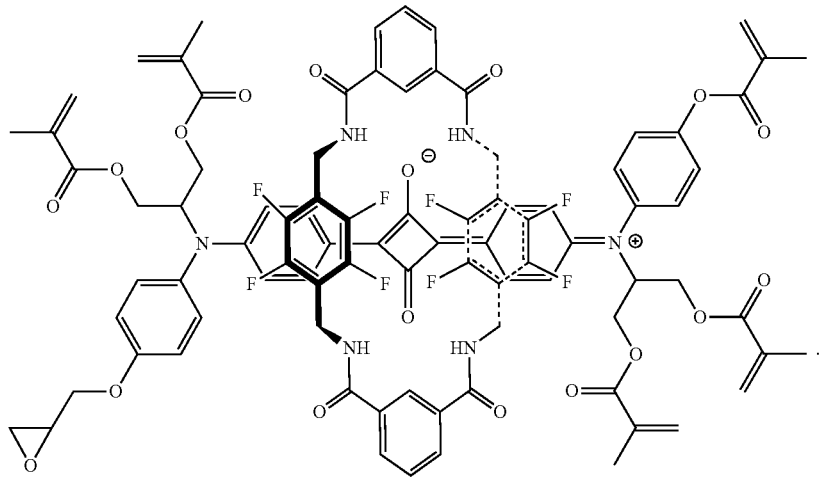

16. The core-shell dye as claimed in claim 1, wherein the core has a maximum absorption peak at a wavelength of about 530 nm to about 680 nm.

17. The core-shell dye as claimed in claim 10, wherein the core-shell dye has a maximum absorption peak at a wavelength of about 530 nm to about 700 nm.

18. The core-shell dye as claimed in claim 1, wherein the core-shell dye is a green dye.

19. A photosensitive resin composition comprising the core-shell dye as claimed in claim 1.

20. The photosensitive resin composition as claimed in claim 19, further comprising:

a binder resin;
a photopolymerizable monomer;
a photopolymerization initiator; and
a solvent.

21. A photosensitive resin film sing comprising the photosensitive resin composition as claimed in claim 19.

22. A color filter comprising the photosensitive resin film as claimed in claim 21.

23. A CMOS image sensor comprising the color filter as claimed in claim 22.

* * * * *